(12) United States Patent
Ata et al.

(10) Patent No.: US 6,793,967 B1
(45) Date of Patent: Sep. 21, 2004

(54) CARBONACEOUS COMPLEX STRUCTURE AND MANUFACTURING METHOD THEREFOR

(75) Inventors: Masafumi Ata, Kanagawa (JP); Matthias Ramm, Kanagawa (JP)

(73) Assignees: Sony Corporation, Tokyo (JP); Research Institute of Innovative Technology for the Earth, Kyoto (JP)

(*) Notice: Subject to any disclaimer, the term of this patent is extended or adjusted under 35 U.S.C. 154(b) by 62 days.

(21) Appl. No.: 09/598,304

(22) Filed: Jun. 21, 2000

(30) Foreign Application Priority Data

Jun. 25, 1999 (JP) .......................................... P11-179290
Jan. 14, 2000 (JP) ...................................... P2000-005116

(51) Int. Cl.[7] ................................................ C08F 2/46
(52) U.S. Cl. .................... 427/249.1; 427/488; 427/496; 427/508; 427/255.7
(58) Field of Search .......................... 427/249.1, 255.7, 427/488, 496, 508, 249.14, 490

(56) References Cited

U.S. PATENT DOCUMENTS

| | | | | |
|---|---|---|---|---|
| 4,495,044 A | * | 1/1985 | Banks | 427/523 |
| 5,277,996 A | * | 1/1994 | Marchetti et al. | 429/44 |
| 5,281,653 A | * | 1/1994 | Thomann et al. | 524/490 |
| 5,308,661 A | * | 5/1994 | Feng et al. | 427/535 |
| 5,338,571 A | * | 8/1994 | Mirkin et al. | 427/299 |
| 5,374,463 A | * | 12/1994 | Bethune et al. | 428/64 |
| 5,454,880 A | | 10/1995 | Sariciftci et al. | |
| 5,455,072 A | * | 10/1995 | Bension et al. | 427/255.7 |
| 5,558,903 A | * | 9/1996 | Bhushan et al. | 427/249.1 |
| 5,635,581 A | * | 6/1997 | Chiang et al. | 528/60 |
| 6,097,138 A | * | 8/2000 | Nakamoto | 313/309 |
| 6,251,522 B1 | * | 6/2001 | Tanaka et al. | 427/249.1 |
| 6,416,820 B1 | * | 7/2002 | Yamada et al. | 427/530 |
| 6,471,929 B1 | * | 10/2002 | Kusunoki et al. | 423/245.3 |
| 6,555,945 B1 | * | 4/2003 | Baughman et al. | 310/300 |
| 6,621,970 B2 | * | 9/2003 | Khudyakov et al. | 385/128 |

FOREIGN PATENT DOCUMENTS

WO    WO98/42619    10/1998

OTHER PUBLICATIONS

Iijima, Sumio, "Carbon Nanotubes". MRS Bulletin, vol. XIX, No. 11, Nov. 1994, pp. 43–49.*

* cited by examiner

*Primary Examiner*—Bret Chen
(74) *Attorney, Agent, or Firm*—Sonnenschein, Nath & Rosenthal LLP

(57) ABSTRACT

A method for preparing a carbonaceous complex struture including forming an adherent carbonaceous thin film on a smooth surface of a substrate and forming an adherent fullerine thin film on the thus formed carbonaceous thin film.

9 Claims, 60 Drawing Sheets

SOLAR BATTERY

SENSOR STRUCTURE

MOLECULAR STRUCTURE OF $C_{60}$

MOLECULAR STRUCTURE OF $C_{70}$

D$_{2h}$- SYMMETRICAL C$_{116}$ 1, 2-(C$_{60}$)$_2$ BY [2+2] CYCLIC ADDITION REACTION $C_{120}(b)$ $C_{120}(c)$

C$_{120}$ (d)

$C_{118}$ $C_{116}$

C₁₄₀ (a)

C$_{140}$ (b)

C$_{140}$ (c)

C_140 (d)

C_140 (e)

C₁₄₀ (f)

C<sub>140</sub> (g)

C$_{140}$ (h)

C_{140} (i) (D2h SYMMETRICAL)

MOST STABLE INITIAL POLYMER C70
STRUCTURE BY [2+2] CYCLIC ADDITION REACTION

C₁₃₆ (a)

C_{136} (b)

C₁₃₆ (c)

C_{136} (d)

C₁₃₆ (e)

$C_{136}$ (f)

C_{136} (g)

C_{136} (h)

C_136 (I)

MORE STABLE C136 MOLECULAR
STRUCTURE GENERATED IN
STRUCTURE RELAXATION PROCESS

APPARATUS FOR YIELDING FULLERENE MOLECULES BASED ON ARC DISCHARGE METHOD

VACUUM DEPOSITION HIGH FREQUENCY PLASMA POLYMERIZATION APPARATUS

VACUUM DEPOSITION APPARATUS

HIGH FREQUENCY PLASMA POLYMERIZATION APPARATUS

ELECTROLYTIC POLYMERIZATION APPARATUS

CARBONACEOUS COMPLEX STRUCTURE AND MANUFACTURING METHOD THEREFOR

RELATED APPLICATION DATA

The present application claims priority to Japanese Application No. P11-179290 filed Jun. 25,1999 which application is incorporated herein by reference to the extent permitted by law.

BACKGROUND OF THE INVENTION

1. Field of the Invention

This invention relates to a carbonaceous complex structure employing a fullerene based thin film, and a manufacturing method therefor.

2. Description of Prior Art

Recently, a sensor device, comprising a carbonaceous thin film and a thin film of a heterogeneous material from it, both layered on a substrate, has been developed in order to exploit characteristics proper to the carbonaceous thin film, such as electric conductivity.

OBJECT AND SUMMARY OF THE INVENTION

It is an object of the present invention to provide a carbonaceous complex material comprising the above-described carbonaceous thin film in combination with a fullerene thin film for improving adhesion between neighboring layers and for realizing peculiar optical properties, such as charge separation capability.

In one aspect, the present invention provides a carbonaceous complex structure comprising a layered set of a substrate, a carbonaceous thin film and a fullerene thin film.

In another aspect, the present invention provides a method for manufacturing a carbonaceous complex structure including a step of forming a carbonaceous thin film on a substrate by pyrolysis of an organic compound and a step of forming a fullerene thin film.

In the carbonaceous complex structure of the present invention, since the carbonaceous thin film and the fullerene thin film (fullerene vapor-deposited film or fullerene polymer film as explained later in detail), layered on substrate, are both formed of carbon, and are superior in affinity to each other, adhesion between the two films demonstrate is strong. The smoother the substrate surface, the more strongly the carbonaceous thin film can be affixed to the substrate, thus providing a dense film exhibiting high mechanical strength. Therefore, the carbonaceous thin film can be bonded strongly to the fullerene thin film layered thereon.

On the other hand, in the carbonaceous complex structure of the present invention, the carbonaceous thin film exhibits superior electrical conductivity on the order of 10–2 S/cm. If a fullerene thin film is deposited thereon, this fullerene thin film has valence band edge lower by approximately 2.0 eV than that of the valence band edge of the carbonaceous thin film and is able to operate as a donor/acceptor to permit charge separation by photo absorption. So, the carbonaceous complex structure finds application as a solar cell. Moreover, since the carbonaceous complex structure has its electrical conductivity changed clearly with respect to a substrate, it finds latent usage as a sensor device having superior durability with respect to the gas or the pressure.

The carbonaceous complex structure, having this superior effect, may be produced by the above-defined method according to the present invention.

The manufacturing method according to the present invention, including a step of forming a carbonaceous thin film and a fullerene thin film on a substrate, can be carried out easily because of a smaller number of steps to produce the carbonaceous complex structure efficiently.

Specifically, with the carbonaceous complex structure of the present invention, the carbonaceous thin film and the fullerene thin film, both layered on a substrate, are both formed of carbon and hence exhibit high affinity so that the two films exhibit high adhesion to each other.

Moreover, the smoother the substrate surface, the more strongly can the carbonaceous thin film be bonded thereto to form a dense film of high mechanical strength. In addition, the carbonaceous thin film surface can be a smooth surface to profile the substrate surface, while it can be bonded strongly to the fullerene thin film deposited thereon.

With the carbonaceous complex structure of the present invention, having the above-mentioned layered structure, permits charge separation by photo absorption and is able to form a so-called donor-acceptor heterojunction. Moreover, it has its electrical conductivity definitely changed with respect to the substrate and hence finds application as a solar cell or sensor of high durability.

BRIEF DESCRIPTION OF THE DRAWINGS

FIG. 1A shows a three-layered structure, FIG. 1B shows a five-layered structure and FIG. 1C shows a four-layered structure fitted with a light-transmitting electrode.

DETAILED DESCRIPTION OF THE PREFERRED EMBODIMENT

A functional element of the present invention may be a carbonaceous complex structure comprising a layered structure of a substrate, a carbonaceous thin film and the above-mentioned fullerene polymer film.

With this carbonaceous complex structure, in which the carbonaceous thin film and the fullerene polymer film, layered on a substrate, are both formed substantially of carbon, the two films exhibit good affinity and adhere to each other satisfactorily.

Moreover, the smoother the surface of a substrate, the more strongly the carbonaceous thin film is bonded to the substrate, with the thin film being of a dense structure and a high mechanical strength, with the film surface being smooth to follow the substrate surface, thus assuring optimum adhesion of the carbonaceous thin film with respect to the fullerene polymer film layered thereon.

In addition, in the carbonaceous complex structure, the carbonaceous thin film exhibits optimum electrical conductivity of e.g., approximately $10^{-2}$ S/cm. If the fullerene polymer film is layered thereon, charge separation by photoelectric induction is possible since the fullerene polymer film has an edge of a valance band edge lower by approximately 2.0 eV than that of the valence band of the carbonaceous thin film and operates as a donor/acceptor, so that the carbonaceous complex structure finds application as a solar cell. Moreover, the carbonaceous complex structure is definitely changed in its electrical conductivity with respect to the substrate so that it finds crucial application as a sensor device having superior durability with respect to the gas or the pressure.

The carbonaceous complex structure, having the above-mentioned favorable results, can be manufactured by a variety of different manufacturing methods, as will be explained subsequently in detail.

Specifically, the present manufacturing method can be carried out readily because of a smaller number of process steps to produce the carbonaceous complex structure efficiently.

Figure 1A:
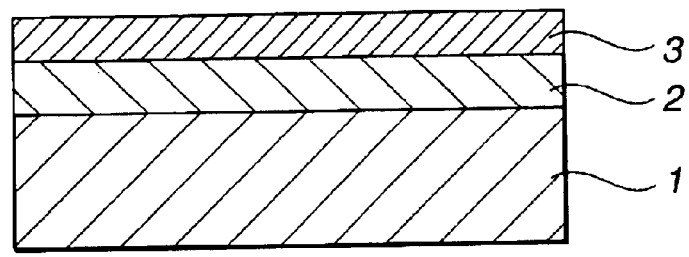
FIGS. 1A to 1C show the cross-sectional surfaces of a carbonaceous thin film according to the present invention, where

The carbonaceous complex structure of the present invention preferably comprises a substrate 1 of e.g., quartz glass, and a carbonaceous thin film 2 and a fullerene polymer film 3, made up fullerene vapor-deposited film or a fullerene polymer film, layered on the substrate 1, as shown in FIG. 1A. With such structure, carriers produced in the fullerene thin film 3 or carriers in the substrate 1, in actuality implanted from an electrode, are readily migrated into the carbonaceous thin film 2, thus improving charge mobility.

If, in particular, the carbonaceous complex structure is used as a solar cell, it is preferred to provide a counter-electrode 4 of e.g., metal, on the substrate 1 in contact with the carbonaceous thin film 2 and to provide a light transmitting electrode 5 of, e.g., ITO (indium oxides doped with tin) on the fullerene thin film 3. With such structure, charge separation by photoelectric induction is possible to open a useful application of the structure for a solar cell or a light emitting diode.

If in particular the structure is used as a gas or pressure sensor, it is preferred to provide a pair of electrodes 5a, 5b, such as comb-shaped electrodes, on the carbonaceous thin film 2, and to form fullerene thin film 3 between these electrodes 5a, 5b. Meanwhile, the electrodes 5a, 5b may also be provided on the fullerene thin film 3. If the fullerene thin film 3 is bonded to the substrate, it is elevated in electrical conductivity even at room temperature so that it can be used as a substrate temperature sensor by measurement of the electrical resistance.

As the materials for the light transmitting electrode 5 or the electrodes 5a, 5b, the above-mentioned ITO (indium oxide doped with tin) is generally desirable. However, thin films of gold, silver, platinum or nickel may also be used.

The materials of the counter-electrode 4 may be enumerated by metals, such as aluminum, magnesium, indium alloys thereof and ITO.

These electrodes can be prepared by techniques, such as vapor deposition, sputtering, electron guns or electrolytic plating. Meanwhile, if materials other than ITO are used for the light-transmitting electrodes, it is crucial to reduce the film thickness further to assure light transmittance.

Our investigations have revealed that a smoother surface of the substrate 1 contacting the carbonaceous thin film 2, specifically, the surface of the substrate 1 with roughness (average surface roughness (Ra)) of not higher than 1 $\mu$m is desirable. If the surface roughness is outside this range, the carbonaceous thin film 2 exhibits only insufficient adhesion to the substrate 1, thus possibly decreasing mechanical strength.

The substrate 1 may not only be a sole substrate of quartz glass or silicon but also a composite substrate comprising the sole substrate and an electrically conductive layer of e.g., metal formed thereon.

As means for smoothing the substrate surface, known mechanical grinding, chemical surface processing or physical surface processing, may be used.

According to the present invention, pyrolysis (thermal CVD) of a carbon-containing organic compound is applied. Alternatively, a vaporizable inorganic material can be deposited as a thin carbonaceous film, on vaporization, and can be used for the present invention.

This method thermally decomposes an organic compound in a gaseous phase, using a heating device, such as an electrical furnace, a high-frequency furnace etc. Specifically, the gaseous organic compound, entrained in a carrier gas, is introduced into a heating device housing a substrate therein, to heat the substrate to a temperature usually of 600 to 2000° C. and preferably to 700 to 1200° C. By so doing, the organic compound is thermally decomposed to form a carbonaceous thin film composed essentially of carbon on the substrate.

Examples of the organic compounds include aromatic hydrocarbons, such as toluene or aniline, derivatives thereof, alkanes, such as methane, ethane or propane, alkines, such as acetylene, aliphatic hydrocarbons, such as hexane or oxane, heterocyclic compounds, such as furane, dioxane, thiophene or pyridine, and carbon compounds, such as fullerene molecules. Two or more of these may be used in combination. Meanwhile, if safety in handling poses a problem in using these organic compounds, it is desirable to use organic compounds as low in toxicity as possible.

As the carrier gas, inert gases, such as nitrogen or argon, or a mixture thereof with hydrogen, is preferred.

The carbonaceous thin film, so formed, presents a fine smooth surface, as does a smooth substrate surface, with the film surface being a solver-white mirror surface. Stated differently, the adhesion and film-forming performance of a carbonaceous thin film according to the present invention tend to be affected appreciably by surface properties of a substrate.

Moreover, the carbonaceous thin film is a dense, hard and elastic film, with the Vickers hardness being not less than 500. The thin film can be used even as a diaphragm for a speaker.

In addition, the carbonaceous thin film has characteristics intermediate between those of a graphite exhibiting the behavior as metal and those of amorphous carbon exhibiting electrical conductivity comparable to that of a semiconductor, with the electrical conductivity showing extremely low temperature dependency. Moreover, since the film has a small band gap and the film contains graphite-like small fragments, it has high electrical conductivity, with the electrical conductivity being approximately $10^{-2}$ S/cm.

The fullerene thin film, deposited in contact with the carbonaceous thin film, means a fullerene vapor-deposited film or a fullerene polymer film. Of these, the latter is preferably used in view of film strength and durability. The fullerene vapor-deposited film has an electrical conductivity of approximately $10^{-13}$ S/cm, with the level of the valence electron band being lower approximately 2.0 eV than that of the carbonaceous thin film. The fullerene polymer film has an electrical conductivity of approximately $10^{-11}$ to $10^{-7}$ S/cm, with the valence electron band level being higher by 0.7 eV than fullerene. With the vapor-deposited film, its characteristics in evaluation in atmosphere tends to be lost in about one day, however, if in a polymer form, its characteristics are scarcely changed even in one month.

The respective films are formed from fullerene molecules as a starting material. Since this material fullerene has only recently been developed, it is more proper to date back to discovery of fullerene molecules rather than directly entering into discussions of the film-forming method or the polymerization method.

Fullerene is a series of carbon compounds composed only of carbon atoms, as is diamond or graphite. The existence of fullerene was confirmed in eighties. That is, it was found in 1985 in a mass analysis spectrum of a cluster beam by laser ablation of carbon. It was, however, five years later that the manufacturing method in reality was established. Specifically, a manufacturing method for fullerene ($C_{60}$) by arc discharge of a carbon electrode was first found in 1990. Since then, fullerene is attracting notice as a carbonaceous semiconductor material (see Kratschmer, W., Fostiropoulos, K, Huffman D. R. Chem. Phys. Lett. 1990, 170, 167. Kratschmer, W. Lamb L. D., Fostiropoulod. K, Huffman, D. R. Nature 1990, 347,354). 26.

Figure 3:
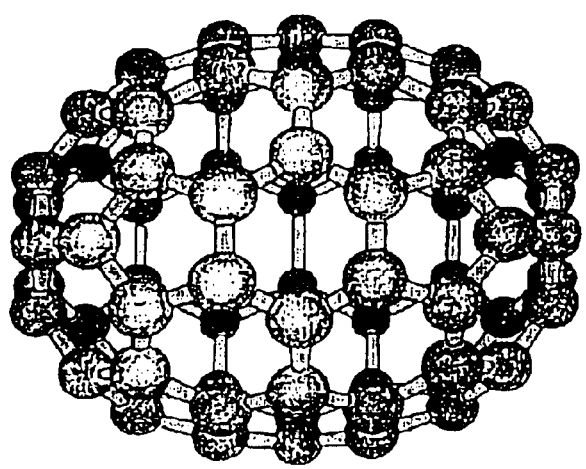
FIG. 3 schematically shows the molecular structure of $C_{70}$.

Fullerene is a spherical carbon $C_n$ (n=60, 70, 76, 78, 80, 82, 84, ...) which is a molecular aggregate resulting from spherical aggregation of an even number not less than 60 of carbon atoms. Representatives of the fullerenes are $C_{60}$ with 60 carbon atoms and $C_{70}$ with 70 carbon atoms. The $C_{60}$ fullerene has a molecular structure of what may be termed a soccer ball type in which its 60 apices are all occupied by carbon atoms. On the other hand, $C_{70}$ has what may be termed a rugby ball type molecular structure, as shown in FIG. 3. 27.

In a $C_{60}$ crystal, $C_{60}$ molecules are arranged in a face-centered cubic structure. It has a band gap of approximately 1.6 eV and may be deemed as a semiconductor. In an intrinsic state, it has an electrical resistivity of approximately $10^7$ $\Omega$/cm. It has a vapor pressure of approximately 1 m Torr at 500° C. and, on sublimation, is capable of vapor depositing a thin film. Not only $C_{60}$ but other forms of the fullerene are readily vaporized in vacuum or under reduced pressure and hence are able to yield an evaporated film easily.

Figure 4:
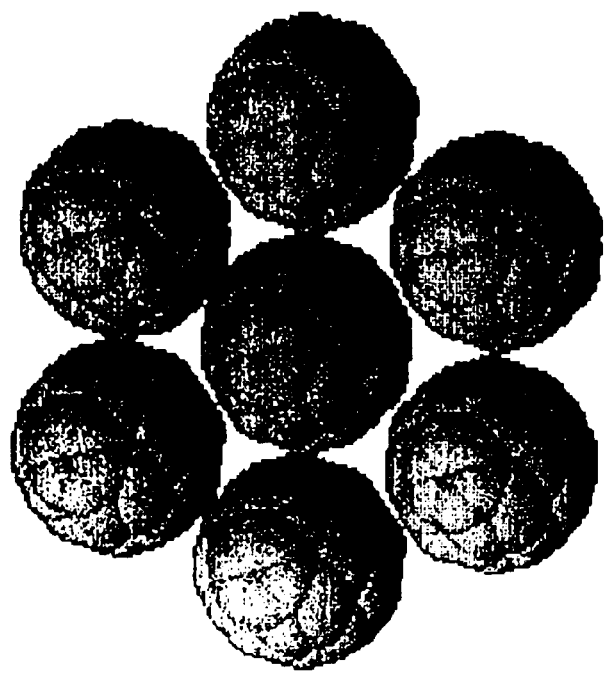
FIG. 4 shows an exemplary structure of a $C_{60}$ vapor-deposited film.

However, the molecules of fullerene forms, such as $C_{60}$ or $C_{70}$, the most mass-producible, are of zero dipole moment, such that evaporated films produced therefrom are fragile in strength, because only the Van der Waal's force acts between its molecules. Thus, if the evaporated film is exposed to air, molecules of oxygen or water tend to be diffused and intruded into the gap between the fullerene molecules (FIG. 4), as a result of which the evaporated film is not only deteriorated in structure but adverse effects may be occasionally produced in its electronic properties. This fragility of the fullerene poses a problem in reference to device stability when applying the fullerene to fabrication of a thin-film electronic device.

For overcoming the weak points the fullerene polymer film, described above, the method of producing a so-called fullerene polymer consisting in polymerizing fullerene molecules has been proposed. Typical of these methods is a method of forming a fullerene polymer film by light excitation [see (a) Rao, A. M., Zhou, P, Wang., K. A, Hager., G. T., Holden, J. M., Wang, Y., Lee, W. T., Bi, X, X., Eklund, P. C., Cornet, D. S., Duncan, M. A., Amster, J. J. Science 1993, 256995, (b) Cornet, D. C., Amster I. J., Duncan, M. A., Rao A. M., Eklund P. C., J. Phys. Chem. 1993, 97,5036, (c) Li. J., Ozawa, M., Kino, N, Yoshizawa, T., Mitsuki, T., Horiuchi, H., Tachikawa, O; Kishio, K., Kitazawa, K., Chem. Phys. Lett. 1994, 227, 572].

In these methods, in which light is illuminated on a previously formed evaporated fullerene film, numerous cracks tend to be formed in the film surface due to volumetric contraction produced on polymerization, so that produced films are problematic in strength. Moreover, it is extremely difficult to form a uniform thin film of a large surface area.

It has also been known to apply pressure or heat to fullerene molecules or to cause collision of fullerene molecules against one another. It is however difficult to produce a thin film, even though it is possible to form a film (see, for a molecule collision method, (a) Yeretzian, C., Hansen, K., Diedrich, F., Whetten, R. L., Nature 1992, 359,44, (b) Wheten, R. L, Yeretzian, C., Int. J. Multi-layered optical disc. Phys. 1992, B6,3801, (c) Hansen, K., Yeretzian, C., Whetten, R. L., Chem. Phys. Lett. 1994, 218,462, and (d) Seifert, G., Schmidt, R., Int. J. Multi-layered optical disc. Phys. 1992, B6,3845; for an ion beam method, (a) Seraphin, S., Zbou, D., Jiao, J. J. Master. Res. 1993, 8,1995, (b) Gaber, H., Busmann, H. G., Hiss, R., Hertel, I. V., Romberg, H., Fink, J., Bruder, F., Brenn, R. J. Phys. Chem., 1993, 97,8244; for a pressure method, (a) Duclos, S. J., Brister, K., Haddon, R. C., Kortan, A. R., Thiel, F. A., Nature 1991, 351,380, (b) Snoke, D. W., Raptis, Y. S., Syassen, K. 1 Phys. Rev. 1992, B45, 14419, (c) Yamazaki, H., Yoshida, M., Kakudate, Y., Usuda, S., Yokoi, H., Fujiwara, S., Aoki, K., Ruoff, R., Malhotra, R., Lorents, D. J., Phys. Chem. 1993, 97, 11161, and (d) Rao, C.N.R., Govindaraj, A., Aiyer, H. N., Seshadri, R. J. Phys. Chem. 1995, 399,16814).

Figure 6:
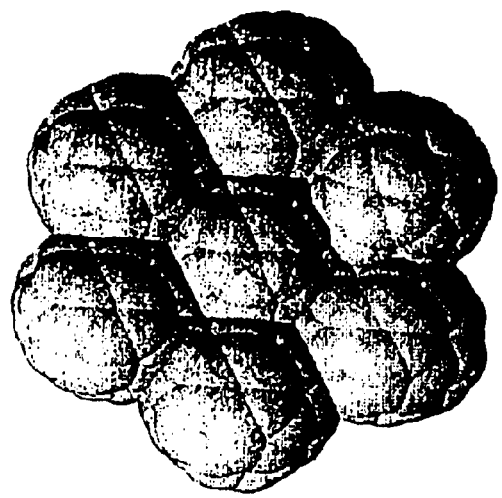
FIG. 6 shows an exemplary structure of a $C_{60}$ polymer film.
Figure 5:
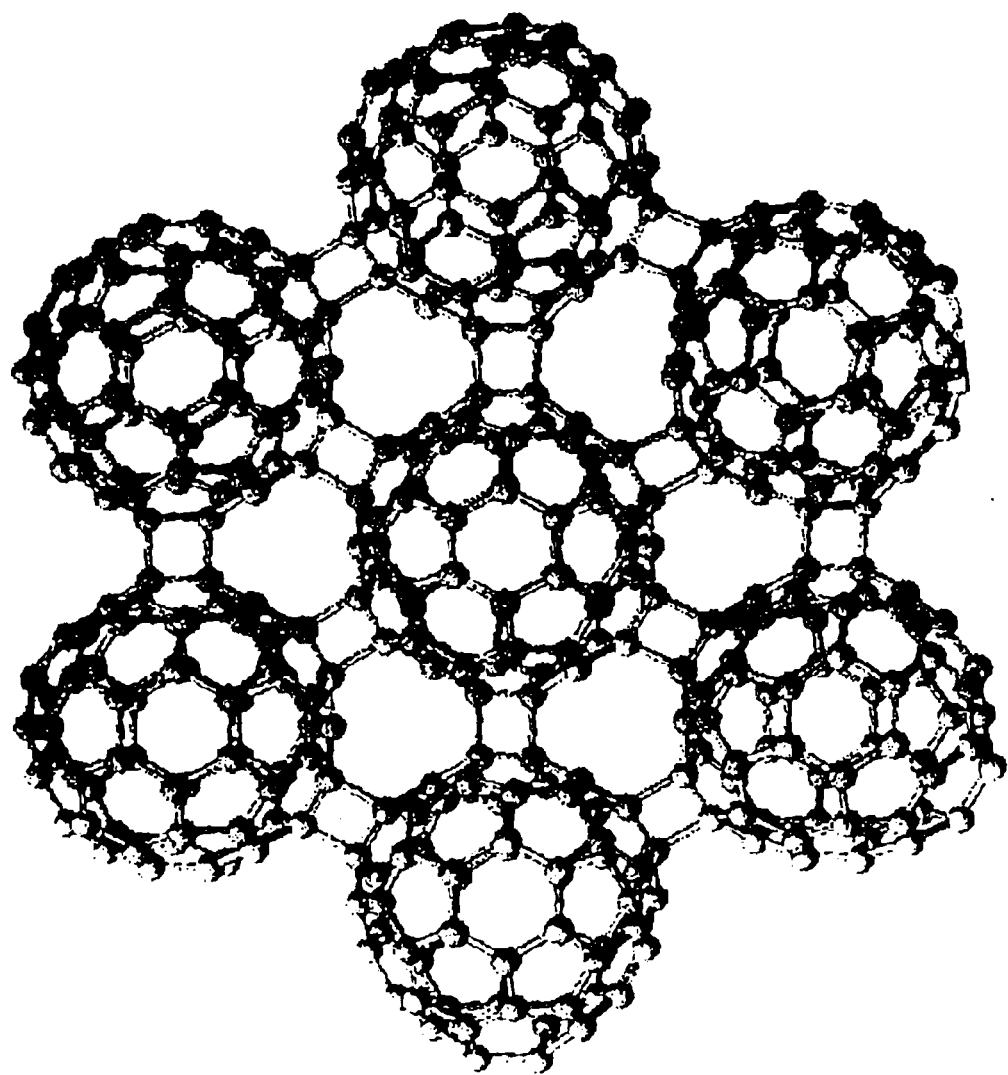
FIG. 5 shows an exemplary structure of a $C_{60}$ polymer.

Noteworthy as a fullerene polymerization method or film-forming method, which should take the place of the above-enumerated fullerene polymerization methods, is the plasma polymerization method or the micro-wave (plasma) polymerization method, previously proposed by the present inventors in e.g., Takahashi, N., Dock, H. or in Matsuzawa, N., Ata M. J., Appl. Phys. 1993, 74,5790. The fullerene polymer film, obtained by these methods (see FIGS. 5 and 6), are thin films produced by polymerization of the fullerene molecules through an electronic excited stale. It is appreciably increased in strength in comparison with the evaporated thin fullerene film, dense and high in pliability. Since the fullerene polymer film is scarcely changed in its electronic properties in vacuum or in air, it may be premeditated that its dense thin-film properties effectively suppress diffusion or intrusion of oxygen molecules into the inside of the film. In reality, generation of fullerene polymer consisting the thin film by these methods may be demonstrated by the time-of-flight mass spectrometry.

Irrespective of the type of the plasma method, electron properties of a fullerene polymer film possibly depend appreciably on its polymerization configuration. In reality, the results of mass spectrometry of the $C_{60}$ polymer film, obtained by the micro-wave plasma method, bear strong resemblance to those of the $C_{60}$ argon plasma polymer thin film, previously reported by the present inventors [see Ata, M., Takahashi, N., Nojima, K., J. Phys. Chem. 1994, 98, 9960, Ata, M., Kurihara, K., Takahashi, J. Phys., Chem., B., 1996, 101,5].

The structure of the fullerene polymer may be estimated by the pulse laser excited time-of-flight mass spectrometry (TOF-MS). In general, there is known a matrix assist method as a method for non-destructively measurement the high molecular polymer. However, lacking the solvent capable of dissolving the fullerene polymer, it is difficult to directly evaluate the actual molecular weight distribution of the polymer. Even with the mass evaluation by Laser Desorption Ionization Time-of-Fight Mass Spectroscopy (LDITOF-MS), it is difficult to make correct evaluation of the mass distribution of an actual fullerene polymer due to the absence of suitable solvents or to the reaction taking place between $C_{60}$ and the matrix molecule.

The structure of the $C_{60}$ polymer can be inferred from the profile of a dimer or the peak of the polymer of LDITOF-MS, as observed in the ablation of such a laser power as not to cause polymerization of $C_{60}$. For example, LDITOF-MS of a $C_{60}$ polymer film, obtained with a plasma power of e.g., 50 W, indicates that the polymerization of $C_{60}$ molecules is most likely to take place through a process accompanied by loss of four carbon atoms. That is, in the mass range of a dimer, $C_{120}$ is a minor product, whilst $C_{116}$ is produced with the highest probability.

Figure 7:
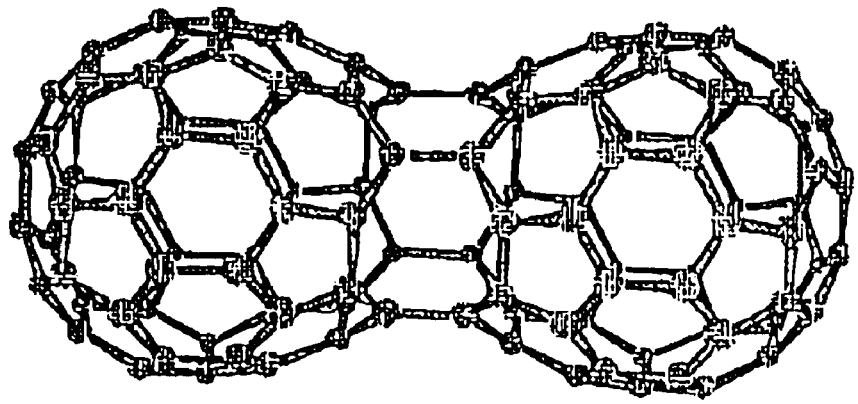
FIG. 7 shows another dimeric structure of another $C_{60}$ molecule.

According to semi-empiric $C_{60}$ dimer calculations, this $C_{116}$ may be presumed to be D2'symmetrical $C_{116}$ shown in FIG. 7. This may be obtained by $C_{58}$ recombination. It is reported that this $C_{58}$ is yielded on desorption of $C_2$ from the high electronic excited state including the ionized state of $C_{60}$ [(a) Fieber-Erdmann, M., et al., Phys. D. 1993, 26,308 (b) Petrie, S. et al., Nature 1993, 356,426 and (c) Eckhoff, W. C., Scuseria, G. E., Chem. Phys. Lett. 1993, 216,399].

Figure 8:
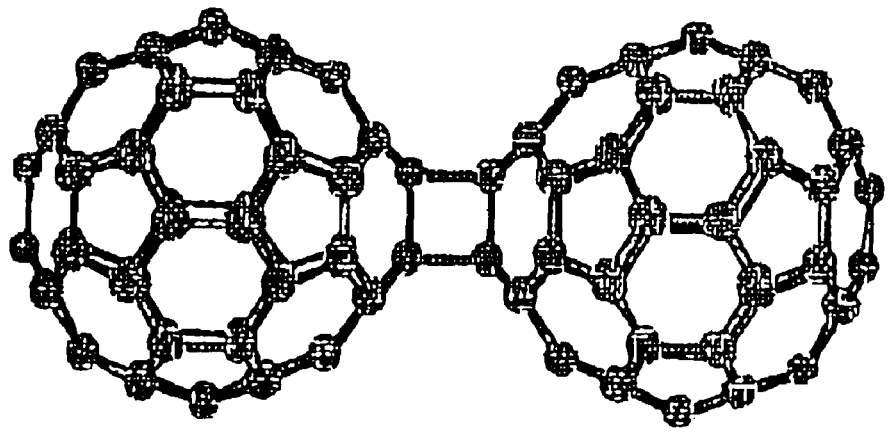
FIG. 8 shows still a dimeric structure of another $C_{60}$ molecule.

If, before transition to a structure comprised of two neighboring five-membered rings, this open-shell $C_{58}$ molecules are combined with two molecules, $C_{116}$ shown in FIG. 7 is produced. However, according to the notion of the present inventors, it is after all the [2+2] cycloaddition reaction by the excitation triplex mechanism in the initial process of the $C_{60}$ plasma polymerization. The reaction product is shown in FIG. 8. On the other hand, the yielding of $C_{116}$ with the highest probability as mentioned above is possibly ascribable to desorption of four $sp^3$ carbons constituting a cyclobutane of $(C_{60})^2$ yielded by the [2+2] cycloaddition from the excited triplet electronic state of $C_{60}$ and to recombination of two $C_{58}$ open-shell molecules, as shown in FIG. 8.

If a powerful pulsed laser light beam is illuminated on a $C_{60}$ fine crystal on an ionization target of TOF-Ms, as an example, polymerization of fullerene molecules occurs through the excited electronic state, as in the case of the micro-wave plasma polymerization method. At this time, ions of $C_{58}$, $C_{58}$ etc are also observed along with peaks of the $C_{60}$ photopolymer.

However, since no fragment ions, such as $C_{58}{}^{2+}$ or $C^{2+}$ are observed, direct fragmentation from $C_{60}{}^{3+}$ to $C_{58}{}^{2+}$ and to $C^{2+}$, such as is discussed in the literature of Fieber-Erdmann, cannot be thought to occur in this case. Also, if $C_{60}$ is vaporized in a $C_2F_4$ gas plasma to form a film, only addition products of fragment ions of F or $C_2F_4$ of $C_{60}$ are observed in the LDITOF-MS, while no $C_{60}$ polymer is observed. Thus, the LDITOF-MS, for which no $C_{60}$ polymer is observed, has a feature that no $C_{58}$ nor $C_{56}$ ions are observed. These results of observation support the fact that $C_2$ loss occurs through a $C_{60}$ polymer.

The next problem posed is whether or not the $C_2$ loss is directly caused from $1, 2—(C_{60})_2$ produced by the [2+2] cycloaddition reaction shown in FIG. 8. Murry and Osawa et al proposed and explained the process of structure relaxation of $1, 2—(C_{60})2$ as follows [(a) Murry, R. L. et al, Nature 1993, 366,665, (b) Strout, D.L et al, Chem. Phys. Lett. 1993, 214,576, Osawa, E, private letter].

Figure 9:
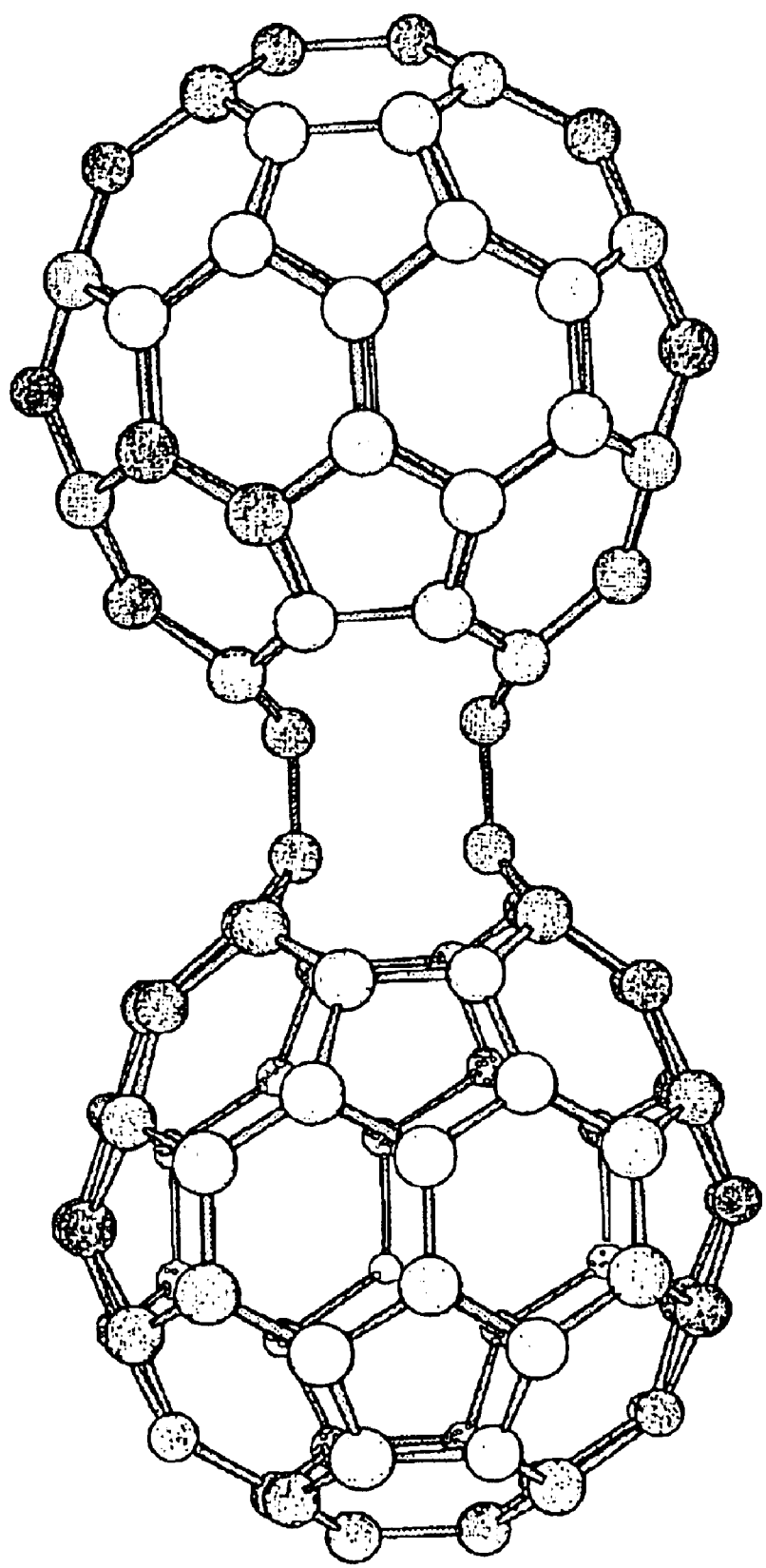
FIG. 9 shows another dimeric structure of another $C_{60}$ molecule [$C_{120}(b)$].
Figure 10:
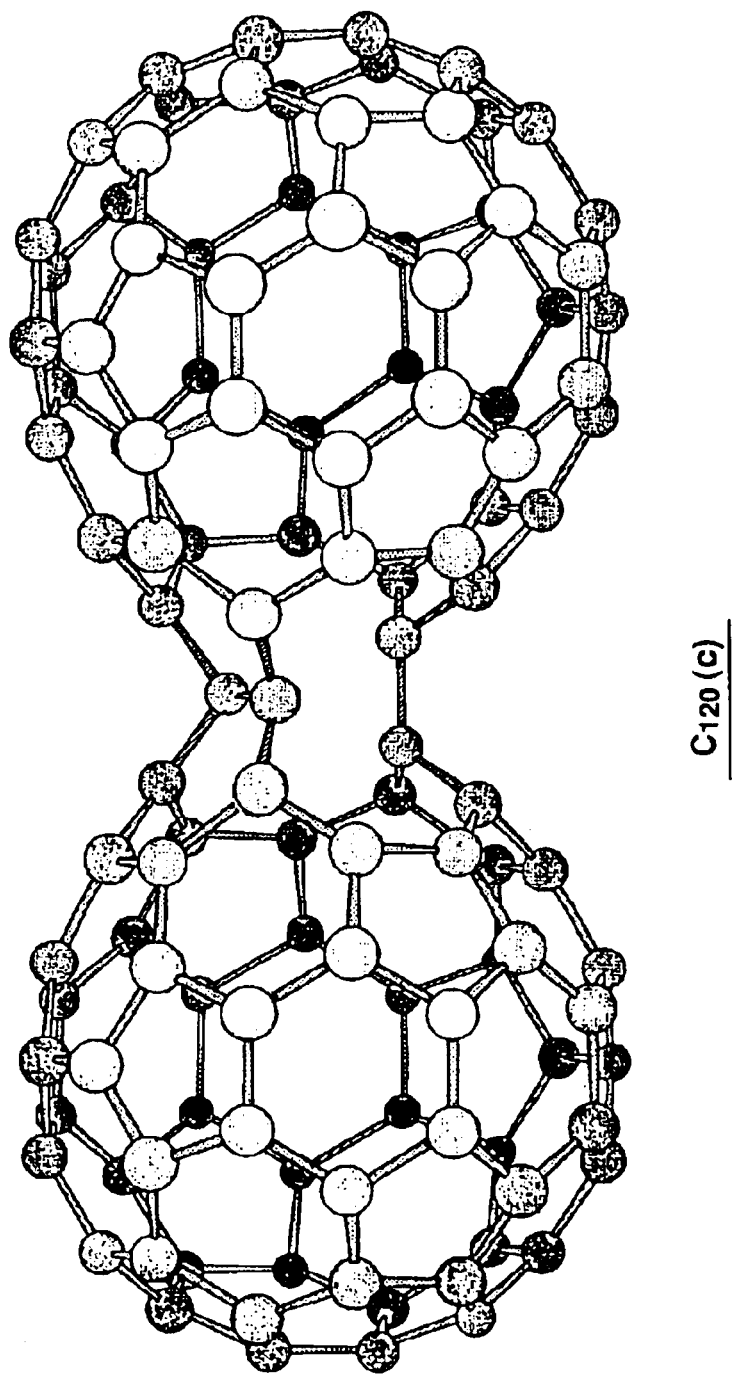
FIG. 10 shows another dimeric structure of a $C_{60}$ molecule [$C_{120}(c)$].
Figure 11:
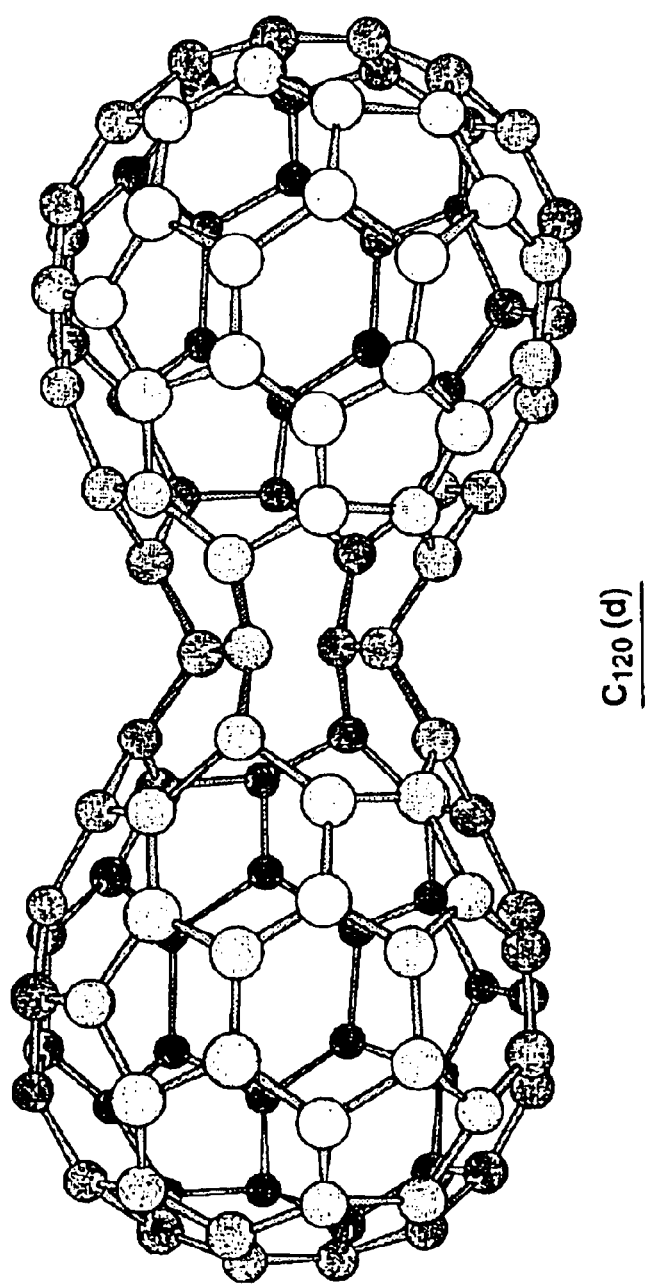
FIG. 11 shows another dimeric structure of a $C_{60}$ molecule [$C_{120}(d)$].

Both Murry and Osawa state that, in the initial process of structure relaxation of $1, 2—(C_{60})_2$, shown in FIG. 8, $C_{120}$ (d) of FIG. 11 is produced through $C_{120}$ (b) of FIG. 8, resulting from cleavage of the $1, 2—C$ bond, having the maximum pinch of the cross-linked site, from $C_{120}$ (c) of FIG. 10 having the ladder-like cross-linking by Stone-Wales transition (Stone, A. J., Wales, D. J., Chem. Phys. Lett. 1986, 128, 501, (b) Saito, R. Chem. Phys. Lett. 1992, 195,537). On transition from $1, 2—(C_{60})2$ of FIG. 8 to $C_{120}$ (b) of FIG. 9, energy instability occurs. However, on further transition from $C_{120}$ (c) of FIG. 10 to $C_{120}$ (d) of FIG. 11, the stabilized state is restored.

Figure 12:
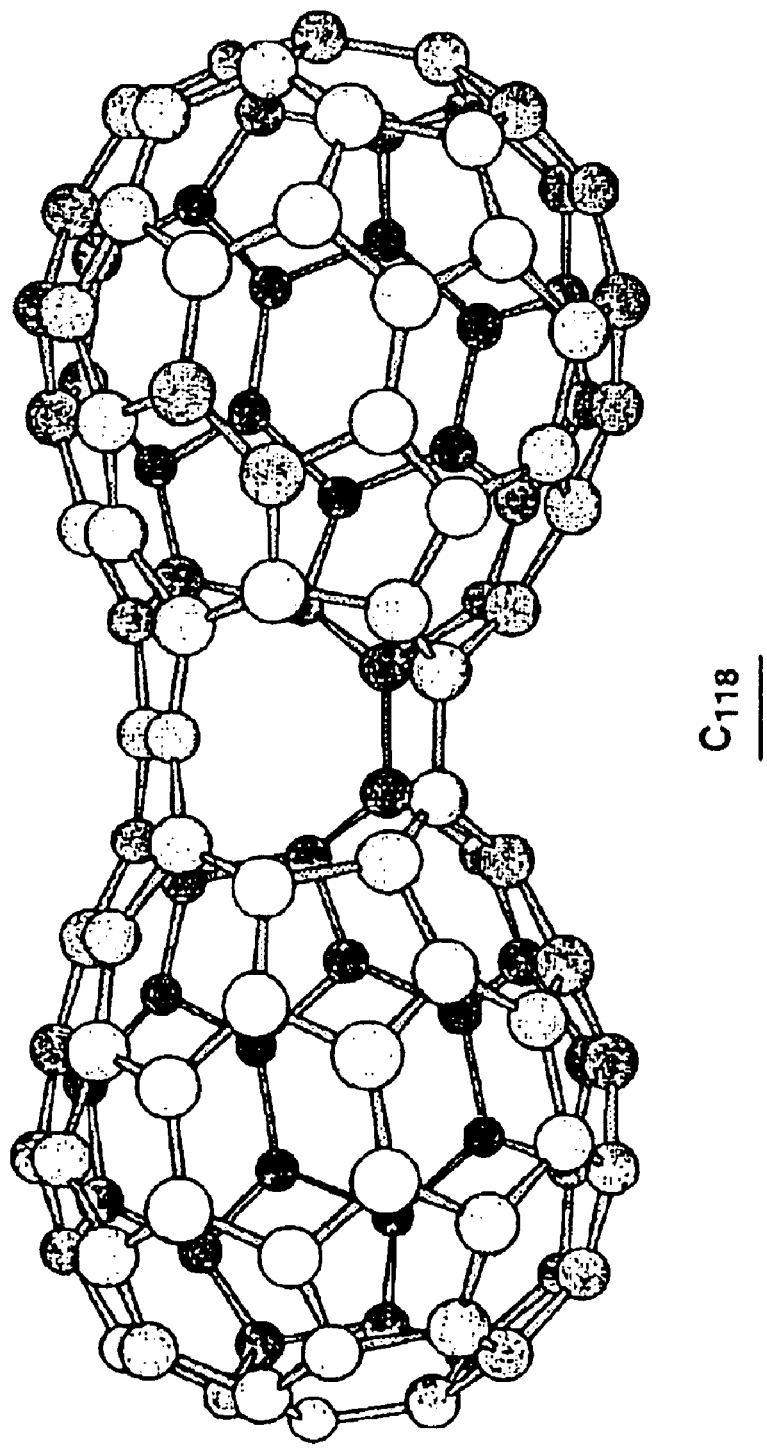
FIG. 12 shows a structure of a $C_{118}$ molecule felt to be generated in the fullerene polymer generating process.
Figure 13:
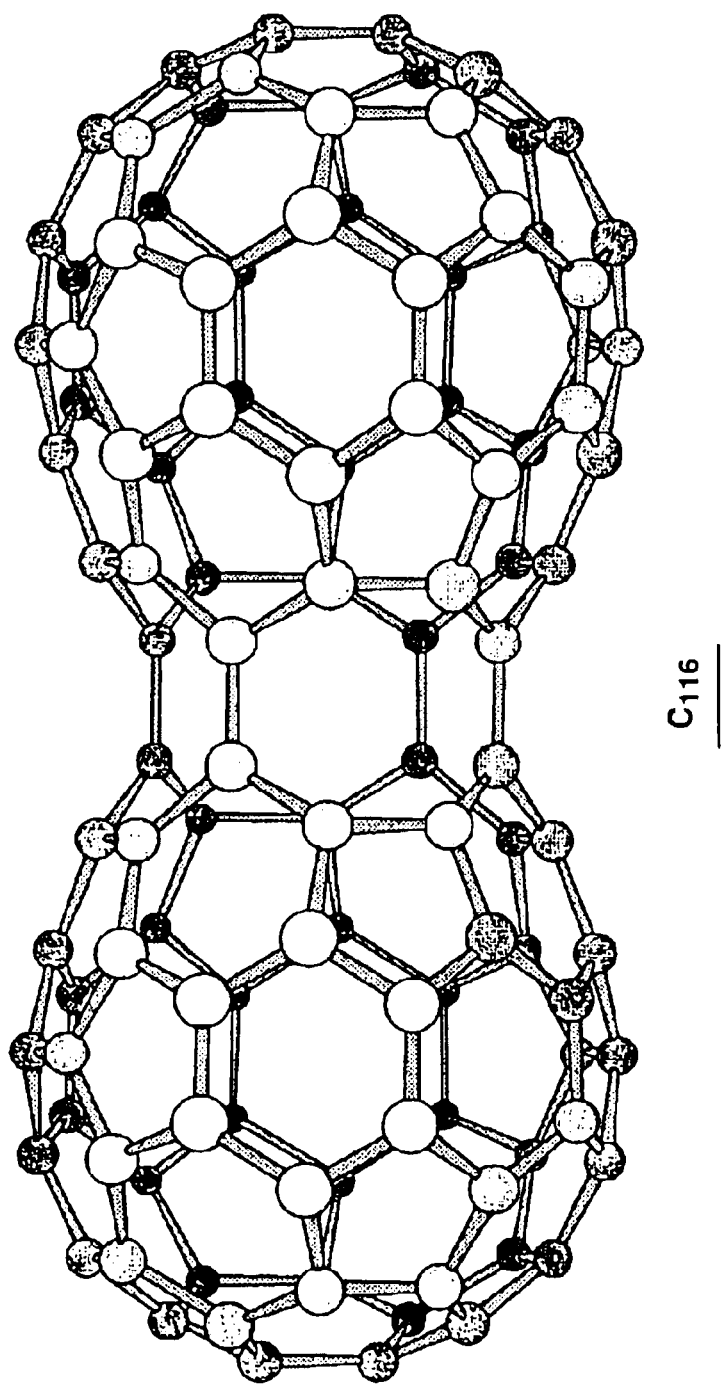
FIG. 13 shows a structure of a $C_{116}$ molecule felt to be generated in the fullerene polymer generating process.

Although it is not clear whether the $nC_2$ loss observed in the polymerization of $C_{60}$ by plasma excitation directly occurs from $1, 2—(C_{60})$ of FIG. 8 thought to be its initial process or after certain structure relaxation thereof, it may be premeditated that the observed $C_{118}$ assumes the structure shown in FIG. 12 by desorption of $C_2$ from $C_{120}$ (d) of FIG. 11 and recombination of dangling bonds. Also, $C_{116}$ shown in FIG. 13 is obtained by desorption of two carbon atoms of the ladder-like cross-linking of $C_{118}$ of FIG. 12 and recombination of bonds. Judging from the fact that there are scarcely observed odd-numbered clusters in the dimeric TOF-MS, and from the structural stability, it may be presumed that the loss in $C_2$ is not produced directly from $1, 2—(C_{60})2$, but rather that it is produced through $C_{120}$ (d) of FIG. 11.

Also, Osawa et al states in the above-mentioned literature that D5d symmetrical $C_{120}$ structure is obtained from $C_{120}$ (a) through structure relaxation by multi-stage Stone-Wales transition. However, insofar as the TOF-MS of the $C_{60}$ polymer is concerned, it is not the structure relaxation by the multi-stage transition reaction but rather the process of structure relaxation accompanied by $C_2$ loss that governs the formation of the polymer by plasma irradiation.

In a planar covalent compound in general, in which a π-orbital crosses the σ-orbital, spin transition between $1(\pi-\pi^*)-3(\pi-\pi^*)$ is a taboo, while it is allowed if, by vibration-electric interaction, there is mixed the σ-orbital. In the case of $C_{60}$ since the π-orbital is mixed with the σ-orbital due to non-planarity of the π covalent system, inter-state crossing by spin-orbital interaction between $1(\pi-\pi^*)$ and $3(\pi-\pi^*)$ becomes possible, thus producing the high photochemical reactivity of $C_{60}$.

Figure 14:
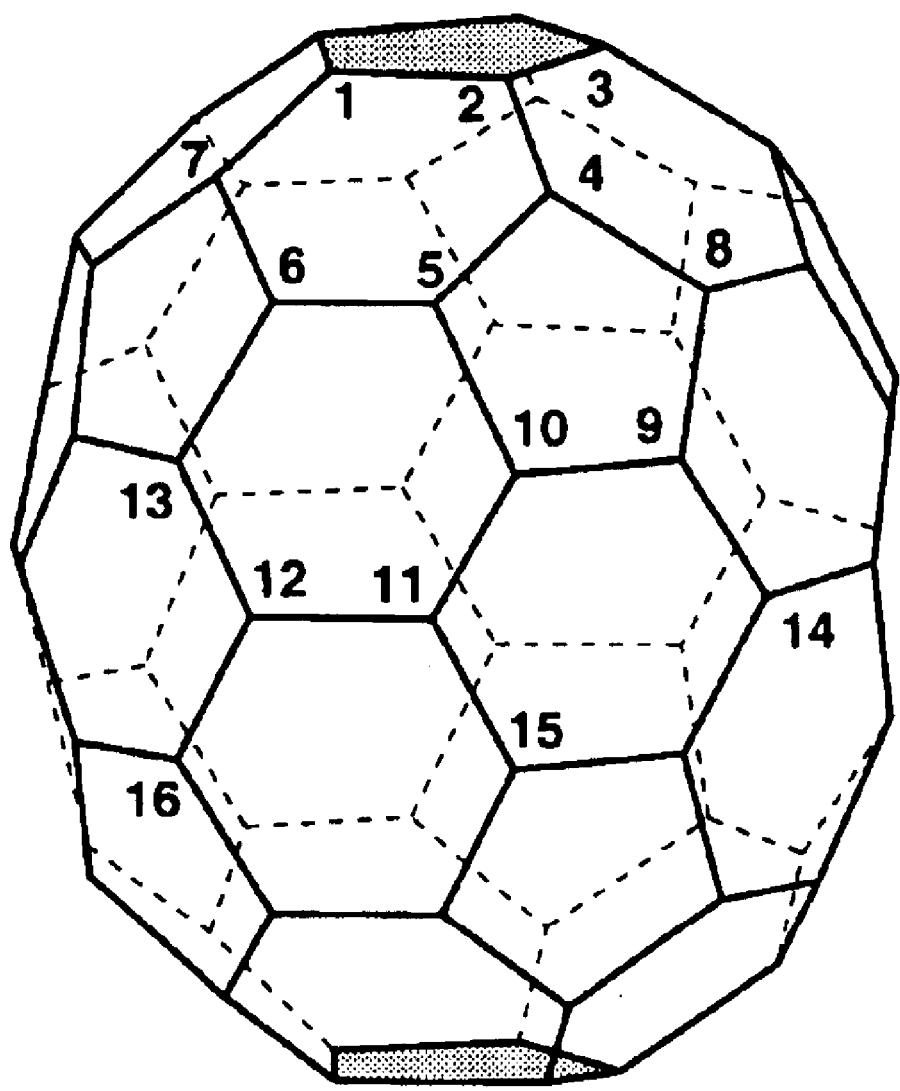
FIG. 14 shows a numbering system of a $C_{70}$ molecule.

The plasma polymerization method is applicable to polymerization of $C_{70}$ molecules. However, the polymerization between $C_{70}$ molecules is more difficult to understand than in that between $C_{60}$. Thus, the polymerization is hereinafter explained in as plain terms as possible with the aid of numbering of carbon atoms making up $C_{70}$ as shown in FIG. 14.

The 105 C—C bonds of $C_{70}$ are classified into eight sorts of bonds represented by C(1)—C(2), C(2)—C(4), C(4)—C(5), C(5)—C(6), C(5)—C(10), C(9)—C(10), C(10)—C(11) and C(11)—C(12). Of these, C(2)—C(4) and C(5)—C(6) are of the same order of double bond performance as the C=C in $C_{60}$. The π-electrons of the six members of this molecule including C(9), C(10), C(11), C(14) and C(15) are non-localized such that the C(9)—C(10) of the five-membered ring exhibit the performance of the double bond, while the C(11)—C(12) bond exhibits single bond performance. The polymerization of $C_{70}$ is scrutinized as to C(2)—C(4), C(5)—C(6), C(9)—C(10) and C(10)—C(11) exhibiting the double-bond performance. Meanwhile, although the C(11)—C(12) is substantially a single bond, it is a bond across two six-membered rings (6, 6-ring fusion). Therefore, the addition reaction performance of this bond is also scrutinized.

First, the [2+2] cycloaddition reaction of $C_{70}$ is scrutinized. From the [2+2] cycloaddition reaction of these five sorts of the C—C bonds, 25 sorts of dimers of $C_{70}$ are produced. For convenience of calculations, only nine sorts of the addition reactions between the same C—C bonds are scrutinized. Table 1 shows heat of the reaction (ΔHf0(r)) in the course of the process of yielding $C_{140}$ from $C_{70}$ of two molecules of the MNDO/AN-1 and PM-3 levels.

TABLE 1

Figure 15:
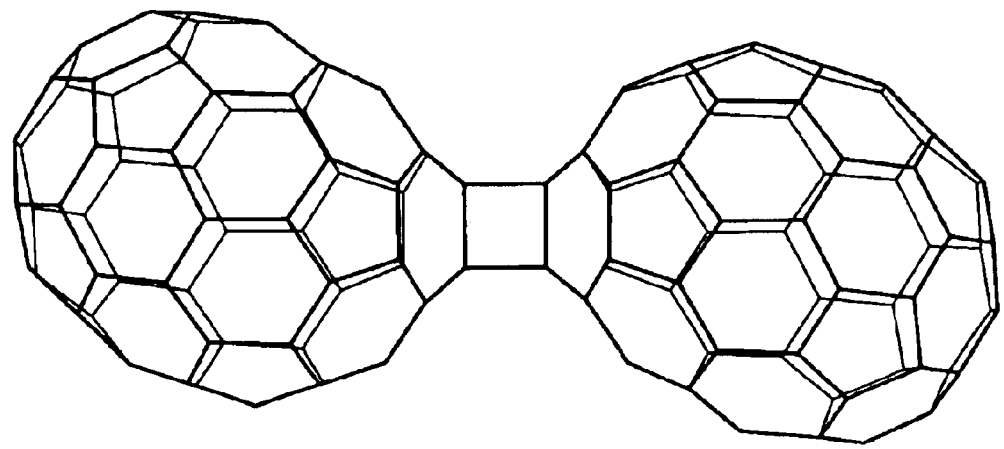
FIG. 15 shows a dimeric structure of a $C_{70}$ molecule felt to be produced in the fullerene polymerization process [$C_{140}(a)$].
Figure 15:
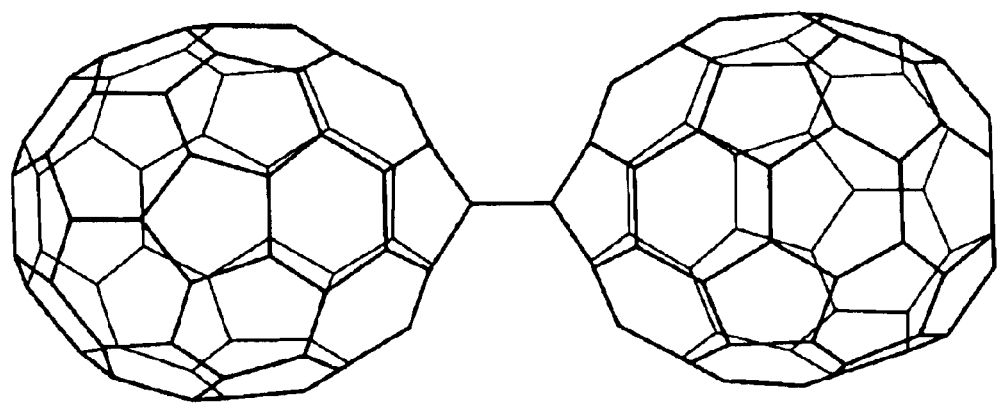
Figure 16:
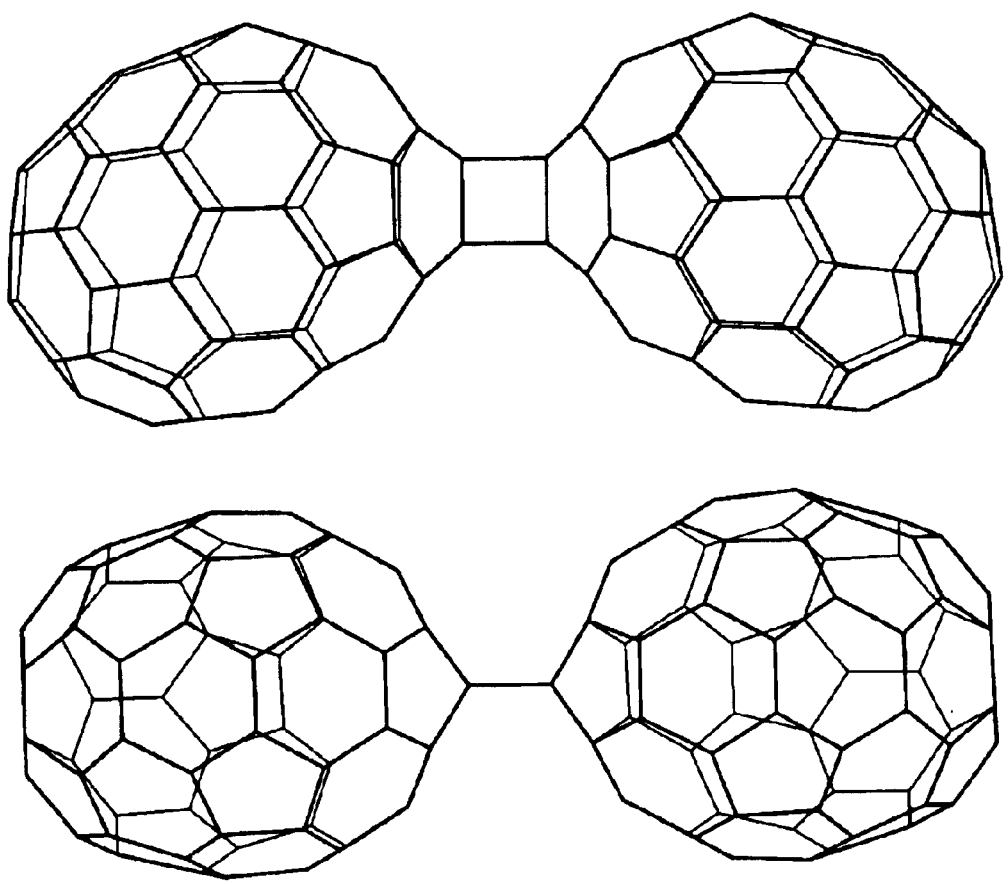
FIG. 16 shows another dimeric structure of a $C_{70}$ molecule felt to be produced in the fullerene polymerization process [$C_{140}(b)$].
Figure 17:
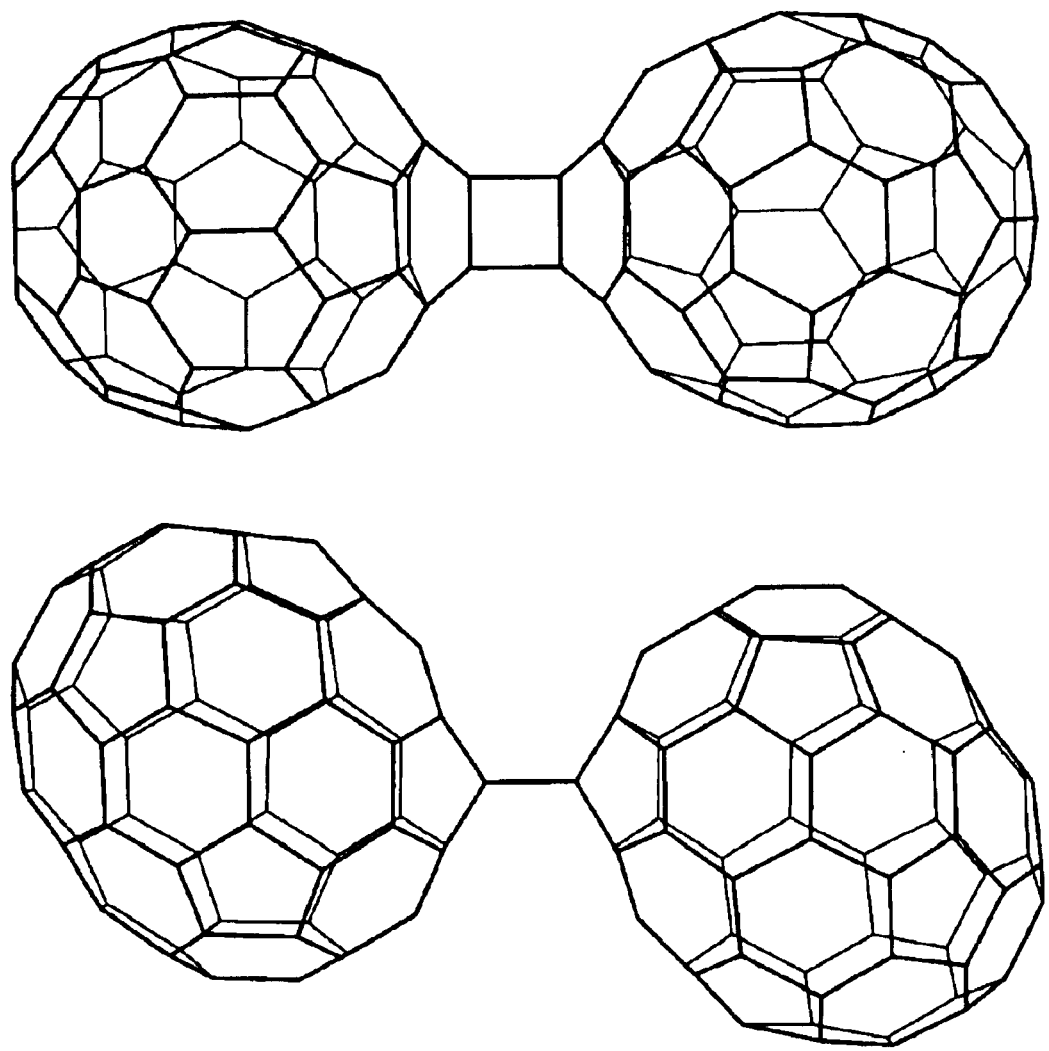
FIG. 17 shows still another dimeric structure of a $C_{70}$ molecule [$C_{140}(c)$].
Figure 18:
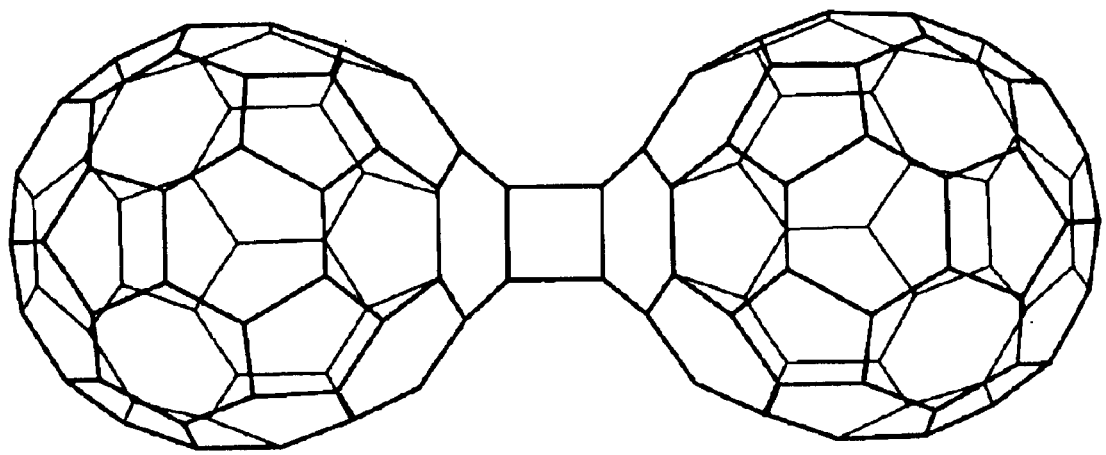
FIG. 18 shows still another dimeric structure of a $C_{70}$ molecule [$C_{140}(d)$].
Figure 18:
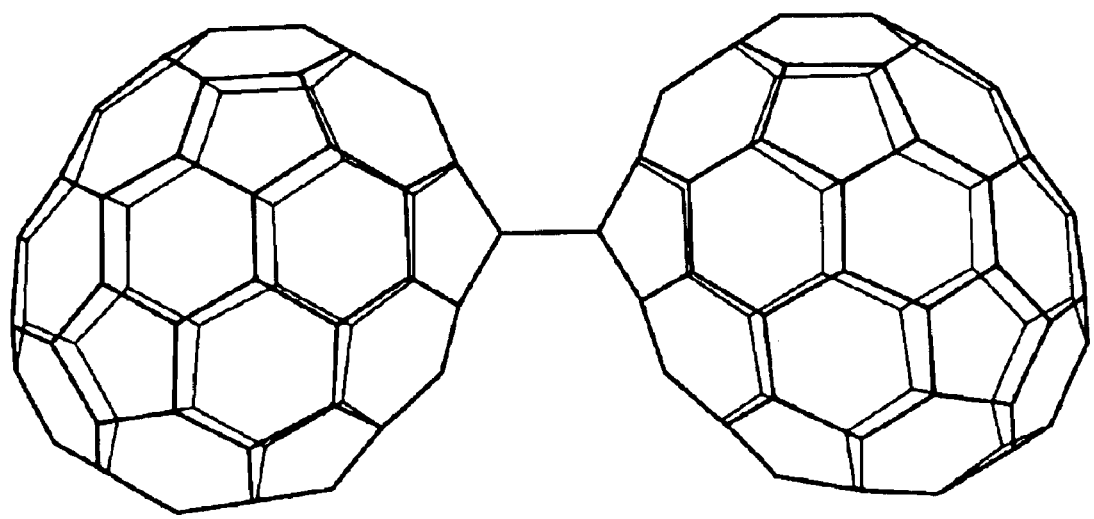
Figure 19:
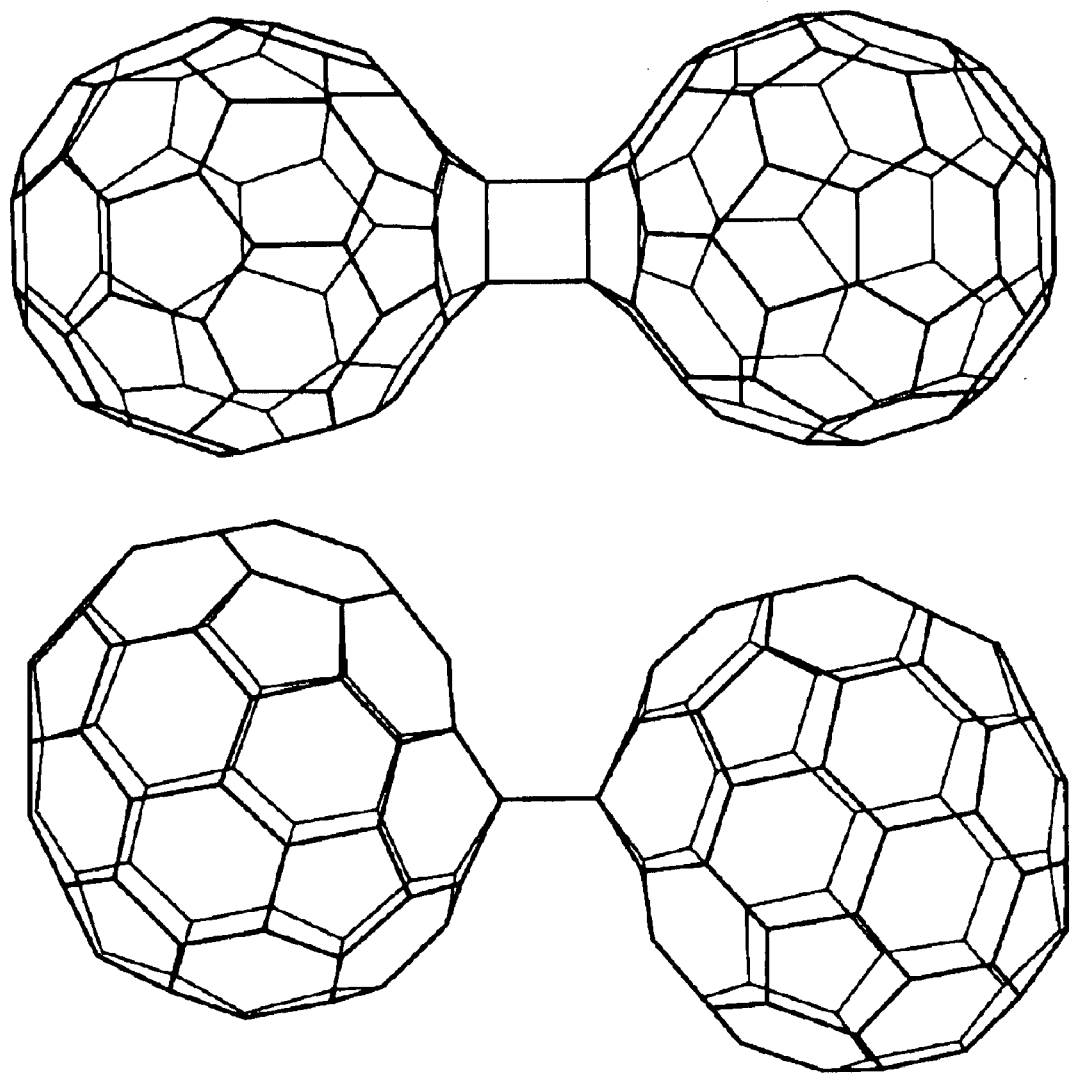
FIG. 19 shows still another dimeric structure of a $C_{70}$ molecule [$C_{140}$(e)].
Figure 20:
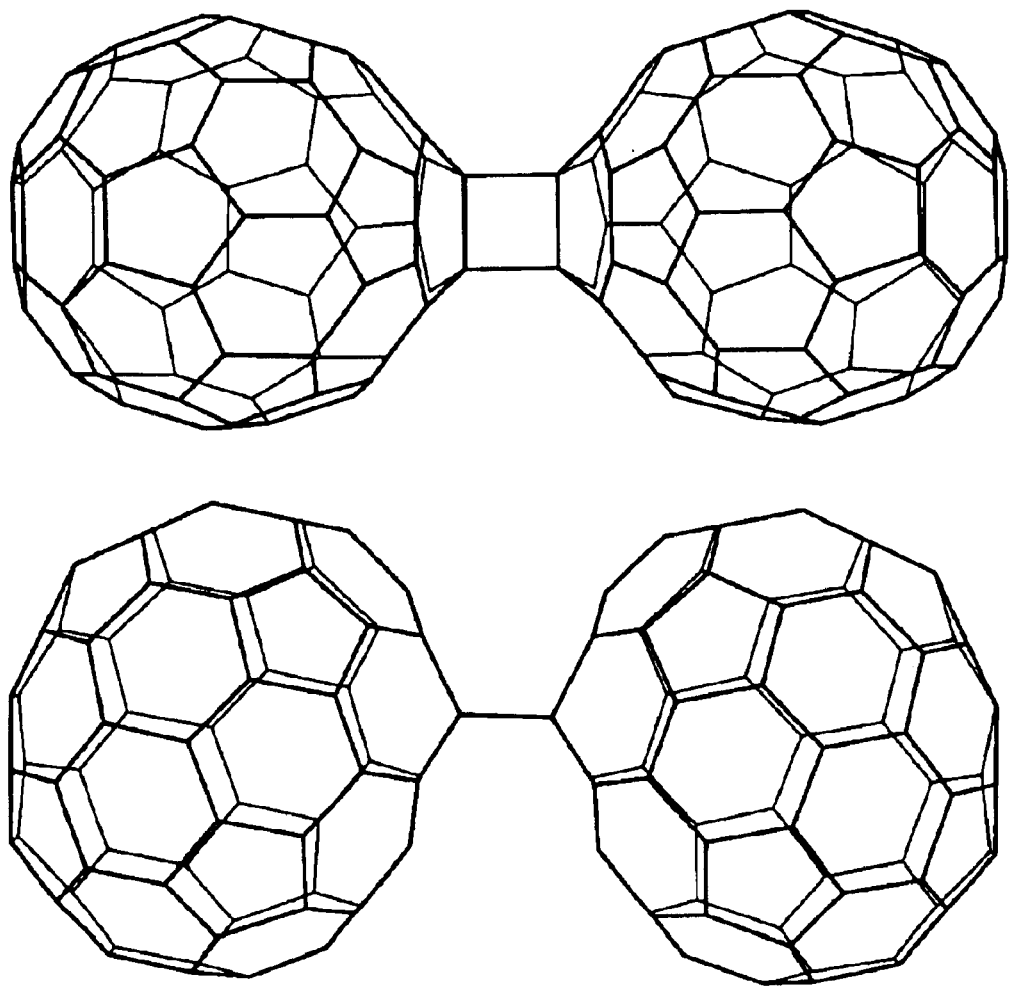
FIG. 20 shows still another dimeric structure of a $C_{70}$ molecule [$C_{140}$(f)].
Figure 21:
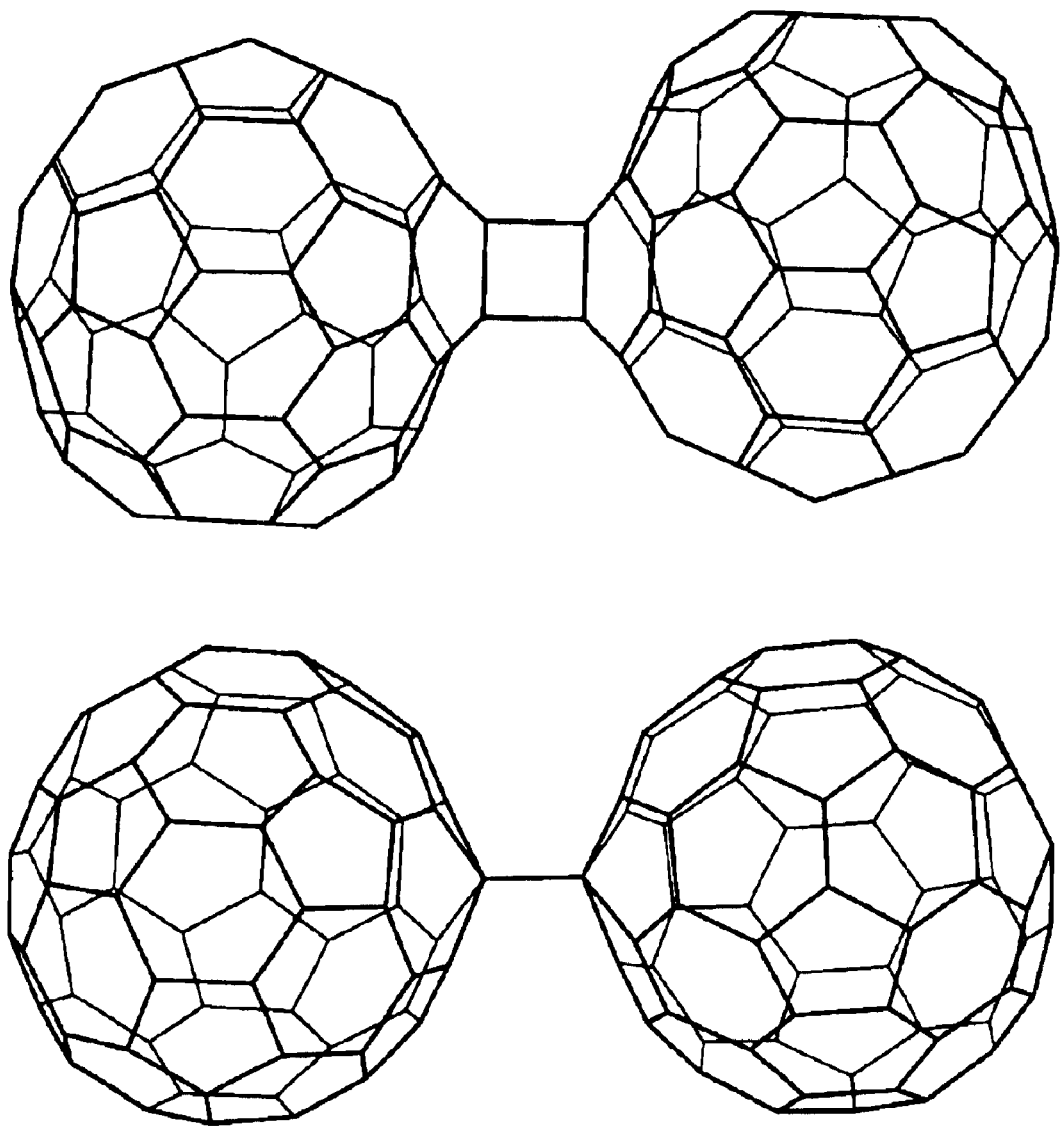
FIG. 21 shows still another dimeric structure of a $C_{70}$ molecule [$C_{140}$(g)].
Figure 22:
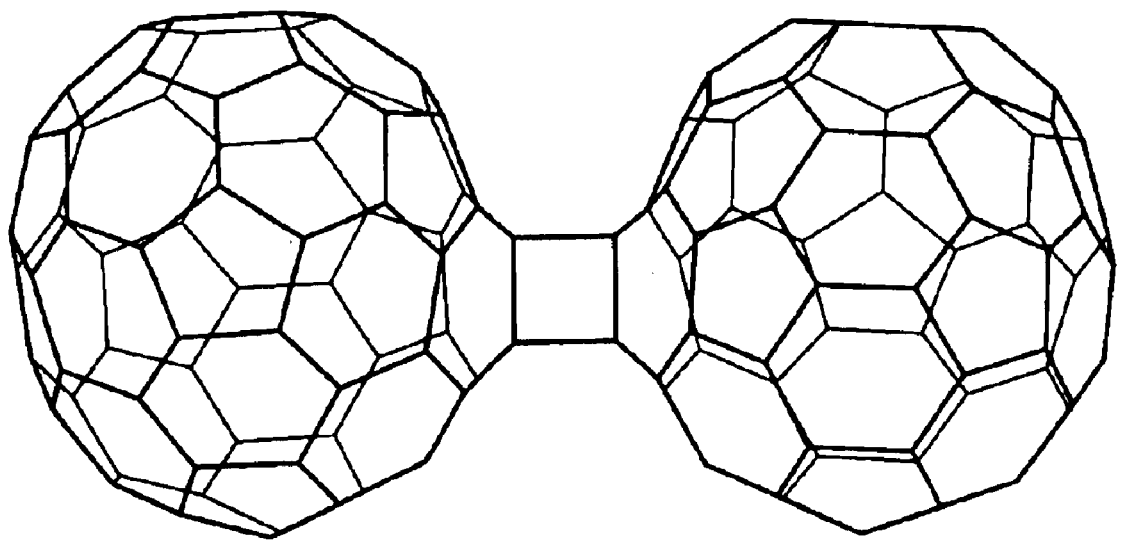
FIG. 22 shows still another dimeric structure of a $C_{70}$ molecule [$C_{140}$(h)].
Figure 22:
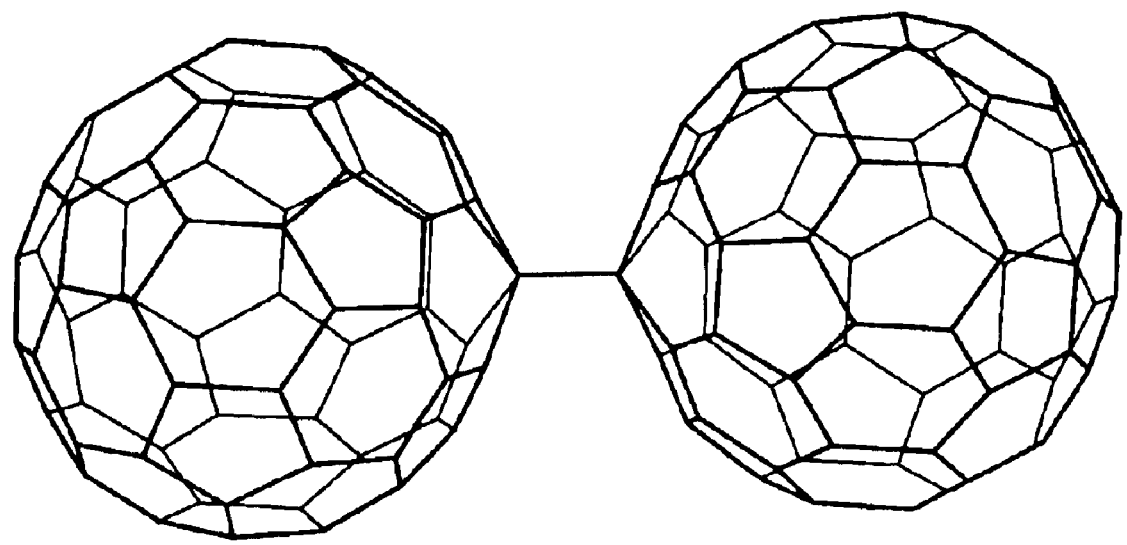
Figure 23:
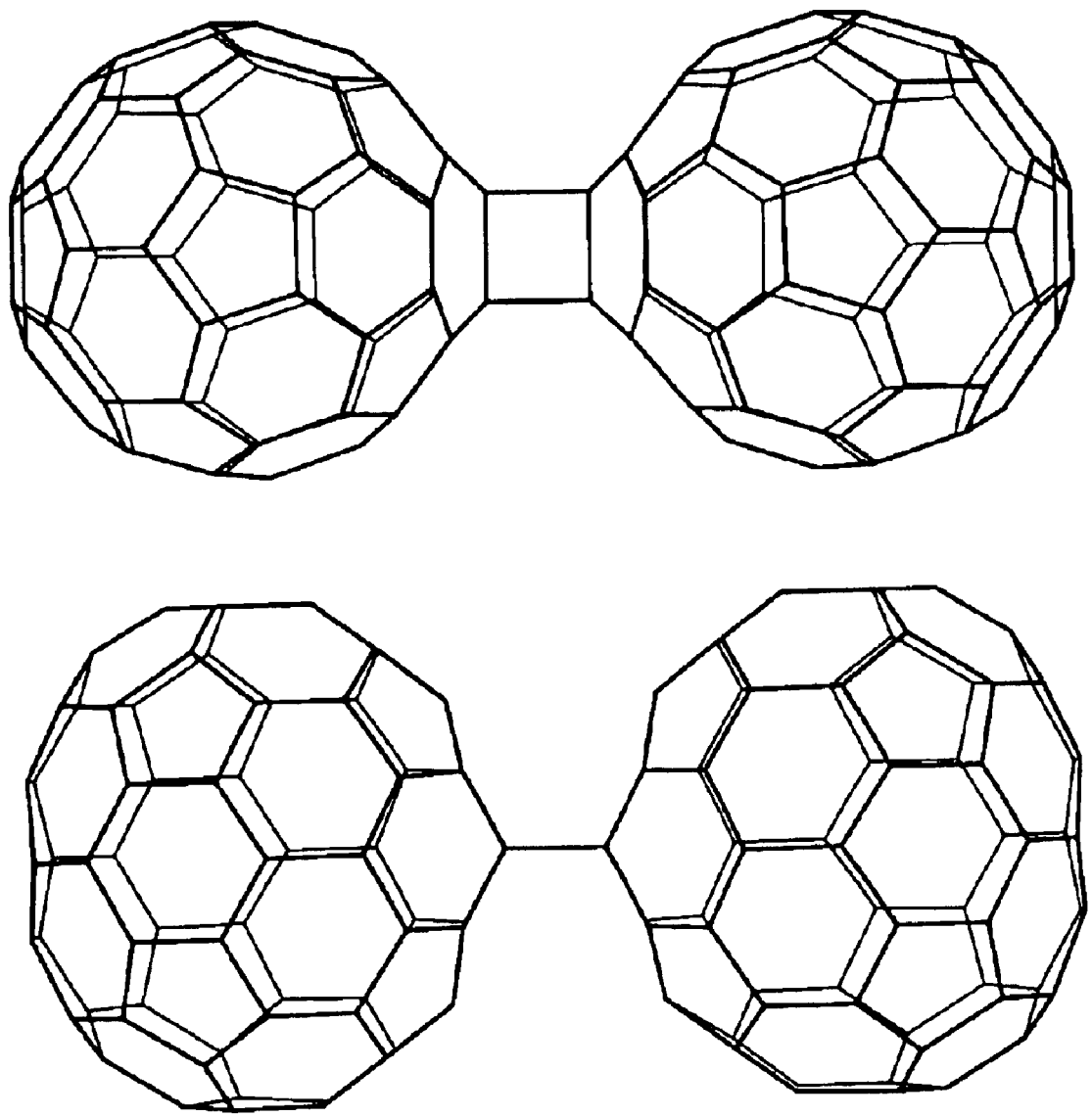
FIG. 23 shows still another dimeric structure of a $C_{70}$ molecule [$C_{140}$(i): D2h symmetrical].

| cluster (reference drawing) | $\Delta$HF0(r) (kcal/mol) ACTUATING MEANS - 1 | $\Delta$Hf0(r) (kcal/mol) PM - 3 | cross-linking | bond length (Å) |
|---|---|---|---|---|
| C140(a) (FIG. 15) | −34.63 | −38.01 | C(2)–C(2'), C(4)–C(4') C(2)–C(4), C(2)–C(4') | 1544 1607 |
| C140(b) (FIG. 16) | −34.33 | −38.00 | C(2)–C(4'), C(4)–C(2') C(2)–C(4), C(2')–C(4') | 1544 1607 |
| C140(c) (FIG. 17) | −33.94 | −38.12 | C(5)–C(5'), C(6)–C(6') C(5)–C(6), C(5')–C(6') | 1550 1613 |
| C140(d) (FIG. 18) | −33.92 | −38.08 | C(5)–C(6'), C(6)–C(5') C(5)–C(6), C(5')–C(6') | 1551 1624 |
| C140(e) (FIG. 19) | −19.05 | −20.28 | C(9)–C(9'), C(10)–C(10') C(9)–C(10), C(9')–C(10') | 1553 1655 |
| C140(f) (FIG. 20) | −18.54 | −19.72 | C(9)–C(10'), C(10)–C(9') C(9)–C(10), C(9')–C(10') | 1555 1655 |
| C140(g) (FIG. 21) | +3.19 | −3.72 | C(10)–C(10'), C(11)–C(11') C(10)–C(11), C(10')–C(11') | 1559 1613 |
| C140(h) (FIG. 22) | +3.27 | −3.23 | C(10)–C(11'), C(11)–C(10') C(10)–C(11), C(10')–C(11') | 1560 1613 |
| C140(i) (FIG. 23) | +64.30 | +56.38 | C(11)–C(11'), C(12)–C(12') C(11)–C(12), C(11)–C(12') | 1560 1683 |

In the table, $\Delta$Hf0(r)ACTUATING MEANS-1 and $\Delta$Hf°(r)PM-3 means calculated values of (he heat of reaction in case of using parameterization of the MNDO method which is a semi-empirical molecular starting method by J. J. Stewart.

Figure 24:
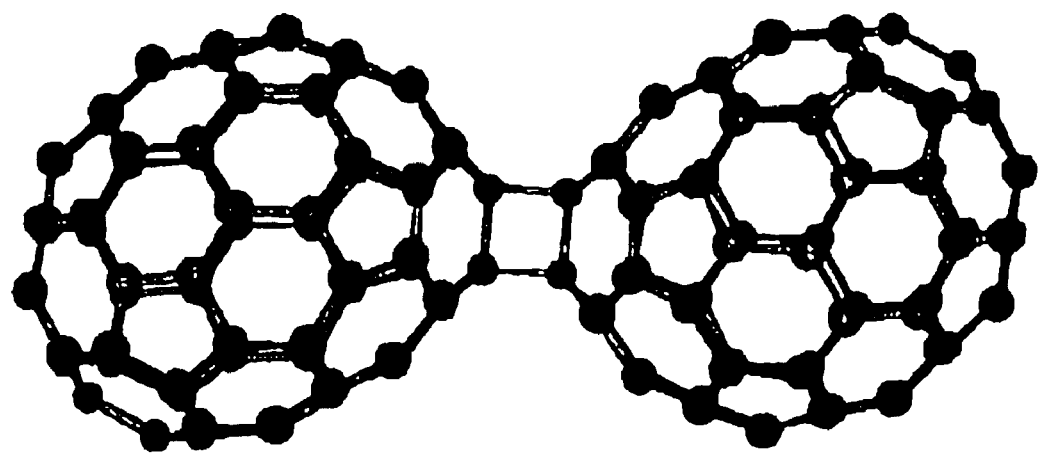
FIG. 24 shows still a dimeric structure of a $C_{70}$ molecule.

In the above Table, $C_{140}$ (a) and (b), $C_{,140}$ (c) and (d), $C_{140}$ (e) and (f) and $C_{,140}$ (g) and (h) are anti-syn isomer pairs of the C(2)–C(4), C(5)–C(6), C(9)–C(10) and C(10)—C(11) bonds, respectively. In the addition reaction between C(11) and C(12), only D2'symmetrical $C_{140}$ (i) is obtained. These structures are shown in FIGS. 15 to 23. Meanwhile, an initial structure of a $C_{70}$ polymer by the most stable [2+2] cycloaddition is shown in FIG. 24.

The utmost stability of the [2+2] cyclic additive structure indicates, in other words, that the C(2)–C(4) bond of the C70 molecular model is highest in addition reactivity.

From this Table 1, no energy difference is seen to exist between the anti-syn isomers. The addition reaction between the C(2)–C(4) and C(5)–C(6) bonds is as exothermic as the addition reaction of C60, whereas that between the C(11) –C(12) is appreciably endothermic. Meanwhile, the C(1)–C(2) bond is evidently a single bond. The heat of reaction of the cycloaddition reaction in this bond is +0.19 and −1.88 kcal/mol at the ACTUATING MEANS-1 and PM-3 level, respectively, which are approximately equal to the heat of reaction in $C_{140}$ (g) and (h). This suggests that the cycloaddition reaction across the C(10) and C(11) cannot occur thermodynamically. Therefore, the addition polymerization reaction across the $C_{70}$ molecules occurs predominantly across the C(2)–C(4) and C(5)–C(6), whereas the polymerization across the C(9)–C(10) bonds is only of low probability, if such polymerization takes place. It may be premeditated that the heat of reaction across the C(11)–C(12), exhibiting single-bond performance, becomes larger than that across the bond C(1)–C(2) due to the appreciably large pinch of the cyclobutane structure of $C_{140}$ (i), in particular the C(11)–C(12) bond. For evaluating the effect of superposition of the 2p2 lobe of sp2 carbon neighboring to the cross-linking bondage at the time of [2+2] cycloaddition, the values of heat generated in the $C_{70}$ dimer, $C_{70}$ —$C_{60}$ polymer and $C_{70}$ $H_2$ were compared. Although detailed numerical data are not shown, it may be premeditated that the effect of superposition can be safely disregarded across $C_{140}$ (a) to (h), insofar as calculations of the MNDO approximate level are concerned.

The mass distribution in the vicinity of the dimer by the LDITOF-MS of the $C_{70}$ polymer film indicates that dimers of $C_{116}$, $C_{118}$ etc are main products. Then, scrutiny is made into the structure of $C_{136}$ produced on desorbing four carbon atoms making up cyclobutane of a dimer $(C_{70})2$, as in the process of obtaining D2h—symmetrical $C_{116}$ from $C_{60}$ and recombining remaining $C_{68}$. These structures are shown in FIGS. 28 to 36. Table 2 shows comparative values of the generated heat ($\Delta$Hf0) of $C_{136}$.

TABLE 2

Figure 25:
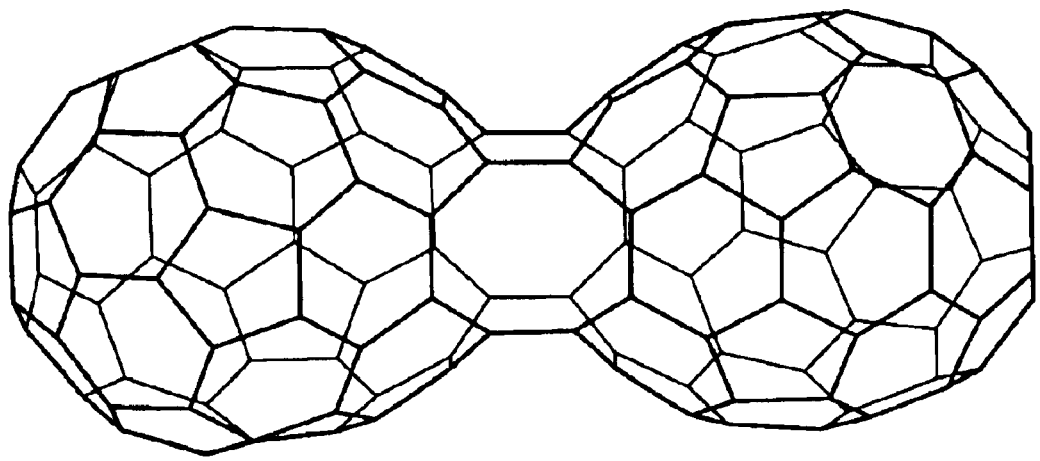
FIG. 25 shows a dimeric structure of a $C_{70}$ molecule [$C_{136}$(a)].
Figure 25:
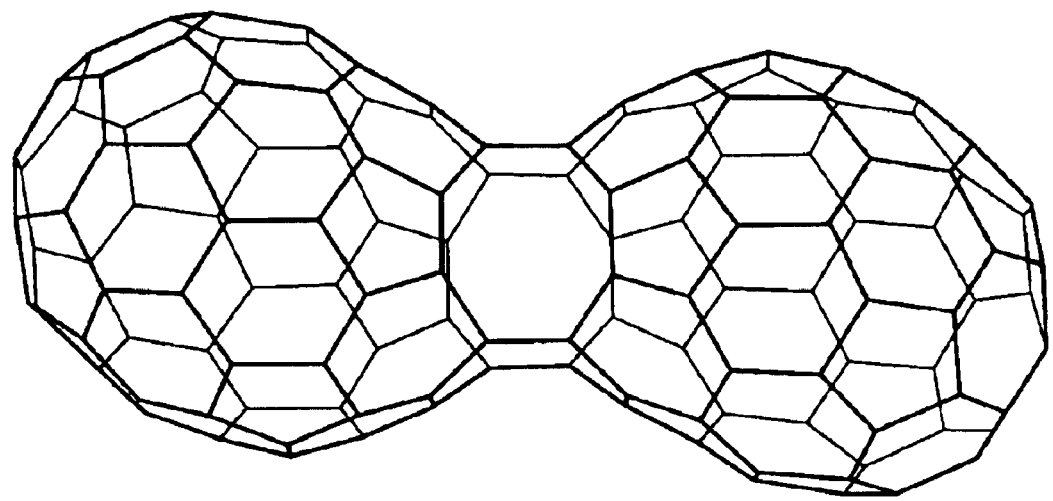

| cluster (reference drawing) | $\Delta$Hf0(r) (kcal/mol) AN - 1 | $\Delta$Hf0(r) (kcal/mol) PM - 3 | cross-linking | bond length (Å) |
|---|---|---|---|---|
| C136(a) (FIG. 24) | −65.50 | −61.60 | C(1)–C(8'), C(3)–C(5') C(5)–C(3'), C(8)–C(1') | 1.351 1.351 |
| C136(b) (FIG. 25) | −64.44 | −61.54 | C(1)–C(3'), C(3)–C(1') C(5)–C(8'), C(8)–C(5') | 1.351 1.351 |
| C136(c) (FIG. 26) | 0 | 0 | C(4)–C(13'), C(7)–C(10') C(10)–C(7'), C(13)–C(4') | 1.352 1.352 |
| C136(d) (FIG. 27) | +0.09 | +0.11 | C(4)–C(7'), C(7)–C(4') C(10)–C(13'), C(13)–C(10') | 1.351 1.354 |
| C136(e) (FIG. 28) | +112.98 | +102.89 | C(5)–C(8'), C(8)–C(5') C(11)–C(14'), C(14)–C(11') | 1.353 1.372 |
| C136(f) (FIG. 29) | +69.47 | +59.44 | C(5)–C(14'), C(14)–C(5') C(11)–C(8'), C(8)–C(11') | 1.358 1.352 |
| C136(g) | −3.74 | −9.20 | C(5)–C(15'), C(15)–C(5') | 1.344 |

TABLE 2-continued

| cluster (reference drawing) | ΔHf0(r) (kcal/mol) AN - 1 | ΔHf0(r) (kcal/mol) PM - 3 | cross-linking | bond length (Å) |
|---|---|---|---|---|
| (FIG. 30) | | | C(12)–C(9'), C(9)–C(12') | 1.352 |
| C136(h) | +2.82 | −5.30 | C(5)–C(9'), C(9)–C(5') | 1.372 |
| (FIG. 31) | | | C(12)–C(15'), C(15)–C(12') | 1.334 |
| C136(i) | +98.50 | +84.36 | C(13)–C(10'), C(15)–C(16') | 1.376 |
| (FIG. 32) | | | C(10)–C(13'), C(16)–C(15') | 1.376 |

In Table 2, ΔHf0 ACTUATING MEANS-1, ΔHf0 PM-3, cross-linking and the binding length are the same as those of Table 1. 52.

Figure 34:
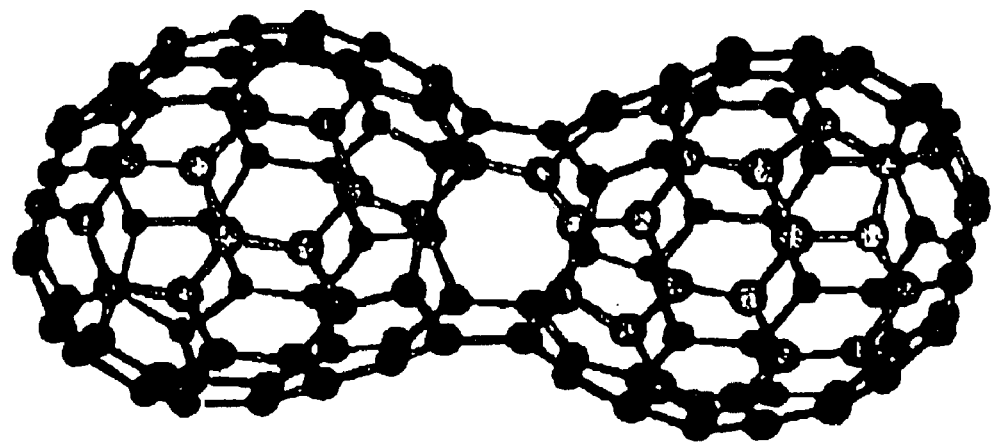
FIG. 34 shows another dimeric structure of a $C_{70}$ molecule.

It is noted that $C_{136}$ (a) to (i) are associated with $C_{140}$ (a) to (i), such that C(2) and C(4), which formed a cross-link at $C_{140}$(a), have been desorbed at $C_{136}$(a). It is noted that carbon atoms taking part in the four cross-links of $C_{136}$(a) are C(1), C(3), C(5) and C(8), these being SP2 carbon atoms. Among the dimers shown in Table 1, that estimated to be of the most stable structure at the PM—3 level is $C_{140}$(c). Therefore, in Table 2, ΔHf0 of $C_{136}$(c), obtained from $C_{140}$(c), is set as the reference for comparison. It may be seen from Table 2 that the structures of $C_{136}$(a) and $C_{136}$(b) are appreciably stabilized and that $C_{136}$(e), $C_{136}$(f) and $C_{136}$(i) are unstable. If the calculated values of ΔHf0 of per a unit carbon atom of the totality of $C_{140}$ and $C_{136}$ structures are evaluated, structure relaxation in the process from $C_{140}$ to $C_{136}$ only take place in the process from $C_{140}$(a) and (b) to $C_{136}$(a) and (b). Thus, the calculations of the MNDO approximation level suggest that, in the $C_{70}$ cross-link, not only are the sites of the [2+2] cycloaddition of the initial process limited lo the vicinity of both end five-membered rings traversed by the main molecular axis, but also is the cross-link structure of the π-covalent system, such as $C_{136}$, limited to $C_{136}$ obtained from the dimer of $C_{70}$ by the cycloaddition reaction across C(2)–C(4) bond. The molecular structure of more stable C136, yielded in the process of relaxation of the structure shown in FIG. 24, is shown in FIG. 34.

The polymer film of C60 shows semi-conductivity with the band gap evaluated from temperature dependency of the dark current being of the order of 1.5 to 2 eV. The dark conducivity of the $C_{60}$ polymer film obtained with the micro-wave power of 200 W is on the order of $10^{-7}$ to $10^{-8}$ S/cm, whereas that of the $C_{70}$ polymer film obtained for the same micro-wave power is not higher than $10^{-13}$ S/cm, which is approximate to a value of an insulator. This difference in the electrical conductivity of the polymer films is possibly attributable to the structures of the polymer films. Similarly to the sole cross-link bond in which two-molecular $C_{60}$ is in the state of open-shell radical state, the cross-link of a dimer of 1, 2–C(60) due to [2+2] cycloaddition reaction of FIG. 8 is thought not to contribute to improved electrically conductivity. Conversely, the inter-molecular cross-link, such as $C_{116}$, forms the π-covalent system, and hence is felt to contribute to improved electrically conductivity. The cross-link structures of $C_{118}$, $C_{114}$ and $C_{112}$, now under investigations, are thought to be a π-covalent cross-link contributing to electrically conductivity.

It may be contemplated that the electrical conductivity usually is not increased linearly relative to the number of electrically conductive cross-links between fullerene molecules, but is changed significantly beyond the permeation limit at a certain fixed number. In the case of $C_{70}$, the probability of the [2+2] cycloaddition reaction is presumably lower than that in the case of $C_{60}$, while the structure relaxation to the electrically conductive cross-linked structure such as that from $C_{140}$ to $C_{136}$ can occur only on specified sites. In light of the above, the significant difference in electrically conductivity between the two may possibly be attributable to the fact that, in the $C_{60}$ polymer film, the number of cross-links contributing to electrically conductivity is large and exceeds the permeation limit, whereas, in the case of $C_{70}$, the permeation limit is not exceeded because of the low probability of polymerization and limitation of formation of electrically conductive cross-links.

In the foregoing, explanation has been made on the discovery of fullerene molecules, fullerene vapor-deposited film, fullerene polymer film and the polymerization mechanism. The manufacturing method for the fullerene molecules, the film-forming method for the fullerene vapor-deposited film and the fullerene polymer film by polymerization will hereinafter be explained with reference to the drawings.

First, the fullerene molecules, as a starting material, those of $C_{60}$, $C_{70}$ and higher-order fullerene may be used, either singly or in combination. Most preferred are the $C_{60}$ fullerene, the $C_{70}$ fullerene or mixtures thereof. In addition, the fullerene of higher orders, such as $C_{70}$, $C_{78}$, $C_{80}$, $C_{82}$, $C_{84}$ and so forth may be contained therein.

Figure 35:
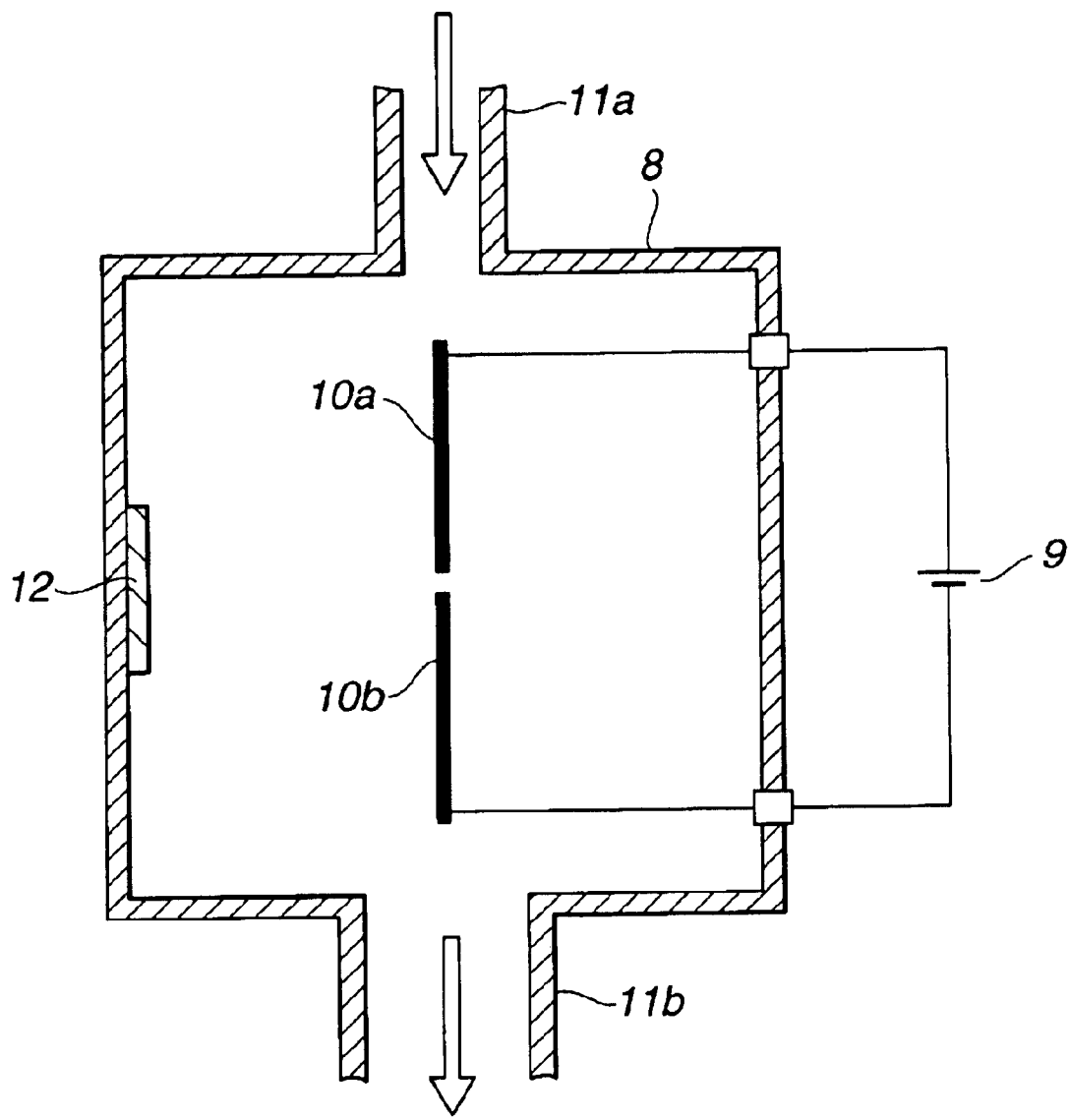
FIG. 35 shows a device for manufacturing fullerene molecules by arc discharge.

These fullerene molecules may be manufactured by an arc discharge method of a carbon electrode, using an apparatus shown for example in FIG. 35.

In a reaction vessel 8 of the present apparatus, there are mounted a pair of carbon electrodes, connected to an AC or DC source 9, such as counter-electrodes 10a, 10b formed of graphite. After evacuating the reaction vessel 8 by a vacuum pump through an exhaust pump, low-pressure inert gas, such as helium or argon, is introduced via an inlet 11a so as to be charged into the reaction vessel 8.

The ends of the counter-electrodes 10a, 10b are arranged facing each other with a small gap in-between, and a predetermined current and voltage are applied from the DC source 9 to maintain the state of arc discharge across the ends of the counter-electrodes 10a, 10b for a predetermined time.

By this arc discharge, the counter-electrodes 10a, 10b are vaporized so that soot is gradually deposited on a substrate 12 mounted on the inner wall surface of the reaction vessel 8. If this amount of soot deposited is increased, the reaction vessel 8 is cooled and the substrate 12 is taken out, or the soot is recovered using a sweeper.

This soot contains various fullerene molecules, including $C_{60}$ and $C_{70}$, and may contain approximately not less than 10% of fullerene molecules, depending on circumstances.

From this soot, the fullerene such as $C_{60}$ or $C_{70}$ may be extracted using solvent, such as toluene, benzene or carbon disulfide. The yielded fullerene, obtained in this stage, is termed crude fullerene, which may be applied to column chromatography to separate $C_{60}$ and $C_{70}$ as purified separate products.

The resulting fullerene molecules are used as a starting material in the film-forming process of the fullerene polymer. Among the polymerization or film-forming methods, there are, for example, an electron beam illumination method, an electromagnetic polymerization method, photopolymerization method, plasma polymerization method, micro-wave polymerization method and an electronic polymerization method.

Fullerene Vapor-Deposition Method

For this vapor deposition, a vapor-deposition device comprising a reaction chamber capable of maintaining vacuum or lower pressure, and heating means provided therein for vaporizing fullerene molecules, such as resistance heating. The fullerene molecules are vaporized on heating to form a vapor-deposited film on a substrate carrying the above-mentioned carbonaceous thin film.

Photopolymerization Method

In this polymerization method, an apparatus including a reaction chamber capable of being maintained at a reduced pressure or in vacuum, heating means, such as resistance heating means, for vaporizing the fullerene molecules, and illumination means for illuminating the light, such as ultra-violet beam, through the window of the reaction chamber, is used. A fullerene polymer film is formed on the substrate as fullerene is evaporated and illumination of ultraviolet light is continued for a predetermined time. At this time, the fullerene molecules are excited by light and polymerized through the excited state.

It is noted that polymerization occurs by forming an evaporated film and illuminating ultraviolet rays thereon, without illuminating the light as the evaporation is going on. In this case, there are occasions wherein only a superficial layer of the film is polymerized, whilst the inside of the film is not polymerized. An experiment conducted by the present inventors have revealed that a pattern of cracks can be produced on the surface of the evaporated fullerene film on UV irradiation, as may be observed over a microscope.

Electron Beam Polymerization Method

This method uses an electron beam radiated from the electron gun in place of the light such as ultraviolet light. The principle of polymerization is similar to the photo polymerization method, that is, the fullerene molecules are excited by an electron beam and polymerized through the excited state.

X-Ray Polymerization Method

This method uses X-rays radiated from an X-ray tube in place of an electron beam. The principle of polymerization is the same as that of the electron beam. The fullerene molecules are excited by X-rays and polymerized through this excited state.

Plasma Polymerization Method

Among the plasma polymerization methods, there are a high-frequency plasma method, a DC plasma method and an ECR plasma method. Here, the high-frequency plasma method, which is now in widespread use, is explained by referring to the drawings.

Figure 36:
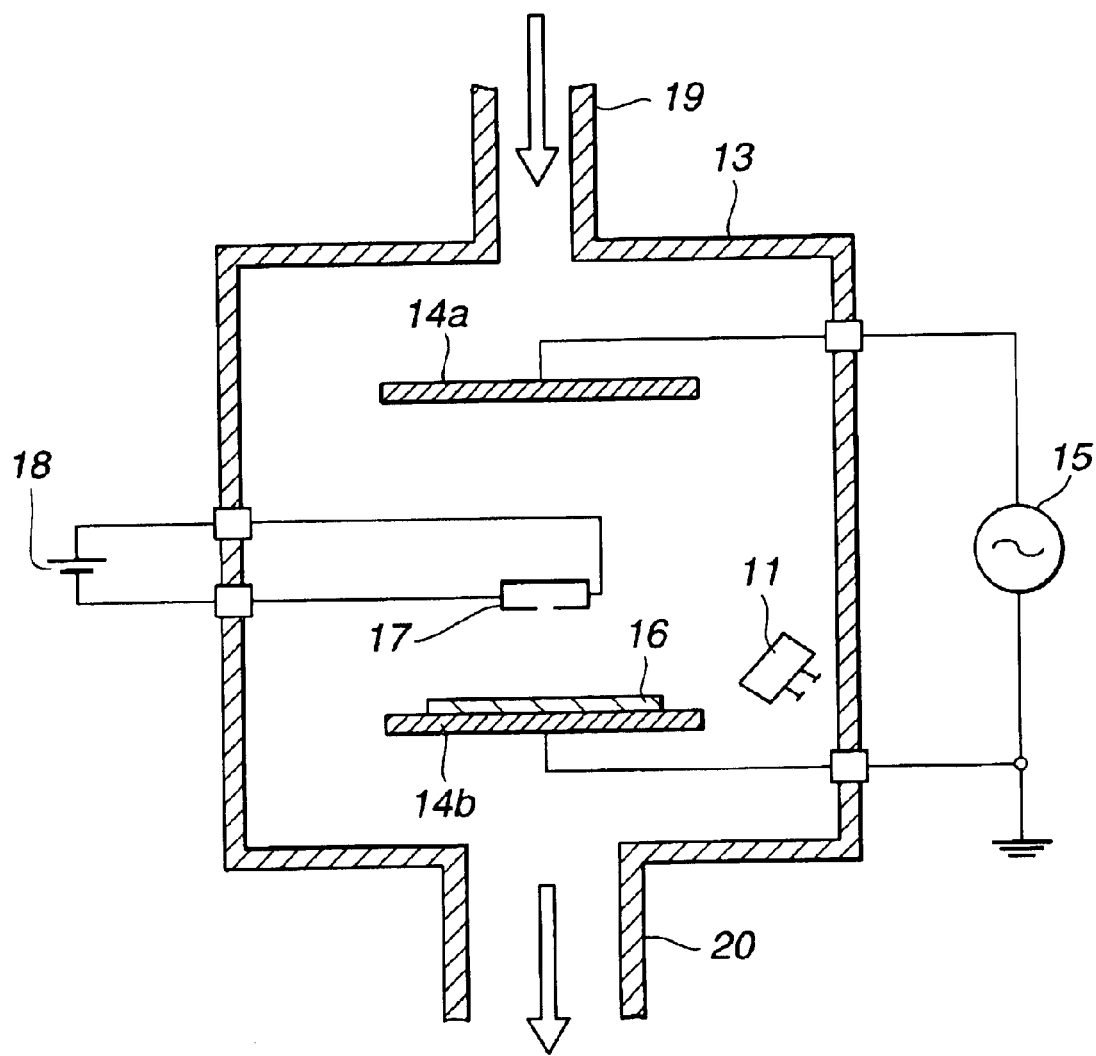
FIG. 36 shows a manufacturing apparatus for manufacturing fullerene molecules by a plasma polymerization method.

FIG. 36 shows a typical high-frequency plasma polymerization apparatus, including a vacuum vessel 13, within which are arranged a pair of electrodes 14a, 14b facing each other. These electrodes are connected to an outer high frequency power source 15. On one 14b of the electrodes is set a substrate 16 for permitting a fullerene polymer film to be deposited thereon.

In this vacuum vessel 13, there is arranged a vessel 17 formed e.g., by a molybdenum boat, accommodating the fullerene molecules, as a starting material. This vessel 17 is connected to an external power source for resistance heating 18.

In the polymerization apparatus, constructed as described above, a low-pressure inert gas, such as argon, is introduced through an inlet 19 into the vacuum vessel 13, which is evacuated through the exhaust port 20. After the vacuum vessel 13 is charged with the inert gas, the current is supplied to the vessel 17 to heat it to vaporize the fullerene molecules therein. The high frequency voltage is applied from the high frequency power source 15 to generate a high frequency plasma across the electrodes, while illumination is made into the fullerene gas to form a fullerene polymer film holding the π-electron skeleton on the substrate 16.

Meanwhile, a DC power source may be used in place of the high frequency power source 15 (DC plasma method). If the vessel 17 is heated without actuating these power sources, that is without generating the plasma, the fullerene is not polymerized, but its evaporated film is formed on the substrate 16.

If the temperature of the substrate 16 is excessively high, the amount of deposition of the fullerene polymer film is decreased. Therefore, the substrate is usually kept at a temperature of 300° C. or less. If the plasma power is of the order of 100 W, the temperature scarcely exceeds 70° C.

Method of Illuminating the Evaporated Film with Electromagnetic Wave

This technique furnishes a method for generating a fullerene polymer by vacuum depositing fullerene molecules and then illuminating electromagnetic waves such as RF plasma thereon to polymerize the fullerene molecules, and a manufacturing method for a functional element employing the fullerene polymer film as a functional element constituting layer.

In the fullerene molecules, functional element, and manufacturing method therefor, a vapor-deposited film of fullerene molecules is first formed and polymerized on illumination of electromagnetic waves, so that, by first measuring the thickness of the vapor-deposited film and by controlling the vapor deposition conditions, such as vapor deposition temperature, a vapor-deposited film of a desired film thickness can perpetually be produced. Thus, the film thickness of the fullerene polymer film by illumination of electromagnetic waves can be easily and effectively controlled to achieve a desired film thickness.

Moreover, since the fullerene vapor-deposited film is polymerized as the structure of the fullerene molecules constituting the vapor-deposited film is kept, so that a fullerene polymer film of a neat structure with the fullerene molecule skeleton can be formed. Should an organic film etc be present in the underlying layer, the vapor-deposited film formed thereon does not damage the underlying layer, which may also be protected from radiation of electromagnetic waves due to the presence of the vapor-deposited film.

Figure 37A:
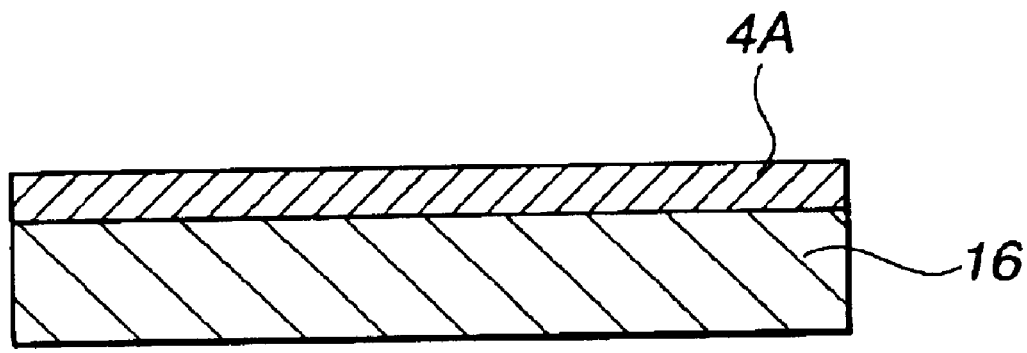
FIG. 37A shows the formation of a vapor-deposited film of fullerene polymer film and FIG. 37B shows the formation of a fullerene polymer film y illumination of electromagnetic waves.
Figure 37B:
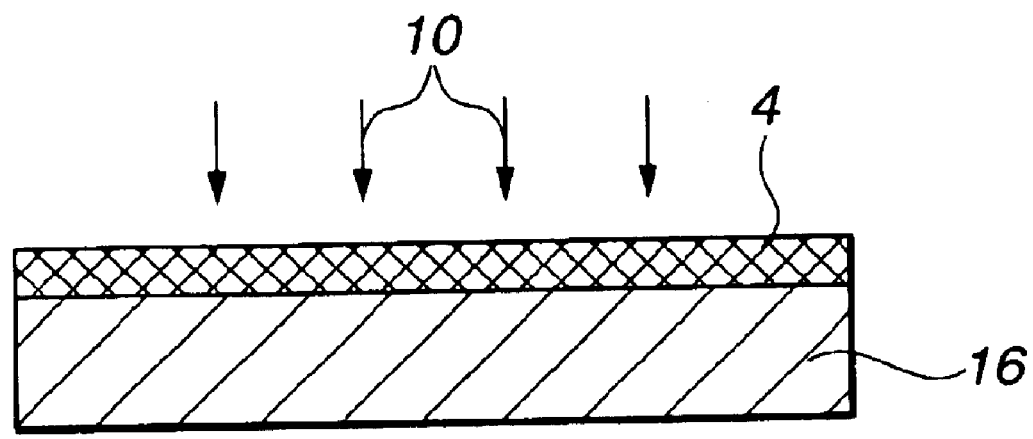

In the present technique, a vapor-deposited film 4A of fullerene molecules, such as $C_{60}$, is formed on a substrate 16, as shown in FIG. 37A. During evaporation, the film thickness of the vapor-deposited film 4A is measured to control the film thickness to e.g., 10 Å (thickness of a single molecular layer) to 200 nm. After forming the vapor-deposited film of a desired thickness, the vapor-deposited film 4A is polymerized by illumination of electromagnetic waves 10, such as RF plasma, to polymerize the vapor-deposited film 4A to form the fullerene polymer film 4A, as shown in FIG. 37B. The film thickness is measured using a film thickness meter 11 arranged in the vacuum chamber 13, as shown in FIG. 38.

Figure 38:
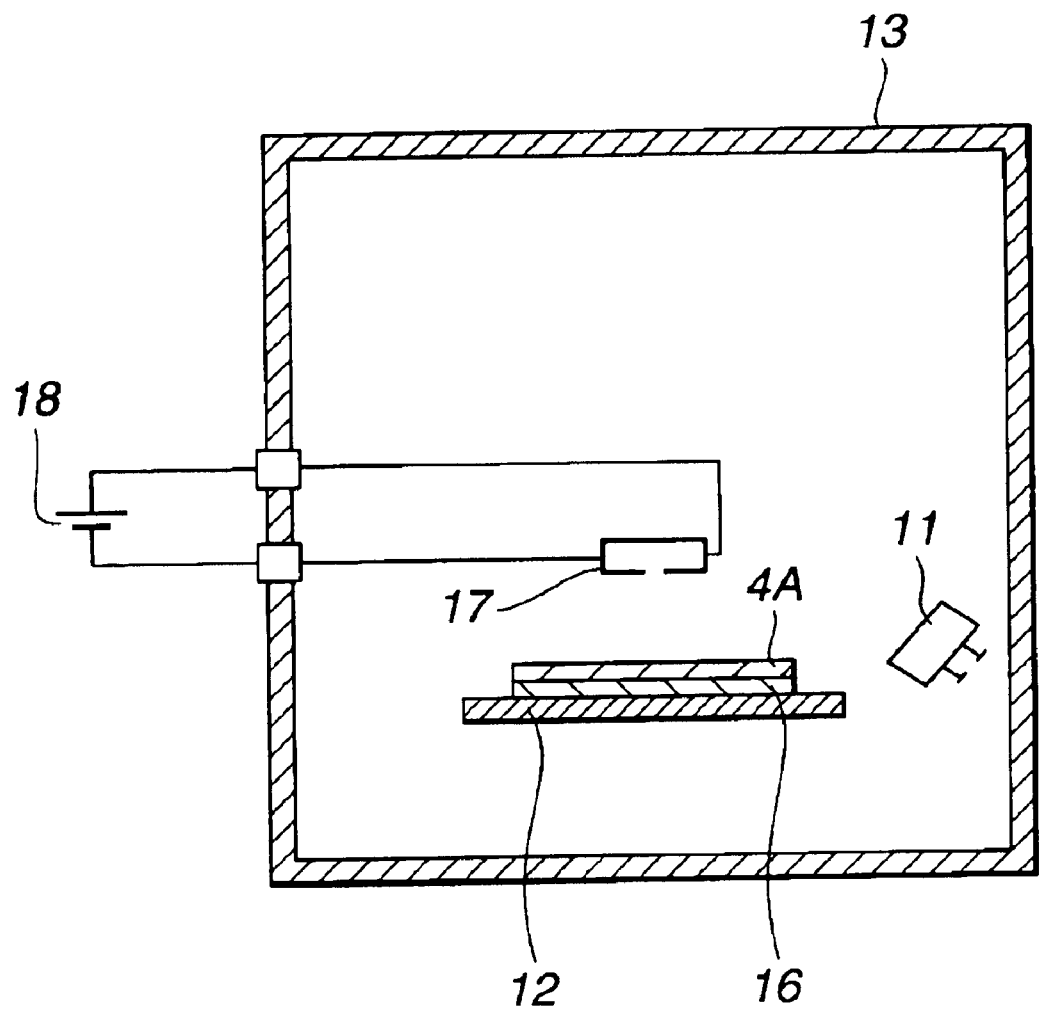
FIG. 38 shows a vapor deposition device.

FIG. 38 shows an evaporation device including a susceptor 12 arranged in the vacuum vessel 13. On the susceptor 12 is set a substrate on which to deposit an evaporated fullerene film. This substrate may, for example, be a substrate 1 on which an electrically conductive high molecular film has been formed on a light-transmitting electrode.

In the vacuum vessel 13 is arranged a vessel 17, such as a molybdenum boat, for accommodating fullerene molecules as a starting material therein. This vessel is connected to an external resistance heating power source 18.

In the evaporation device, constructed as described above, the current is supplied to the vessel 17 in the evacuated vacuum vessel 13, to heat the vessel to vaporize the fullerene molecules therein to form an evaporated fullerene film of fullerene 4A on the substrate 1.

Figure 39:
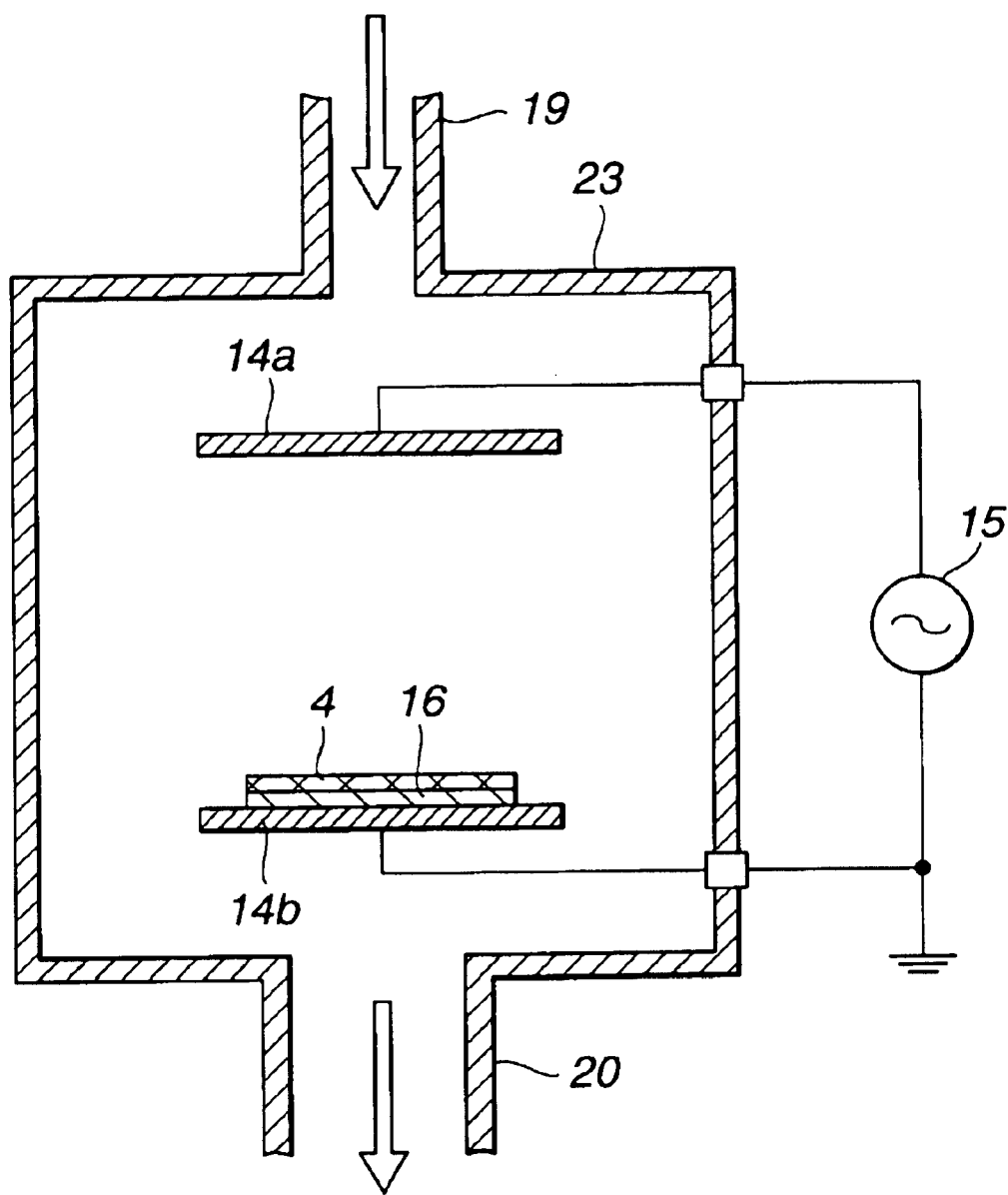
FIG. 39 shows a high frequency plasma polymerization device.

Then, in a high frequency plasma polymerization apparatus of FIG. 39, in which a pair of electrodes 14a, 14b are arranged facing each other in a vacuum vessel 23 and are connected to ah external high frequency power source 15, the substrate 1, carrying the evaporated fullerene film 4A, is set.

In this polymerization apparatus, a low pressure inert gas, such as argon, is supplied into the vacuum vessel 23, evacuated through the exhaust port 20, to fill the inside of the vacuum vessel 23 with the gas. The high frequency voltage is applied from the high frequency power source 15 to generate a high frequency plasma across the electrodes 14a and 14b, at the same time as the evaporated fullerene film 4A is illuminated and thereby polymerized to form a fullerene polymer film 4 having the π-electronic skeleton.

The high frequency power source 15 may be replaced by a DC power source (direct current plasma method). If the devices of FIGS. 38 and 39 are combined as shown in FIG. 36, and the vessel 17 is heated without driving the power source 15, that is without generating the plasma, the evaporated fullerene film 4A is formed on the substrate 1. The power source 15 may be driven in the same apparatus to effect polymerization in a manner as described above.

The fullerene molecules may be fullerenes $C_{60}$ or $C_{70}$ by itself or a mixture thereof. The electromagnetic waves illuminated may be RF plasma, UV rays or electron rays.

Microwave Polymerization Method

Figure 40:
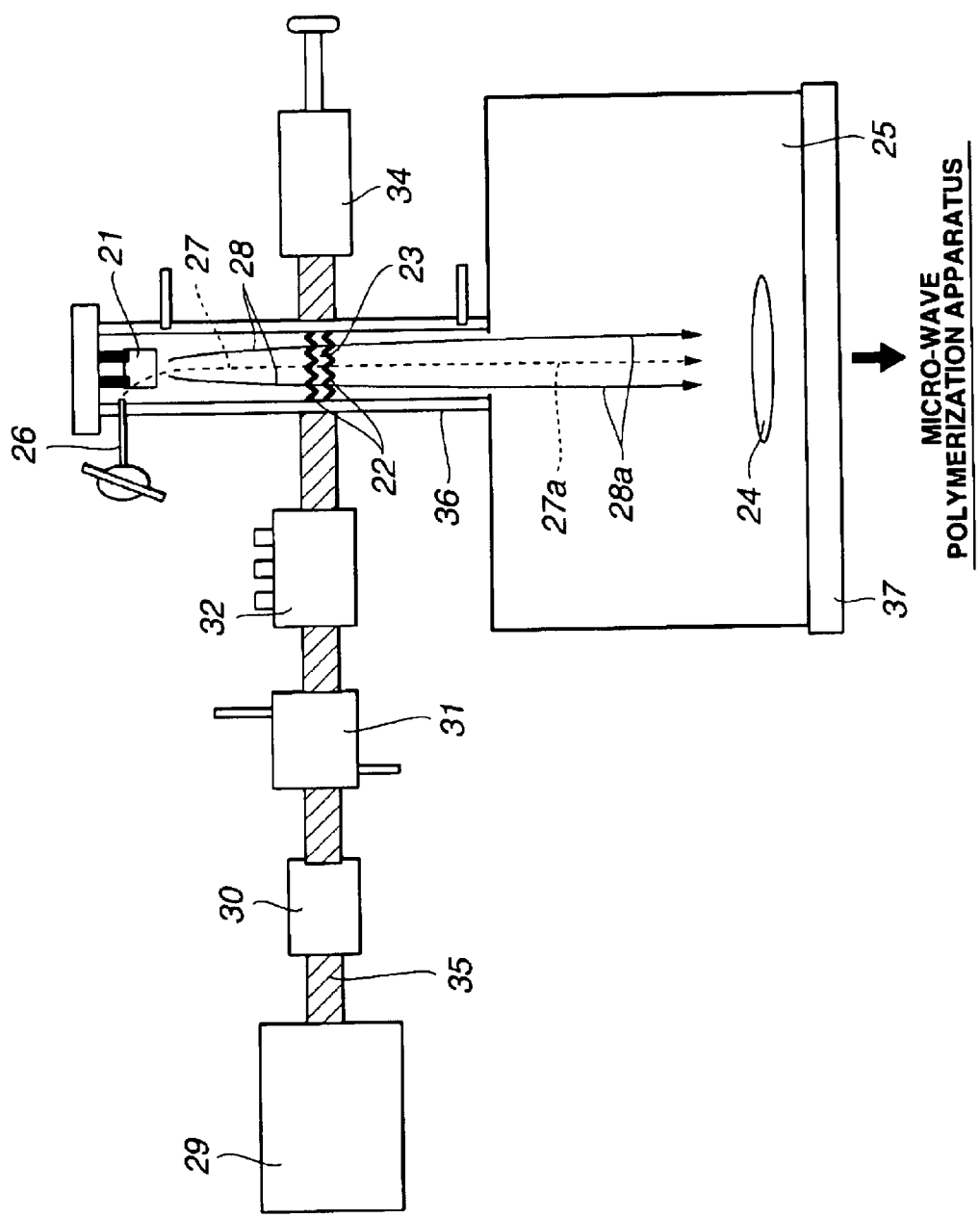
FIG. 40 shows a device for manufacturing fullerene molecules by a micro-wave polymerization method.

FIG. 40 shows a typical microwave polymerization apparatus including a vessel 21, such as a molybdenum boat, accommodating the fullerene molecules as a supply source of a starting material, a microwave operating portion 23 for causing the microwave 22 to operate on flying fullerene molecules, a reaction chamber 25 for generating a fullerene polymer by induction by the microwave 22 (excitation of asymmetric plasma) and for forming its film on the gas 24, and a microwave generating device for generating the microwave 22.

In an inner wall of the polymerization apparatus in the vicinity of the vessel 21 is opened a gas inlet tube 26 for introducing a carrier gas, such as an argon gas, into the inside of the apparatus. This carrier gas 27 has not only the capability of entraining fullerene molecules 27 to bring them onto the substrate 24 in the reaction chamber 25 but the capability of modifying the surface of the substrate 24 in the following manner.

That is, if, before introducing the fullerene molecules 28 into the inside of the apparatus, the carrier gas 27 is introduced and excited by the microwave operating portion 23 so as to be bombarded onto the surface of the substrate 24 in the reaction chamber 25, the substrate surface is etched by the excited carrier gas 27 to improve adhesion of the substrate surface with the fullerene polymer film deposited thereon.

The microwave generating device (microwave unit) includes a microwave oscillation source 29, an isolator 30, a power meter 31, a microwave power tuner 32 and a reflection cavity 34, interconnected by a wave guide tube 35. Of these, the microwave oscillation source 29 is made up of an oscillation source, such as a magnetron, whilst the isolator 30 and the power meter 31 have the functions of rectifying the microwave and of detecting the microwave power. The microwave power tuner 32 is a device for adjusting the number of oscillations of the microwave, having the function of matching the number of oscillations, whilst the reflection cavity 34 is a device for reflecting the microwave and matching the wavelength to convert the microwave in the microwave operating portion 23 into a standing wave.

The reaction chamber 25 may be larger in diameter than a resonant tube 36 which is a flow duct of the carrier gas 27 and the fullerene molecules 28, and is configured so that the fullerene molecules induced efficiently to high density in the microwave operating portion 23 of the resonant tube will be led onto a substrate 24 of e.g., silicon, provided on a support, not shown, where the fullerene polymer film will be formed uniformly. In the reaction chamber 25, there is provided an evacuating system 37 for maintaining a pre-set pressure in the reaction chamber 25.

The support for mounting the substrate 24 thereon may be electrically conductive or insulating. It may also be provided with heating means, such as current supplying means.

If this microwave polymerization device is to be used, the inside of the reaction chamber 25 is maintained at a pressure of approximately 0.05 to 1 Torr, with e.g., an argon gas, whilst the vessel 21 is heated by heating means, not shown, for vaporizing the fullerene molecules therein. The vaporized fullerene molecules then are illuminated with e.g., a high frequency plasma of the order of 13.56 MHz by the microwave operating portion 23. This excites the fullerene molecules to form a fullerene polymer film on the substrate 24.

The temperature of the substrate 24 of 300° C. or less usually suffices. If this temperature exceeds 300° C., the amount of deposition of the fullerene polymer film is occasionally lowered. It is noted however that deposition of the fullerene polymer film is facilitated by applying a bias voltage. No special control is needed to maintain the substrate temperature in the above range during film formation. For example, if the microwave power is of the order of 100 W, the temperature rarely exceeds 100° C. Meanwhile, if the substrate 24 is put on the microwave operating portion 23, the tel is occasionally increased to near 1000° C.

Electrolytic Polymerization Method

Figure 41:
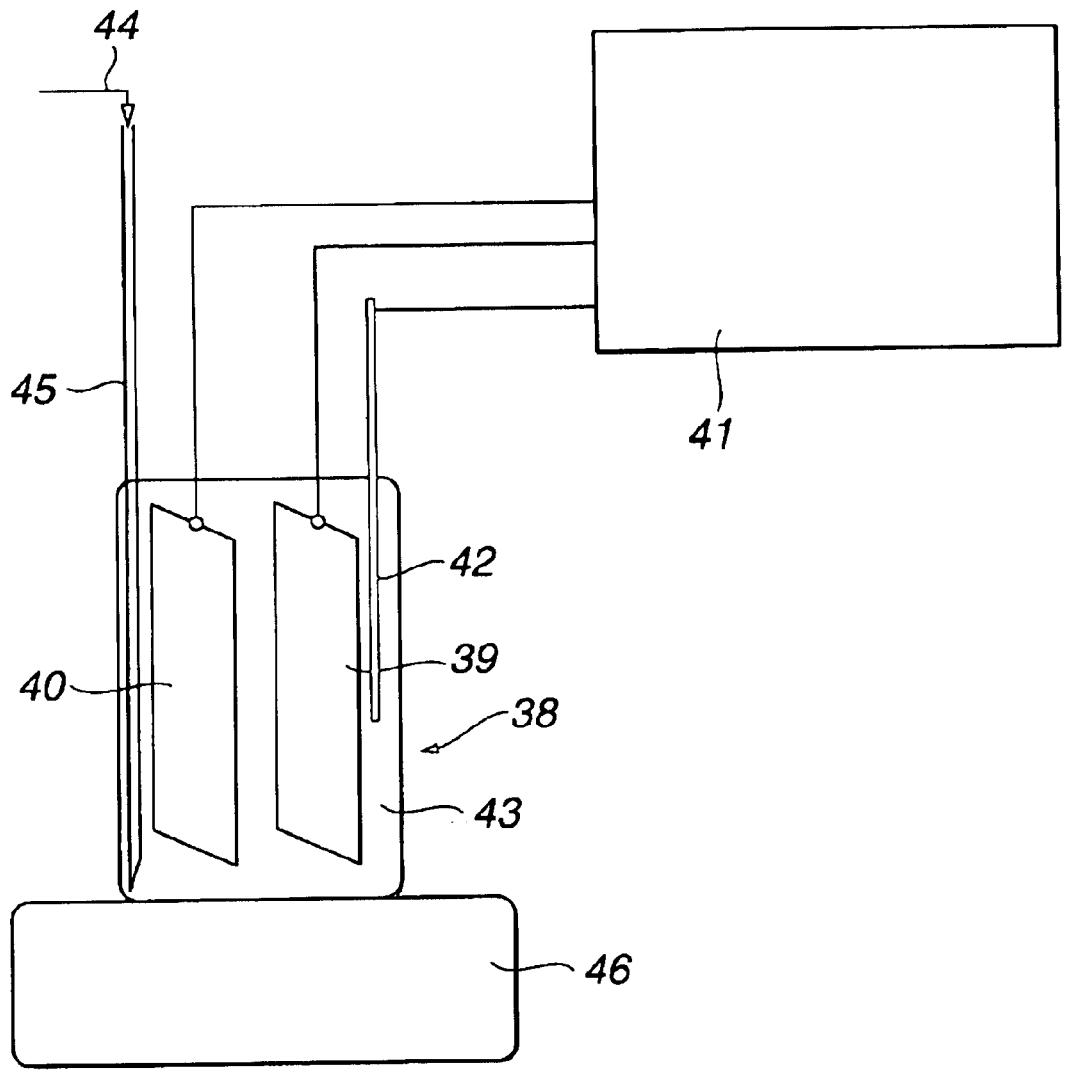
FIG. 41 shows a device for manufacturing a fullerene polymer film by an electrolytic polymerization method.

FIG. 41 shows a typical electrolytic polymerization apparatus in which an electrode 39 as a positive electrode and an electrode 40 as a negative electrode, both connected to a potentiostat 41, are provided in an electrolytic cell 38, and in which a reference electrode 42 is connected to the same potentiostat 41 so that a pre-set electric potential is applied across the electrodes 39 and 40.

The electrolytic cell 38 is provided with a gas inlet tube 45 for introducing the inert gas 44 for removing an oxygen gas etc from a non-aqueous solvent 43. In a lower portion of the electrolytic cell 38, there is provided a magnetic stirrer 46 for causing movement of a stirrer, not shown, provided in the cell.

For operating the electrolytic polymerization apparatus, constructed as described above, fullerene molecules, as starting material, a supporting electrolyte, for accelerating electrolysis, and the non-aqueous solvent 43, are charged into the electrolytic cell 38 and the potentiostat 41 is operated to cause a pre-set electrical energy to operate across the electrodes 39, 40. Then, a majority of the fullerene molecules are turned into anionic radicals, whilst a fullerene polymer is formed as a precipitate as a thin film and/or a precipitate on the negative electrode 40. Meanwhile, the spherically-shaped fullerene polymer, obtained as a precipitate, can be readily recovered by filtration or drying. After recovery, the polymer can be solidified or kneaded into a resin to form a thin film.

Although the electrodes 39, 40 are preferably metal electrodes, they may also be formed of other electrically conductive materials, or by vapor depositing metal or other electrically conductive materials on a silicon or glass substrate. The materials of the reference electrode 42 need not be limited to particular metals, depending on the sort of the supporting electrolyte.

The removal of e.g., oxygen by the inert gas 44 may usually be helium gas bubbling. The helium gas may also be replaced by other inert gases, such as nitrogen or argon. For completely removing oxygen etc, it is advisable to dehydrate the non-aqueous solvent, composed of first and second solvents, as later explained, using a dehydrating agent, to evacuate the solvent, to save the respective solvents in ampoules and to introduce the solvents saved in the ampoules through a vacuum line into the electrolytic cell 38.

It should be noted that oxygen etc is removed from the electrolytic solution in order to prevent oxygen etc from being captured into the fullerene polymer film to suppress paramagnetic centers to improve stability of the fullerene polymer film.

As the supporting electrolyte, tetrabutyl ammonium perchloride, lithium tetrafluoro borate ($LiBF_4$), lithium hexafluoro phosphate ($LiPF_6$), sodium peroxide ($NaClO_4$), $LiCF_3SO_3$, and lithium hexafluoro arsenide ($LiAsF_6$) may be used. If these supporting electrolytes are used, the produced spherical carbon polymers tend to be precipitated in the electrolytic solution.

If lithium perchloride ($LiClO_4$) or tert-butyl ammonium perchlorate is used, a spherically-shaped carbon polymer can be produced as a thin film on the electrode.

There are occasions wherein the physical properties of the fullerene polymer film produced on the electrode are slightly affected depending on selection of the supporting electrolytes. In general, if large positive ions, such as ammonium salts, are present as counter-ions in a non-aqueous solvent, a fullerene polymer film of lower mechanical strength tends to be deposited on the electrode. On the other hand, if lithium ions are present as counter-ions, there is produced a fullerene polymer film having a larger mechanical strength and a mirror-like surface.

According to the present invention, a mixed solvent composed of a first solvent, capable of dissolving fullerene molecules, and a second solvent, capable of dissolving the supporting electrolyte, is preferably employed. The mixing ratio of the first solvent to the second solvent is preferably 1:10 to 10:1 in volume ratio.

The first solvent is preferably a solvent of lower polarity, having a π-electrolytic system (low polarity solvent). Examples of this sort of the solvent include one or more selected from the group of carbon disulfide ($CS_2$), toluene, benzene and o-dichlorobenzene.

The second solvent is preferably an organic solvent having a high dielectric constant, such as, for example, acetonitrile, dimethyl formamide, dimethyl sulfoxide and dimethyl acetoamide. Of these, acetonitrile is most preferred.

In general, the fullerene molecules are dissolved only in low-polar solvent, such as carbon disulfide, while being extremely low in solubility even in aliphatic solvents, such as n-hexane. This is the most serious problem in electrolytic polymerization of the fullerene molecules.

The reason is that the supporting electrolyte used in electrolytic polymerization is dissolved only in polar solvents, such as water.

In carrying out electrolytic polymerization of the fullerene molecules, it is necessary to use such a solvent as is capable of dissolving both the fullerene molecules and the supporting electrolyte. However, there lacks a single solvent satisfying this condition. At least a mixed solvent made up of individual solvents having the above-mentioned dissolving properties needs to be used.

However, mixed solvents satisfying these conditions may not unconditionally be used. If such mixed solvent simply is used, it is a frequent occurrence that the solvent is insufficient in solubility for the fullerene molecules and/or the supporting electrolyte.

For example, an aqueous solvent, including water, is known to be an optimum solvent for the supporting electrolyte which is a salt. However, it is only insufficiently soluble in the low-polar solvent capable of dissolving fullerene molecules. Therefore, the mixed solvent composed of the two solvents cannot be said to be optimum.

Our researches have revealed that the desirable mixed solvent used in the present invention is made up of the first and second solvents, with the first solvent being a low polar solvent and the second solvent being an organic solvent of high polarity and large dielectric constant.

Among the above-specified second solvents, acetonitrile, a solvent frequently used in preparing radicals of an organic matter in the presence of a supporting electrolyte in an electrolytic cell, is most preferred.

It is however unnecessary to use this acetonitrile as the second solvent since dimethyl formamide or other organic solvents are also desirably used in the present invention.

In applying the potential during electrolytic polymerization, one of the constant current mode and the constant voltage mode may be selectively used. In the former mode, if a high-resistance fullerene polymer film is formed on an electrode, the current value tends to be lowered to raise the voltage. In such situation, it is difficult to maintain a constant reaction because of different states of fullerene polyanions. It is therefore preferred to carry out electrolytic polymerization under the constant voltage mode, even if the current value is undesirably lowered.

If electrolytic polymerization is effected simply under a constant potential condition, it is unnecessary to limit the power source only to the potentiostat, shown in the drawing, such that it suffices to use a simple DC power source comprised of a dry cell and a variable resistor both of which are commercially available.

Using an apparatus shown in FIG. 41, fullerene polymerization was effected in the presence of a variety of supporting electrolytes. Our analyses have indicated that the fullerene molecules, if dissolved, are turned into electrically negative anion radicals. Since these anion radicals are reacted with electrically neutral fullerene molecules or with one another, so that a fullerene polymer film is produced on the electrode. This polymerization process is in need of extremely delicate temperature control and control of the electrolytic potential. If the aforementioned specified mixed solvent is used, it is not so hard to dissolve the fullerene molecules or to donate electrical charges. However, if polymerization has occurred not on the electrode surface but in the mixed solvent, the fullerene polymer is precipitated because of the low solubility. If the amount of the precipitate is excessive, it is not deposited efficiently on the electrode surface to lower the efficiency in thin film formation. If, in general, heating for accelerating the reaction is not performed and lithium is reacted as positive ions of the supporting electrolyte, there is produced a solid lustrous fullerene polymer film.

The above-described electrolytic polymerization method for fullerene has inherently developed by the present inventor in order to produce a fullerene polymer film composed only of [2+2] cycloaddition of C60 fullerene. Such polymer cannot be produced by the gas phase reaction, such as other plasma polymerization method. The present inventor has conducted scrutiny, based on semi-empirical level molecular orbit calculations, as to whether or not the aforementioned electrolytic polymerization reaction is possible thermodynamically. If the counter-ion is lithium, the results of calculations of MNDO approximations, in which atomicparameters of lithium ions are set, predicted the following values of the generated heat for $C_{60}$, $C_{60}$–Li, $C_{120}$–Li and $C_{120}$–L2.

$C_{60}$–: 869.4182 kcal/mol $C_{60}$–Li: 768.001 kcal/mol $C_{120}$–Li: 1525.716 kcal/mol $C_{120}$–Li2: 1479.057 kcal/mol It is noted that $C_{120}$ is a dimer of $C_{60}$ resulting from cyclo-addition, shown in FIG. 8, and that lithium ion has the most stable structure in which the lithium ion is sandwiched between two fullerene molecules of the cross-linked structure. The calculations of the system including the lithium compound were executed in their entirety by a non-limiting Hartrey-Fock method. From these results of calculations, the following conclusions are derived:

(1) $C_{60}$ is appreciably stabilized by lithium coordination. This is ascribable to the fact that the lowest void orbit of $C_{60}$ is at an appreciably lower position than free electrons.

(2) the heat of reaction of $C_{60}+C_{60}$–Li=$C_{120}$–Li is predicted to be –106.703 kcal/mol to promote stabilization.

(3) The reaction heat of $2C_{60}$–Li=$C_{120}$–Li is predicted to be –46.945 kcal/mol, this reaction being similarly exothermic. These results of calculations represent the energy difference between the initial state and the terminal state in vacuum and are not intended to find out the potential barrier to the reaction. However, the present results of calculations support the fact that, if there is only negligible entropy contribution, such as steric hindrance, during the reaction, there is obtained good correlation with the free energy of the system, such that the aforementioned reaction can take place easily.

On the surface of the fullerene polymer film, obtained by the above-mentioned different polymerization methods, there are partially left fullerene molecular structures, so that numerous bonds of the double bond type exist. Therefore, surface modification (surface processing) in a variety of ways is possible.

For example, the fullerene polymer film can be surface-modified, using techniques such as microwave induction, DC plasma or AC plasma, in an atmosphere of a hydrocarbon gas, such as acetylene, methane, ethane, propane, toluene, benzene, acetone, acetonitrile, ethanol or methanol, or a gas, such as oxygen, hydrogen, chlorine or fluorine. Alternatively, the fullerene polymer film may be surface-modified in a solvent using metal complex compounds or organic radicals.

This surface modification is effective to modify the fullerene polymer film or to afford specificity thereto depending on the objective or application.

Meanwhile, the fullerene polymer film, in particular the fullerene polymer film obtained by the microwave polymerization method, suffers the problem of dangling spin. If, for example, microwave polymerization is carried out at ambient temperature with a power of from 100 W to hundreds of W, using $C_{60}$ and/or $C_{70}$ as a starting material, there is produced a fullerene polymer film containing approximately $10^{18}$ spins/g of dangling spin.

This dangling spin significantly affects the electrically conductivity of the fullerene polymer film, band structure or chronological stability of the physical properties.

This dangling spin is possibly produced by the fact that no ideal cross-linked structure has not been formed. The amount of the dangling spin can be reduced to some extent by adjusting the substrate temperature for depositing the fullerene polymer film or by exposing the film to an atmosphere such as a hydrogen plasma. The process of decreasing the amount of the dangling spins may be confirmed from the difference in the absorption intensity by the electron spin resonance method.

By the above method, a layered assembly of a substrate- a carbonaceous thin film- a fullerene thin film, essential to the present invention, is prepared. According to the present invention, this layered assembly can be further processed depending on the objective or the intended usage. For example, a light transmitting electrode may be deposited on the fullerene thin film for usage as a solar cell, whilst a comb-shaped electrode may be deposited for usage as a sensor.

The present invention will be explained more specifically, with reference to the drawings. However, the present invention is not limited to these specified Examples.

EXAMPLE 1

Figure 42:
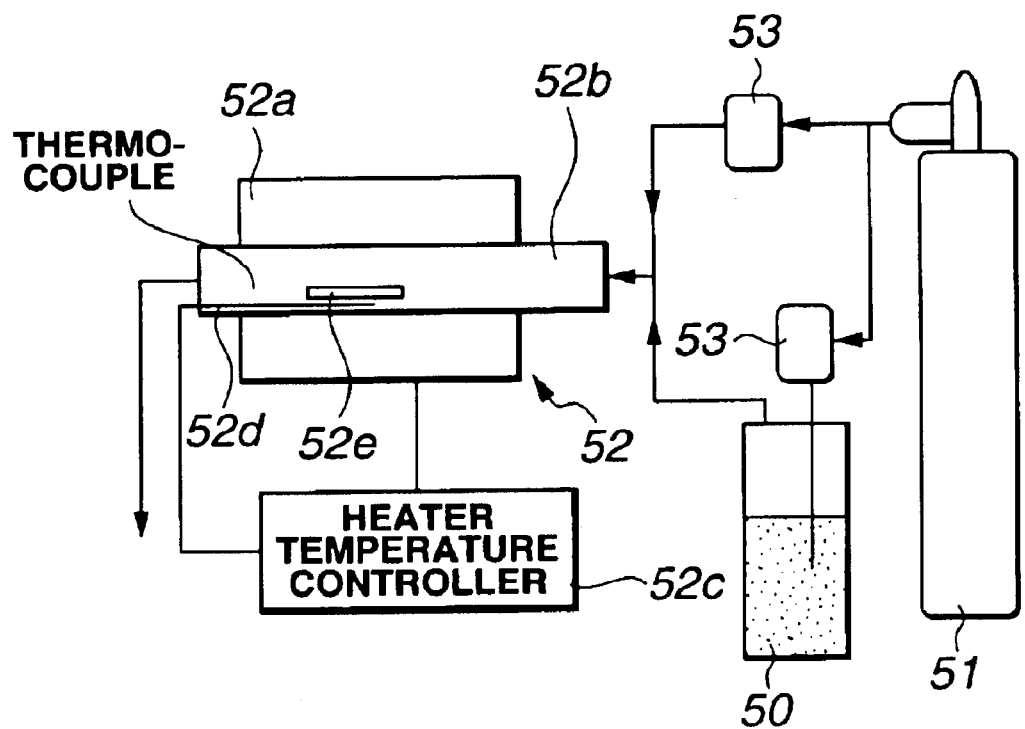
FIG. 42 is a schematic view showing a device for forming a carbonaceous thin film used in an embodiment of the present invention.

For forming a carbonaceous thin film, a film-forming device, shown in FIG. 42, was prepared. This film-forming device is made up of a simple type organic solvent gas bubbler 50, a gas bomb 51 for supplying the carrier gas thereto and a simple type electrical furnace 52 for thermally decomposing the organic solvent gas. In a flow duct between the gas bomb 51 and an organic solvent gas bubbler 50 and a flow duct between the gas bomb 51 and the electrical furnace 52, there are provided flow adjustment needle valves 53.

The electrical furnace 52 has a core 30 mm in diameter and a quartz tube 52b is inserted into an electrical heater 52a. Within the quartz tube 52b are set a thermocouple 52d for connecting to an external beater temperature controller 52c and a quartz (glass) substrate 52e mounted directly thereabove to monitor the film-forming temperature of the quartz substrate 50e accurately. The temperature control of a quartz substrate 50e is performed in cooperation with a PID control relay circuit. The film-forming device, constructed as described above, is able to form a carbonaceous thin film within a temperature error not larger than 1°.

The temperature in the electrical furnace 52 was set to 800° C. and, after inserting the quartz substrate 50e into the quartz tube 52b, an argon gas was introduced from the gas bomb 51 into the quartz tube 52b to fill the tube with the argon gas. The argon gas was of the purity of 99.999%.

When the interior of the quartz tube 52b is completely the argon gas atmosphere and the temperature reaches 800° C., a toluene gas started to be introduced into the interior of the quartz tube 52b through the organic solvent gas bubbler 50. The argon gas introduced into the organic solvent gas bubbler 50 was set to a flow rate of 50 ml/min.

After toluene bubbling for 30 minutes, only the argon gas was again introduced into the quartz tube 52b to gradually cool the electrical furnace 52. After confirming that the electrical furnace 52 was cooled to substantially the room temperature, the quartz substrate 50e was taken out of the quartz tube 52b. On the surface of the quartz substrate 50e was formed a carbonaceous thin film presenting a mirror surface.

EXAMPLE 2

Film forming as in Example 1 was carried out on a silicon substrate. Two silicon substrates, one of which has been ground, with the other substrate not being ground. After cooling the electrical furnace, the two silicon substrates were taken out. It was found that, on the ground silicon substrate, a carbonaceous thin film presenting a mirror surface comparable to that of silicon was formed, with the color of the carbonaceous thin film being similar to the silicon substrate, whereas, on the unground silicon substrate, a black carbonaceous thin film, which was extremely brittle, was formed.

It is seen from this that adhesion or film-forming properties of the carbonaceous thin film depend appreciably on the roughness of the substrate surface. The hardness of the carbonaceous thin films, prepared in Examples 1 and 2, was measured, with the tested film of Example 2 being the carbonaceous thin film on the ground substrate. It was found that the carbonaceous thin film on the substrate in each of Examples 1 and 2 was of a Vickers hardness of 520 to 540, thus indicating that the carbonaceous thin film formed was markedly strong carbonaceous thin film, although it was not no tough as the silicon crystal.

EXAMPLE 3

Figure 43:
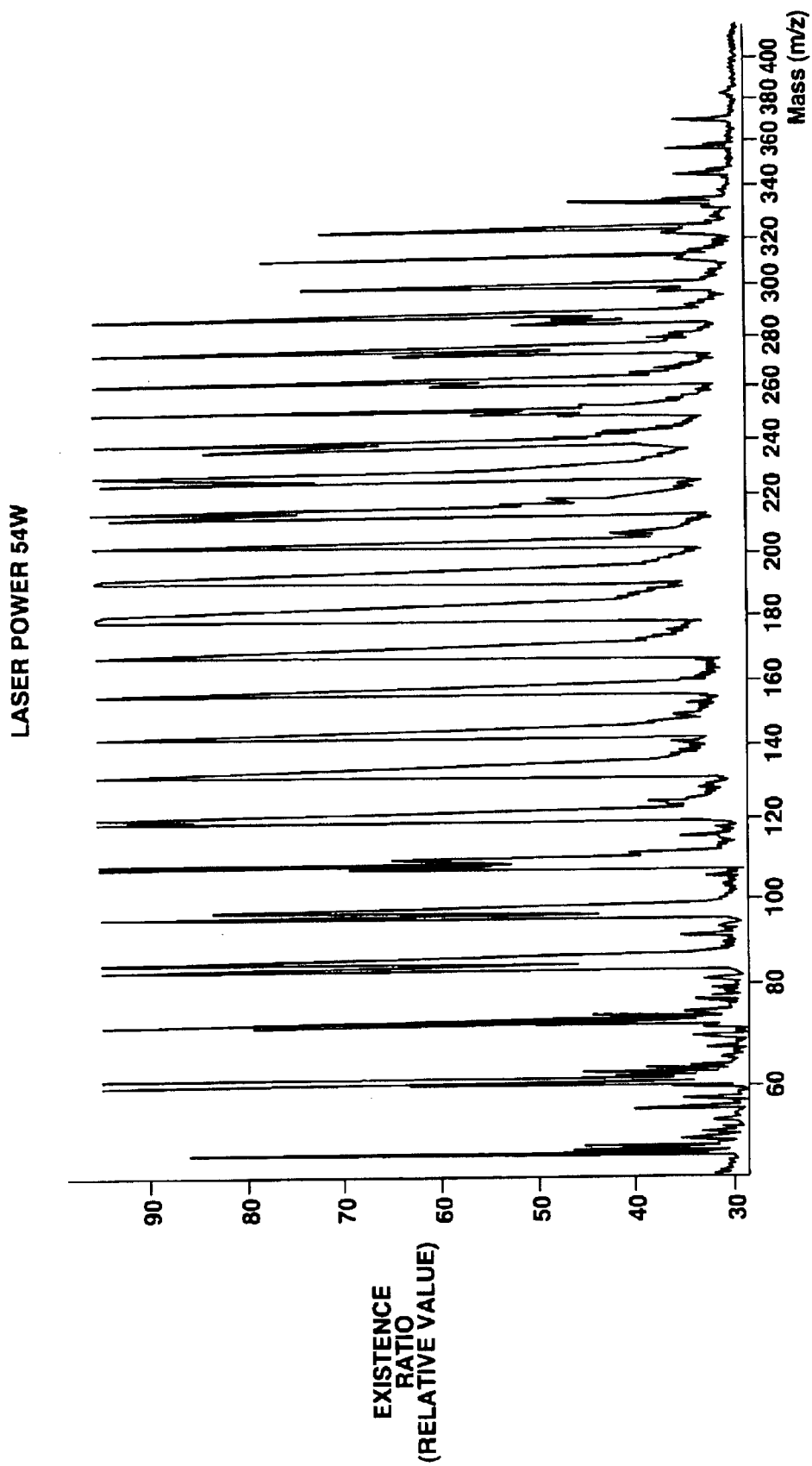
FIG. 43 shows a graph showing a spectrum of an example of a carbonaceous thin film.
Figure 44:
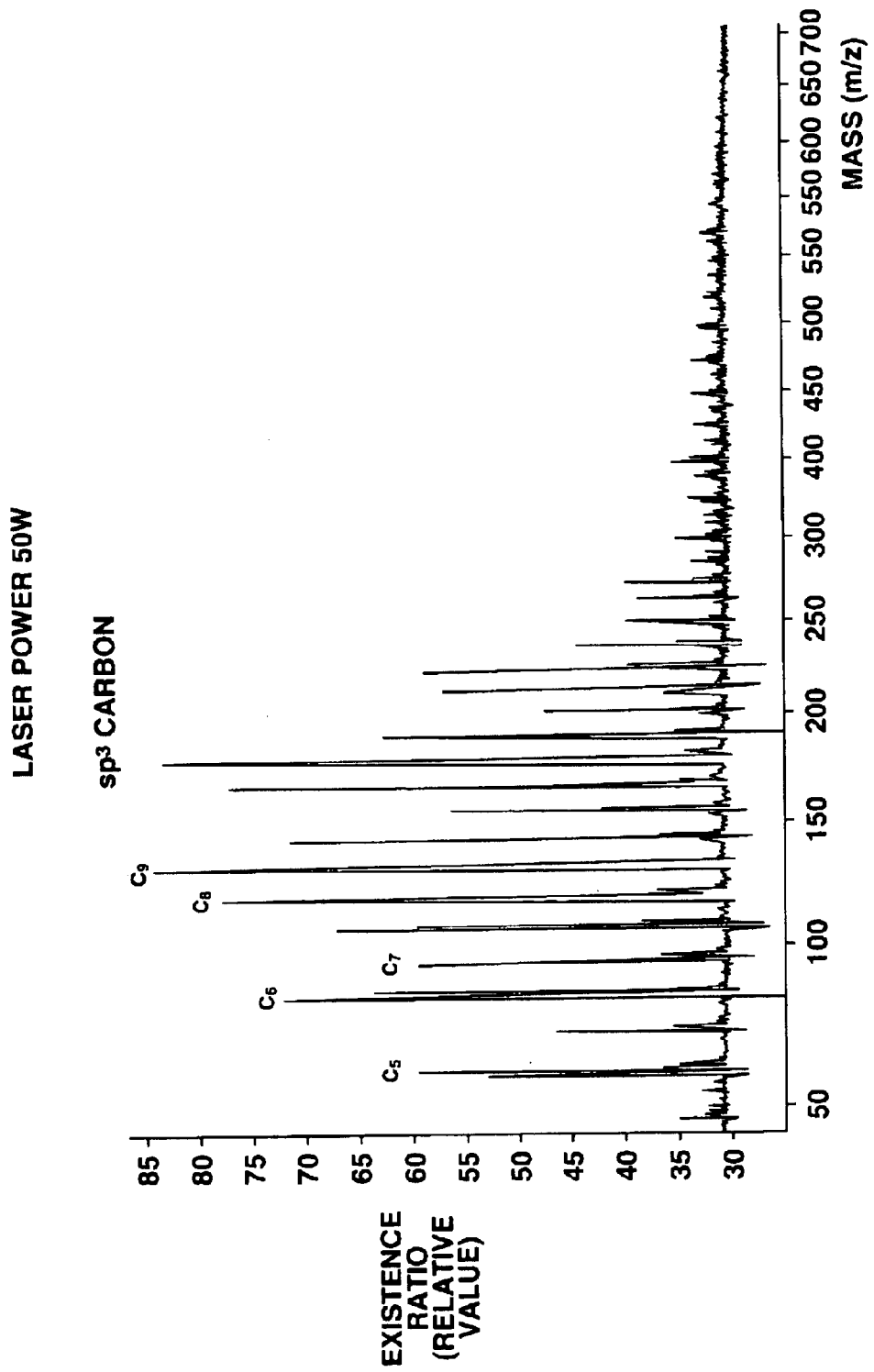
FIG. 44 is a graph showing the spectrum of a carbonaceous thin film when the laser power is changed.
Figure 45:
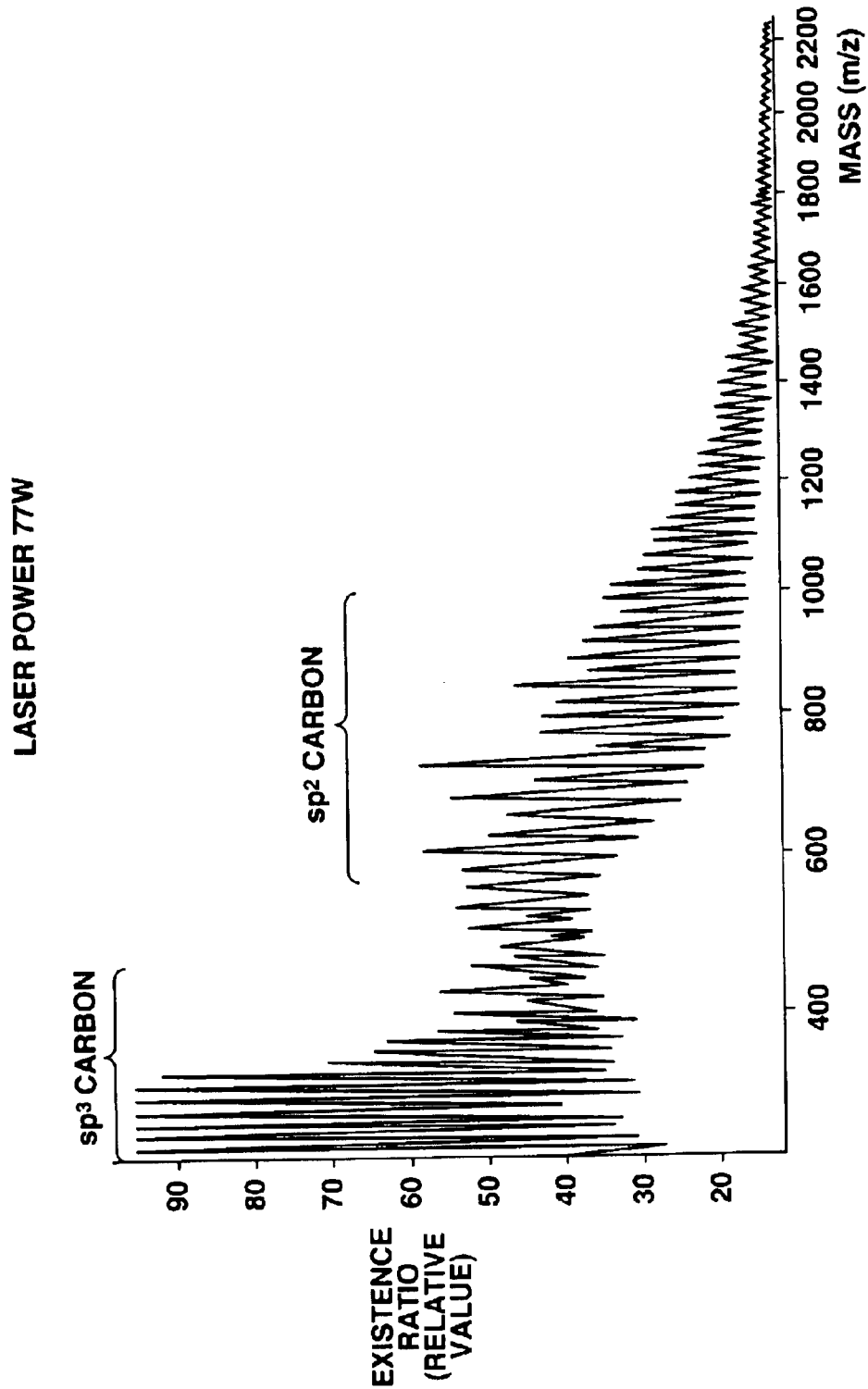
FIG. 45 is a graph showing the spectrum of a carbonaceous thin film when the laser power is further changed.

For clarifying the structure of the carbonaceous thin film formed on the ground silicon substrate, mass spectroscopic analysis was carried out in accordance with the Laser-Desorption-Ionization Time-of-Flight method. For measurement, a Thermoquest Vision 2000 TOF-MS monitor was used. The laser used for ablation was a nitrogen laser. Before measurement, a silicon substrate was cut to a size of 5 mm and set on a target of the TOF-MS monitor. For measurement, a pulse laser was directly illuminated on the surface of the carbonaceous thin film for excitation, desorption and ionization. Positive ions were used for measurement. FIGS. 43 to 45 show the spectrum with increased laser strength. However, the laser power in FIG. 44 is not so strong as to vary the election valence state of carbon. As may be seen from FIG. 44, a cluster up to 20 carbon atoms is ascribable to a continuous peak of the difference corresponding to a carbon atom and mainly to a component in the valency state of sp3. In FIG. 45, a cluster up to approximately 30 carbon atoms is mainly ascribable to a component in the valency state of sp3. If the laser power is increased further, a continuous peak with a difference of C2 from 50 to approximately 150 carbon atoms is observed. This is the peak proper to the carbon having the graphitic structure of sp2. It is seen from these that the carbonaceous thin film has a structure of an extremely small graphite in the random sp3carbon.

EXAMPLE 4

Figure 46:
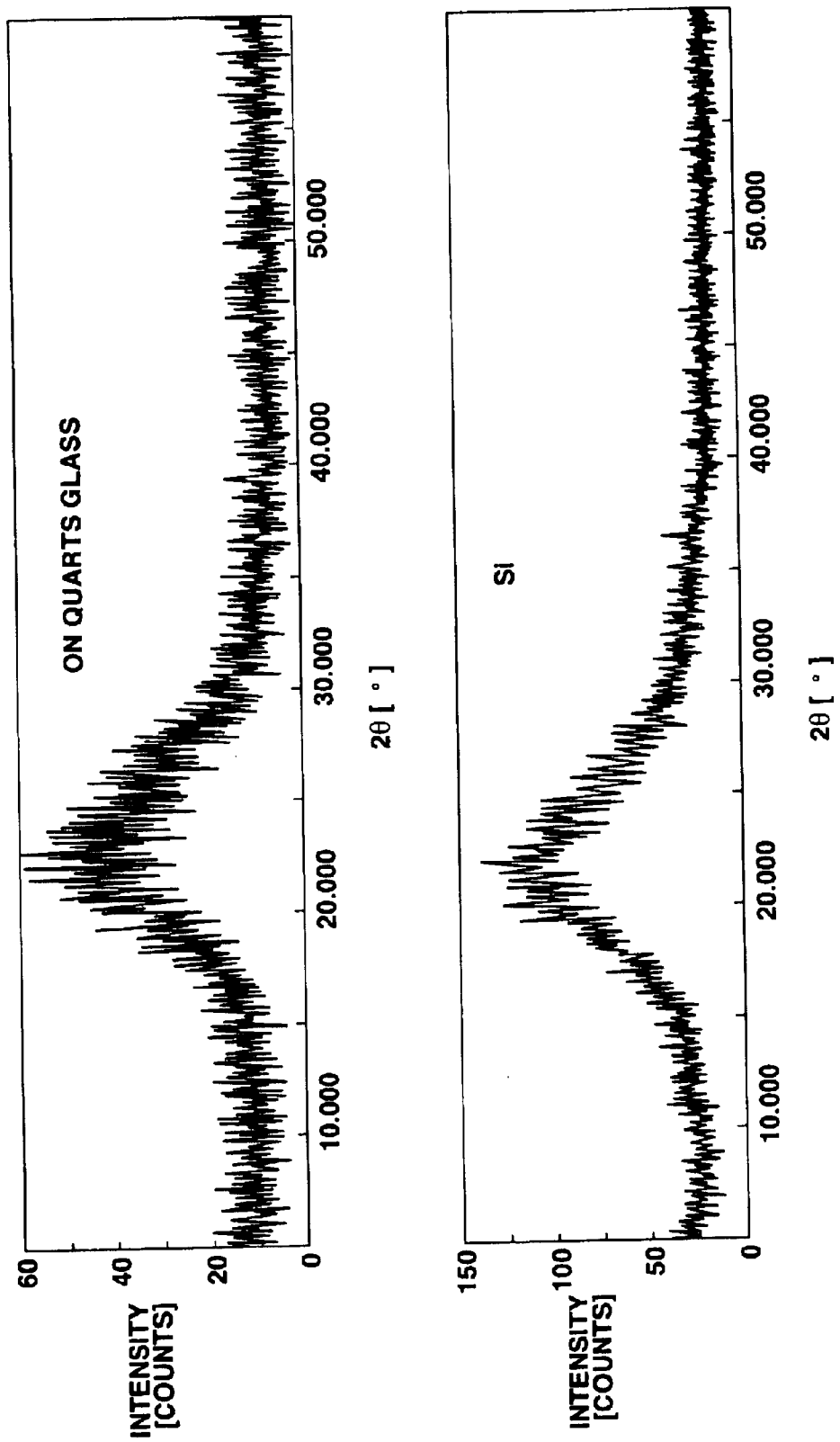
FIG. 46 is an X-ray diffraction diagram of a carbonaceous thin film.

For further confirming the information obtained in Example 3, an X-ray diffraction of the carbonaceous thin film was measured. Meanwhile, in X-ray and Raman measurement, as later explained, a carbonaceous thin film of a thicker thickness was formed by the same process. RIGAKU RAD III was used, with the line source being Cu-Kα. FIG. 46 shows the diffraction diagram. The diffraction pattern in FIG. 46 is that of a carbonaceous thin film formed on the quartz glass surface. A sole broad diffraction line was produced and was ascribed to (002) diffraction line of graphite. The glass usually showed broad absorption line in the vicinity of this angle. So, the same measurement was conducted for the carbonaceous thin film deposited on a silicon substrate. The results are shown in a lower part of FIG. 46, from which it is seen that a pattern substantially the same as that depicted above was obtained. It may be seen from this that the produced carbonaceous thin film contained an extremely small graphite structure.

Figure 47:
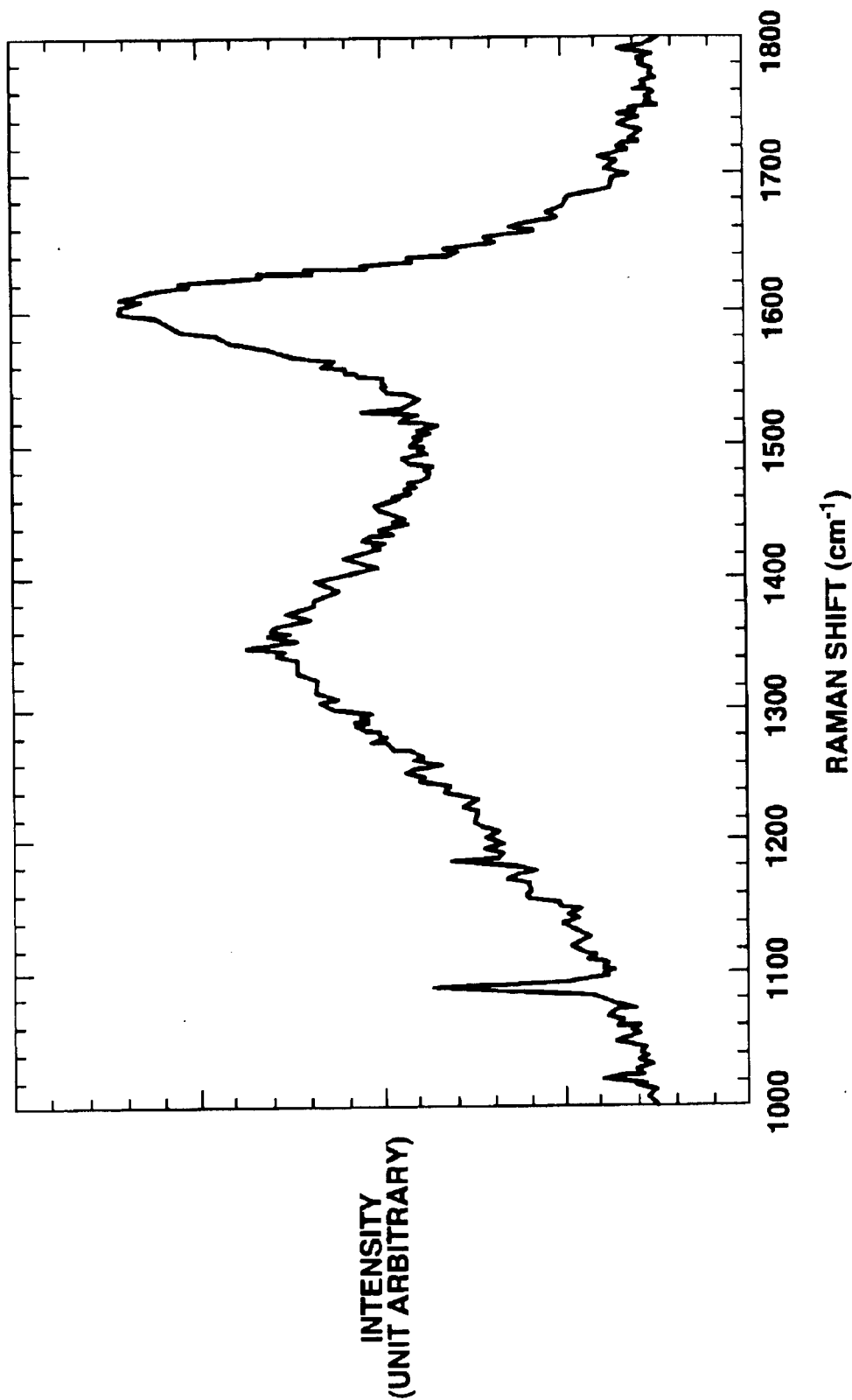
FIG. 47 shows Raman measurements for a carbonaceous thin film.

For further clarifying the structure of the carbonaceous thin film, Raman measurement was conducted. The results are shown in FIG. 47. Obviously, a disordered band in the vicinity of 1350 $cm^{-1}$ and a graphitic band in the vicinity of 1600 $cm^{-1}$ were observed, with the spectrum reflecting the features of the amorphous carbon fairly well.

EXAMPLE 5

As set forth above, the carbonaceous thin film, essential to the present invention, is formed in strong dependency upon the substrate surface roughness. For checking the surface smoothness of the carbonaceous thin film itself, formed on the smooth surface, AFM measurement was carried out. Using Nanoscope III, measurement of the tapping mode was carried out.

Figure 48:
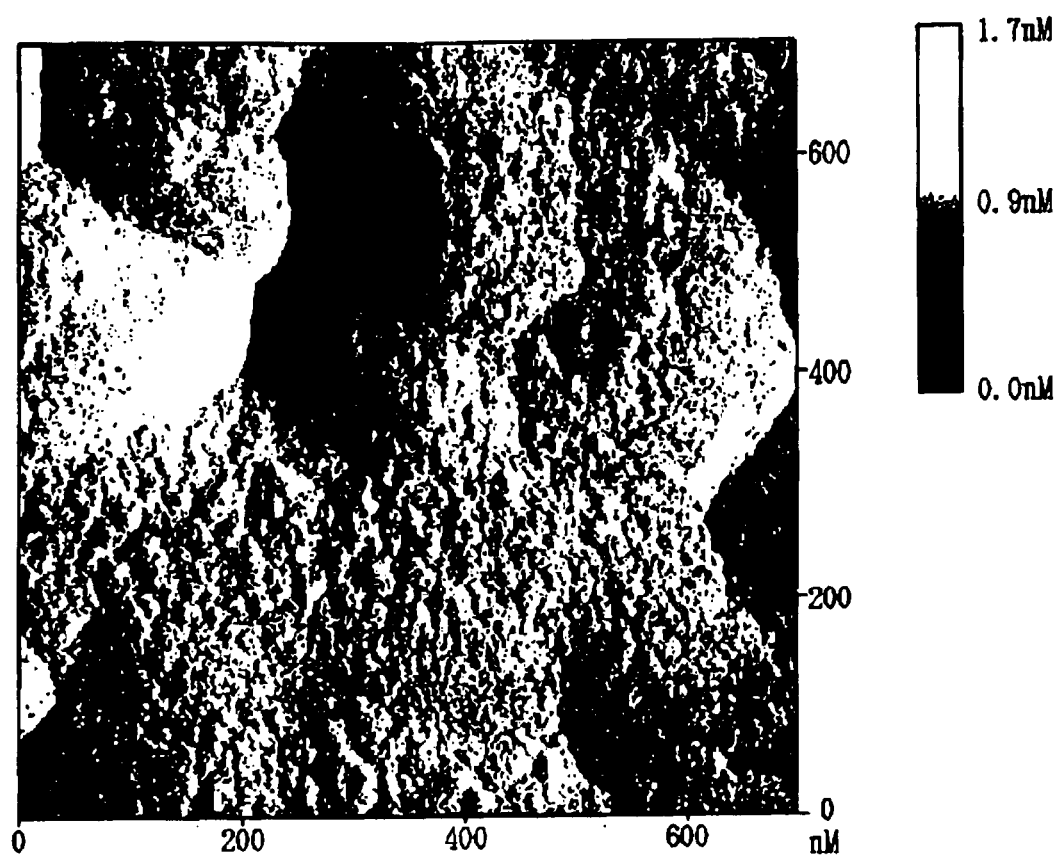
FIG. 48 shows an image of a tapping mode AFM of a carbonaceous thin film.
Figure 49:
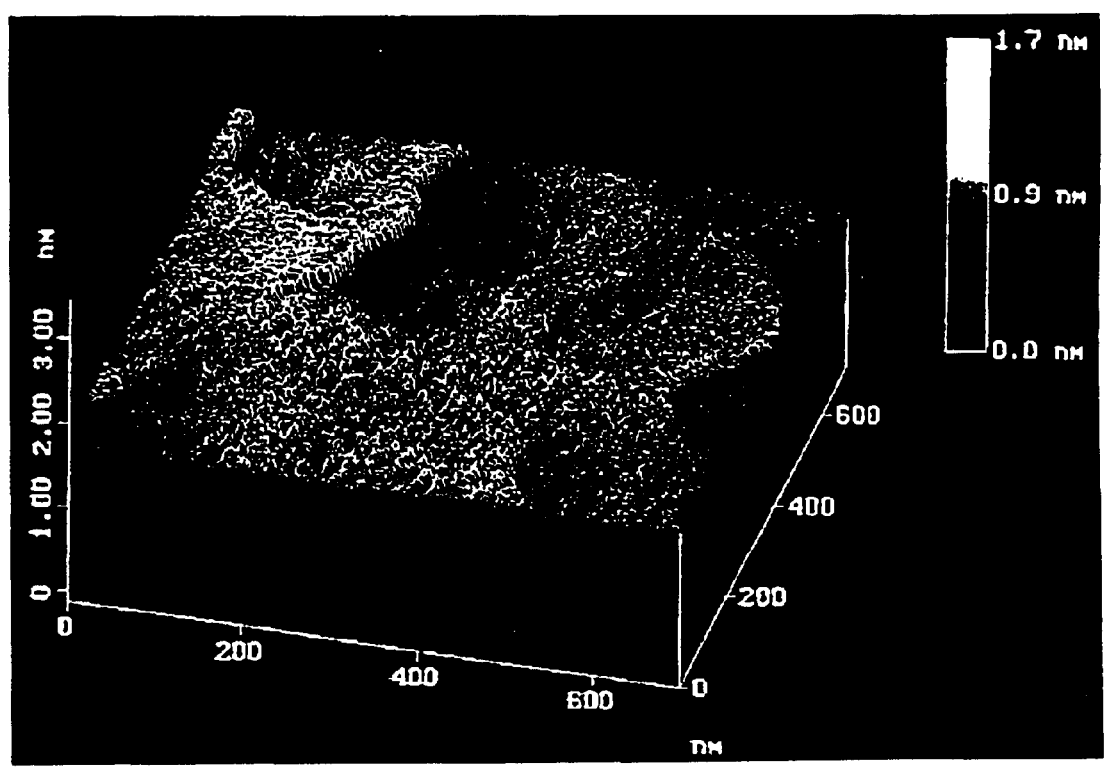
FIG. 49 shows surface roughness of the image shown in FIG. 46.

FIG. 48 shows an image of the tapping mode AFM, while FIG. 49 shows an image indicating the surface roughness of the image of FIG. 48. It is seen from this image that the substrate surface is extremely smooth, with its roughness being on the order of 1 nm at the maximum.

EXAMPLE 6

Figure 50:
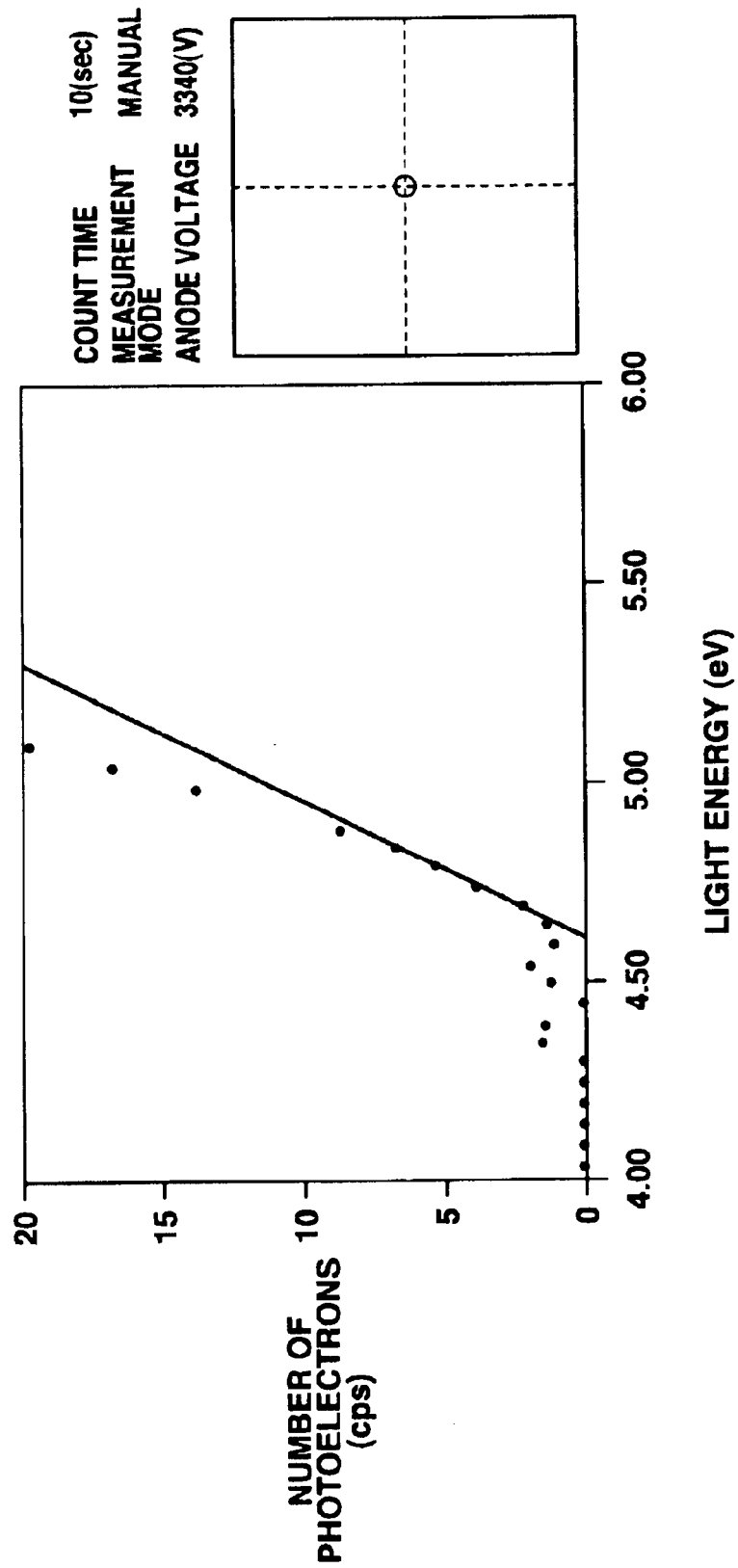
FIG. 50 shows a photoelectron emission spectrum of a carbonaceous thin film.

For clarifying electronic characteristics of the carbonaceous thin film, measurement was made of the photoelectron emitting spectrum to evaluate the valance band edge level. FIG. 50 shows the produced spectrum. It is seen from this measurement that the edge level of the carbonaceous thin film was 4.6 eV below the vacuum level. If this thin film has metallic electrical conductivity similar to that of graphite, the above value is the Fermi level.

EXAMPLE 7

Figure 51:
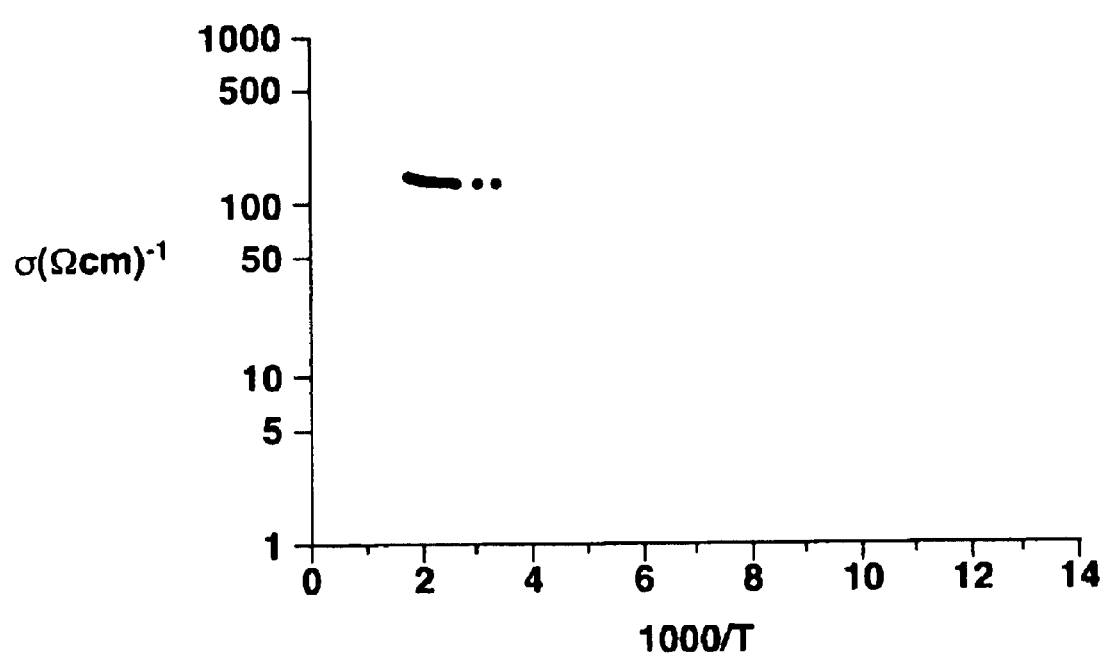
FIG. 51 shows measured results of electrical conductivity.

For clarifying that the carbonaceous thin film shows metallic electrical conductivity or behaves as a semiconductor, the electrical conductivity was measured in a temperature range from the liquid nitrogen temperature to ambient temperature. The results are shown in FIG. 51, from which it is seen that the electrical conductivity of the carbonaceous thin film showed extremely small temperature dependency. Moreover, since the electrical conductivity is slightly improved in the high temperature range as contrasted to the low temperature range, the electrical conductivity was not that of metal. Moreover, as may be seen from the electrical conductivity plotted on the ordinate, this carbonaceous thin film exhibited high electrical conductivity.

EXAMPLE 8

Figure 52:
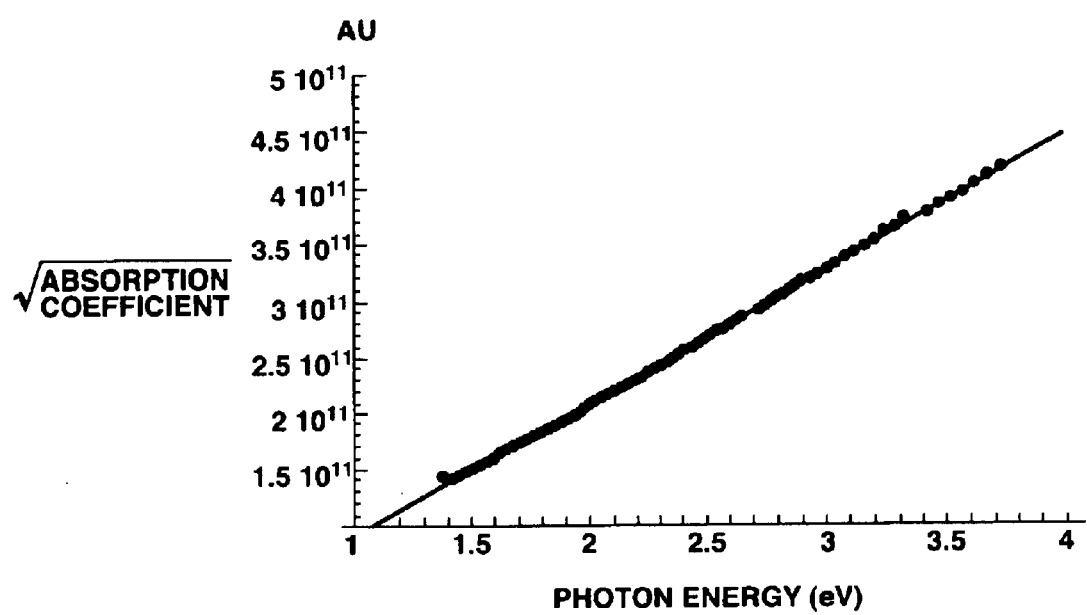
FIG. 52 shows the relationship between the absorption coefficients of the carbonaceous thin film and the electrical conductivity.

The relationship between the absorption coefficients and the electrical conductivity of the carbonaceous thin film formed on a quartz substrate is shown in FIG. 52. Although measurement of the absorption spectrum could not be made accurately up to the end of the optical band gap, the fact that the square value of the absorption coefficients and the photon energy on the ordinate are linear represents the features of the skin depth absorption satisfactorily.

EXAMPLE 9

Figure 53:
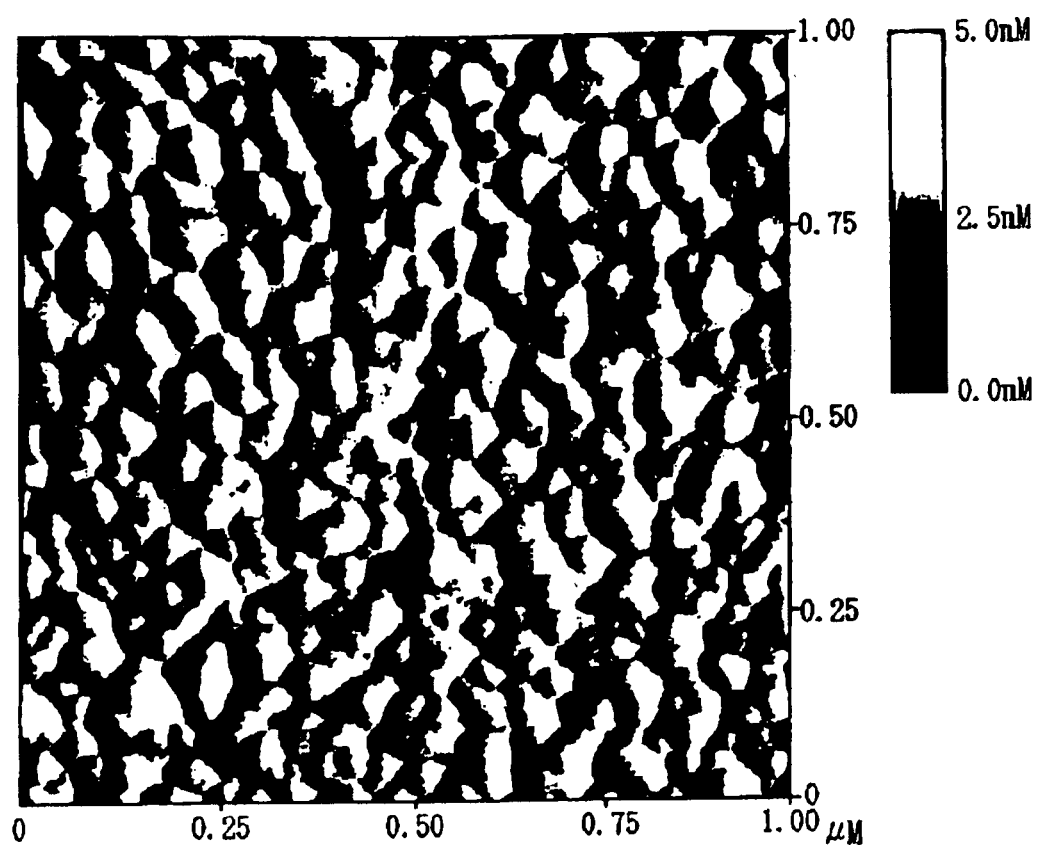
FIG. 53 shows a tapping mode AFM image of a $C_{60}$ plasma polymer film.

Two composite substrates were obtained by forming a platinum electrode by sputtering on a quartz substrate and a carbonaceous thin film was deposited thereon as in Example 1. A composite substrate, on which the carbonaceous thin film was deposited, was set in a plasma chamber shown in FIG. 36 and, as $C_{60}$ charged in the molybdenum boat was vaporized by resistance heating, a fullerene polymer film was formed to a thickness of 1000 Å. FIG. 53 shows a tapping mode AFM image of the $C_{60}$ plasma polymer film on the uppermost surface. The surface roughness of this $C_{60}$ polymer film was approximately less than 2 nm.

EXAMPLE 10

A carbonaceous thin film was formed on a composite substrate as in Example 9. On this carbonaceous thin film was then formed a fullerene polymer film by electrolytic polymerization by the following method.

First, a platinum electrode was set as an electrode in the electrolytic polymerization device shown in FIG. 41, by way of a preliminary test. Using $LiClO_4$ as a supporting electrolyte and a mixed solvent of toluene and acetonitrile with a toluene to acetonitrile ratio of 1:4 as a solvent, fullerene molecules ($C_{60}$) were dissolved in this solvent.

Using this solution, the reducing potential was measured. A redox potential was obtained so that the potential for e.g., the first ionization and for second ionization could be determined. Then, electrolysis was carried out in the low pressure mode at the first ionization potential, as a result of which a fullerene polymer film could be obtained on a platinum electrode.

FTIR (Fourier transform IR spectrum) and nuclear resonance spectrum were measured of the fullerene polymer film. It was found that $C_{60}$ molecules were not present in their inherent structure in the fullerene polymer film.

The composite substrate having the above-mentioned carbonaceous thin film was set in the electrolytic cell of the electrolytic polymerization device. Using a mixed solvent of toluene and acetonitrile with a toluene to acetonitrile ratio of 1:1 as a solvent, a minor amount of $C_{60}$ molecules wee dissolved on the mixed solvent to carry out the electrolytic polymerization. As a result, a fullerene polymer film of a brownish color was formed on the carbonaceous thin film of the composite substrate. AFM measurement was difficult with the fullerene polymer film which was flaccid.

EXAMPLE 11

A composite substrate (by platinum sputtering) fitted with a carbonaceous thin film was prepared in the same procedure as in Example 1. This composite substrate was set on a vapor deposition material and $C_{60}$ molecules were vapor-deposited under a pressure of $10^{-8}$ Torr. The fullerene vapor-deposited film, formed on the carbonaceous thin film, was found to have a roughness extremely similar to that of the plasma $C_{60}$ polymer film shown in FIG. 53.

EXAMPLE 12

A gold electrode was formed by sputtering on a quarts substrate, on which a $C_{60}$ plasma polymer film, a $C_{60}$ electrolyticpolymer film and $C_{60}$ vapor-deposited film were formed in the same way as in Examples 9 to 11 to measure the electron emission spectrum of these thin films.

Figure 54:
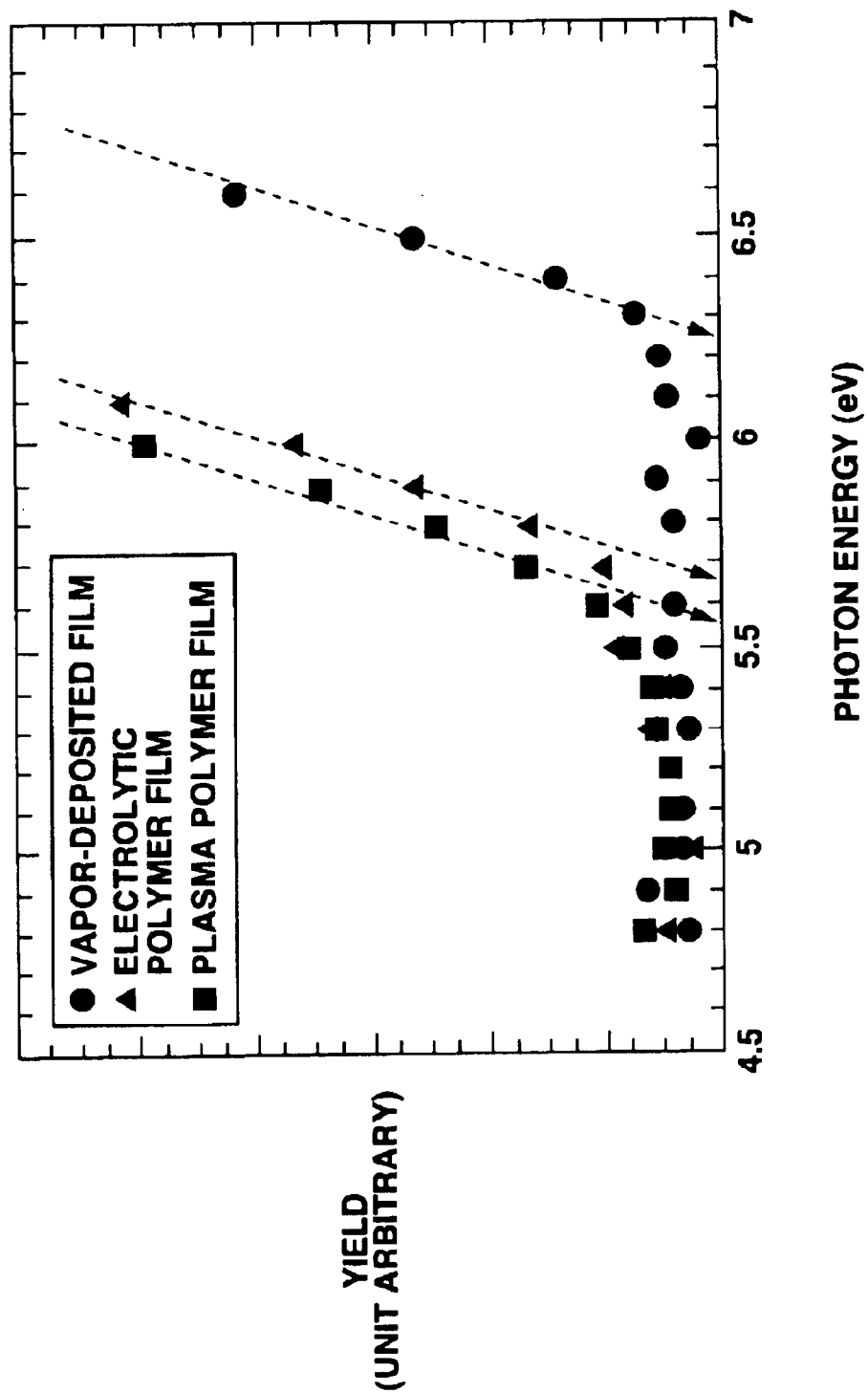
FIG. 54 shows the photoelectron emission spectrum of a $C_{60}$ plasma polymer film, a $C_{60}$ electrolytic polymer film and a $C_{60}$ vapor-deposited film.
Figure 55:
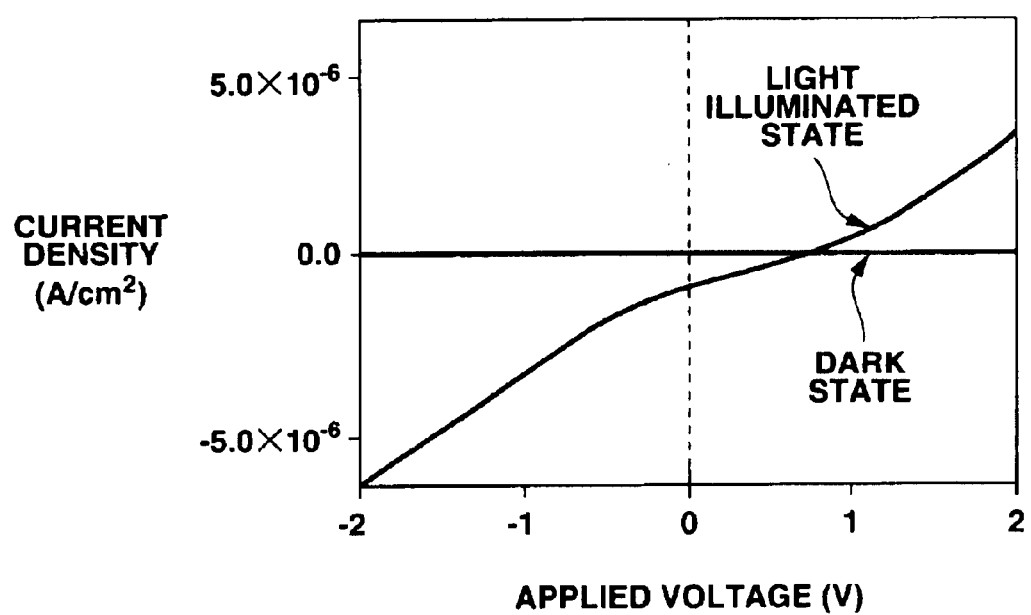
FIG. 55 is an I–V graph on light illumination on a carbonaceous complex structure according to the present invention.

The results are shown in FIG. 54, from which it is seen that the valence band edge levels of these fullerene thin film could be evaluated to be 5.57, 5.68 and 6.25 eV. Since the optical band gaps of these thin films were on the order of 1.5, 1.4 and 1.6 eV, the carbon bond prepared in Examples 9, 10 and 11 was found to exhibit the difference on the order of 1 eV at the minimum on the valence band edge surface level.

EXAMPLE 13

A gold electrode was formed on a quartz substrate by sputtering and a carbonaceous thin film was further deposited thereon as in Example 1. The Fermi level of this carbonaceous thin film, as measured by a contact potential method, was evaluated to be 4.6 eV.

This measurement result substantially coincides with the valence band edge level by the photoelectron emission method shown in FIG. 50. The band itself of this carbonaceous thin film is thought to be extremely small, as may be evidenced from the evaluation of the electrical conductivity. However, the features peculiar to the p-type semiconductor are evidently noticed.

On the other hand, the fullerene polymer film has electron accepting properties, as may be evidenced from the ultra-aromaticity proper to the three-dimensionally closed π-electron system.

The bond structure of the carbonaceous thin film and the fullerene thin film, prepared in Examples 9 to 11, is a valuable structure for separation of carriers evolved on light illumination, such that, if it is implemented in a glass substrate—ITO electrode-carbonaceous thin film-fullerene thin film-aluminum electrode, it is particularly suited for a solar cell. This structure has moderate performance, as may be seen from its I–V characteristics on light illumination.

What is at issue in this case is that the electrical conductivity of the light transmitting electrode is lost when forming the carbonaceous thin film on the light transmitting electrode, such as ITO.

For evading this problem, a complex structure of a glass substrate-thin gold electrode-carbonaceous thin film-fullerene polymer film-aluminum electrode is preferred. This complex structure operates as a solar cell, as evidenced from I–V characteristics before and after light illumination. However, in order to realize a complex structure optimum for this application, it is necessary to scrutinize into variable factors, such as band gap of the carbonaceous thin film, thickness of the fullerene thin film or Fermi surface level of the electrode material.

EXAMPLE 14

A gold comb electrode was further formed on a complex structure of a substrate-carbonaceous thin film-fullerene thin film, prepared as in Example 1, to check into the function as a gas sensor.

As result, electrical conductivity was noticed to be changed clearly, e.g., increased, against water, acetaldehyde, formaldehyde, ammonia or formic acid. This phenomenon was similarly noticed when the comb electrode was directly mounted on the carbonaceous thin film presenting a smooth surface, such that a clear distinction was observed from a case when a structure comprising only an electrode without provision of the carbonaceous thin film was used as a reference.

A comb electrode was mounted on a carbonaceous thin film prepared in Example 1, and the resulting assembly was heated at 300° C. for three hours under a vacuum of 10–8

Torr and subsequently cooled to check into changes in electrical conductivity under an argon atmosphere of $10^{-8}$ Torr to $10^{-1}$ Torr.

As a result, the electrical conductivity in this pressure range was recognized to be changed by more than five digits of magnitude, thus testifying to the function as a pressure sensor. Also, a plasma-induced fullerene polymer film was deposited on the carbonaceous thin film to a thickness of 120 Å. The structure in this case is as shown in FIG. 1C.

Even in this structure, good changes in electrical conductivity against the pressure could be noticed. However, a marked difference from the structure devoid of the fullerene polymer film as described above is that the present structure has excellent reproducibility in electrical conductivity with respect to the cycle of pressure reduction and pressure application. This may indicate that the fullerene polymer film operates as passive layer.

A carbonaceous thin film then was formed on a quartz substrate, as in Example 1. In this case, three carbonaceous thin films were formed, with the substrate temperature being changed to 750° C., 800° C. and to 850° C., and the electrical conductivity of the respective sets was evaluated.

As a result, the electrical conductivity was improved by a factor of three for each of these sets. Specifically, the degree of graphization differs with rise in temperature, such that graphite contribution is seen to be larger at higher temperature, as a generally well-known phenomenon.

EXAMPLE 15

Figure 56:
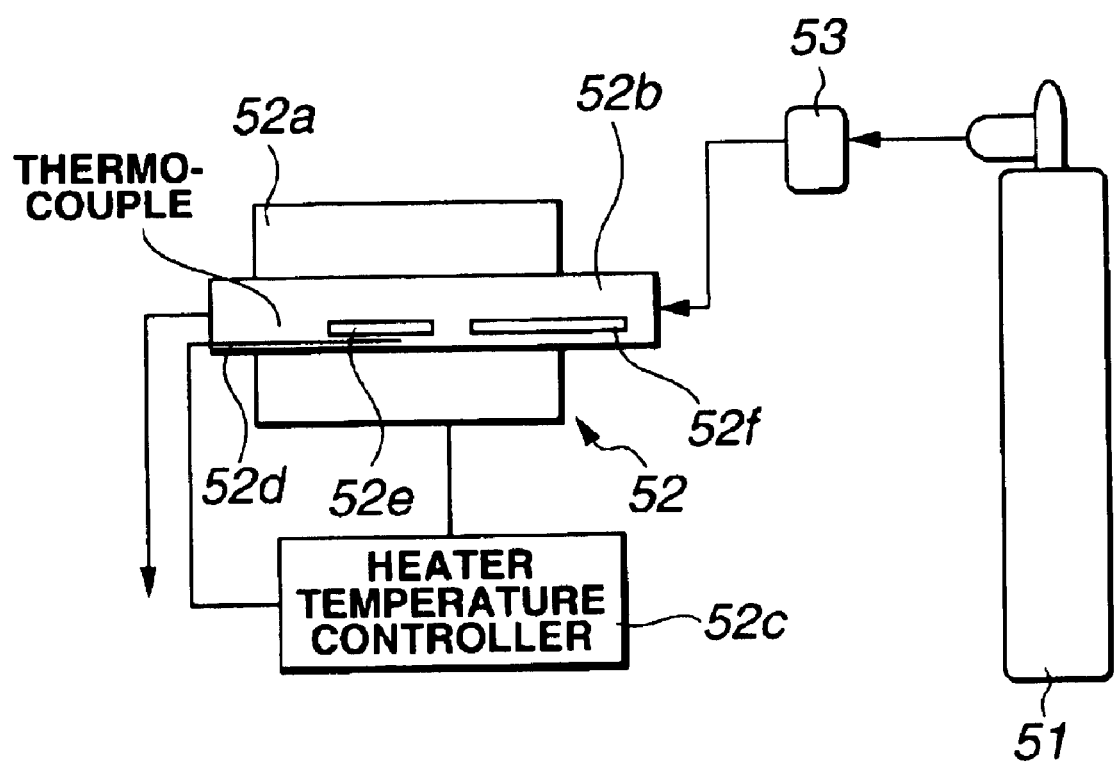
FIG. 56 is a schematic view showing a device for forming a $C_{60}$ vapor-deposited film used in another embodiment of the present invention.
Figure 57:
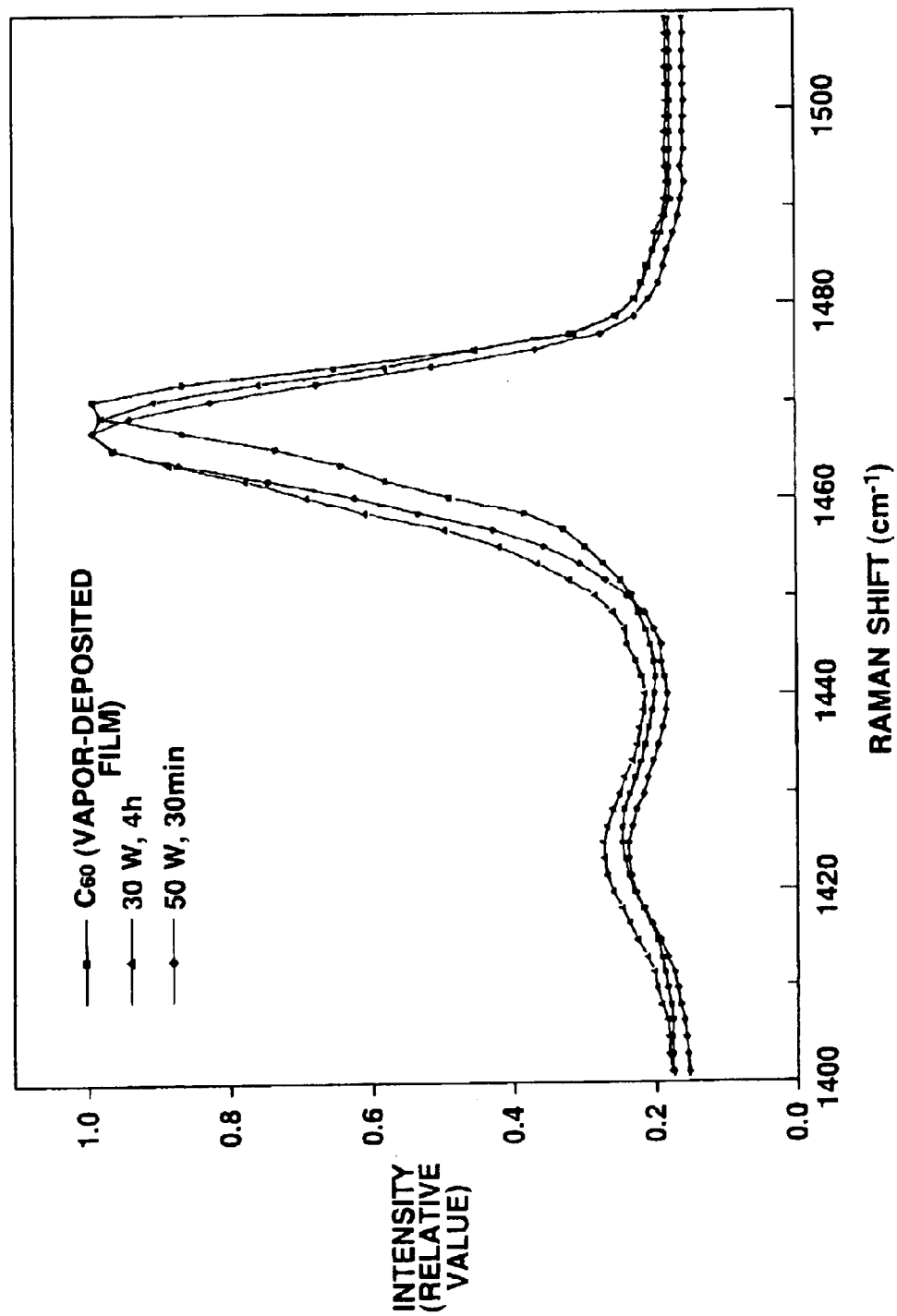
FIG. 57 is a Raman spectrum diagram of a fullerene polymer film according to the present invention.

Using a film-forming device, shown in FIG. 56, a carbonaceous thin film was formed on a quartz substrate, by the following procedure:

Specifically, the organic solvent gas bubbler 50 was omitted from the device of FIG. 42, and a ceramic boat 52*f* for accommodating fullerene molecules was set in the quartz tube 52*b*. Within this boat were charged fullerene molecules ($C_{60}$) purified on sublimation. As this ceramic boat 52*f* was approached to the furnace core, an argon gas was supplied from the gas bomb 51 into the quartz tube 52*b*.

In general, fullerene is said to be stable in an argon gas atmosphere. On continuous operation at 800° C. for four hours, a carbonaceous thin film as that obtained in Example 1 was formed on the quartz substrate 50*e*. The Raman spectrum, TOF-MS and the electrical conductivity were measured of the carbonaceous thin film and results similar to those of Example 1 were obtained.

After cooling the electrical furnace 52, samples left in the g52*f* were checked. It was found that fullerene was decomposed and a small graphitic structure was generated.

Another carbonaceous thin film was prepared by thermally decomposing ethanol in place of toluene of Example 1. The carbonaceous thin film produced was in no way different from that obtained in Example 1. This indicates that film forming is not dependent on the sort of the carbon material (organic compound).

EXAMPLE 16

A fullerene vapor-deposited film was formed to a film thickness of 1000 Å on a quartz substrate. The specific gravity of the film was set to 1.6 on a film thickness monitor. This thin film was set in a quartz tube of the device shown in FIG. 42. After an argon gas was charged into the tube, the latter was installed in an electrical furnace and the temperature was raised to 800° C. The electrical furnace was maintained at 800° C. fir three hours and then was allowed to cool.

As a result, a carbonaceous thin film was formed on the fullerene vapor-deposited film on the quartz substrate. In distinction from the carbonaceous thin film obtained in Examples 1 or 15, the present carbonaceous thin film was inferior in adhesion to the fullerene vapor-deposited film or to the quartz substrate, and showed the tendency to be brittle.

EXAMPLE 17

Plasma Polymerization of a $C_{60}$ Vapor-deposited Film

In the present Example, a $C_{60}$ vapor-deposited film on the $C_{60}$ polymer was processed in Ar plasma to a $C_{60}$ polymer.
Formation of Fullerene Polymer Film As fullerene $C_{60}$ molecules, as a starting material, a commercially available product was used. This $C_{60}$ could be prepared as follows: Using a known device, arc discharge by a DC of 150 A was carried out in an helium atmosphere of 100 Torr, with a graphite rod 10 mm in diameter and 35 cm in length. After the graphite rod was substantially vaporized to yield a fullerene containing soot, the polarities of the two electrodes were reversed and deposits such as nano-tubes formed on the inherent negative electrode were further vaporized to soot.

The soot deposited in the water-cooled reaction vessel was recovered and extracted with crude toluene which then was rinsed with hexane, dried and purified on sublimation in vacuum. The fullerene molecules, thus produced, were subjected to time-of-flight mass spectrometry (TOF-MS). It was thus found that the fullerene molecules contained $C_{60}$ and $C_{70}$ at a rate of approximately 9:1.

Then, using the apparatus shown in FIGS. 8 or 38, a $C_{60}$ thin film, controlled to a film thickness of 20 Å, was formed on a silicon substrate at $4\times10^{-4}$ Torr, by sublimating and evaporating powders of $C_{60}$ to form a thin C60 film, controlled to a film thickness of 20 Å, as the evaporated film thickness was measured using a film thickness meter. The $C_{60}$ powders, set on a molybdenum boat, were heated gradually to approximately 600° C. for degassing and evaporated at a higher temperature.

The evaporated film then was exposed to an Ar plasma of 0.1 Torr in an RF reaction vessel of plan-parallel plates started at 13.56 MHz. Each sample of the $C_{60}$ thin film was maintained at 50° C. and plasma-processed at 30 W for four hours and at 50 W for thirty minutes to produce $C_{60}$ polymer films.
Raman Spectroscopy The $C_{60}$ molecule shows 10 active modes in the Raman spectrum. The strongest line is observed at 1469 $cm^{-1}$. The Ag(2) pentagonal pinch mode (C—C single bond stretching) is the most sensitive to probe the polymerization. Because of the polymerization, a shift of this mode is observable and several new Raman lines are activated due to the loss of molecular symmetry. The shift has been used as a qualitative as well as quantitative measure of the polymerization. A downshift of 10 $cm^{-1}$ was predicted theoretically for the $C_{60}$ dimer and trimer. A shift of about 20 $cm^{-1}$ was predicted for longer polymers.

Figure 1B:
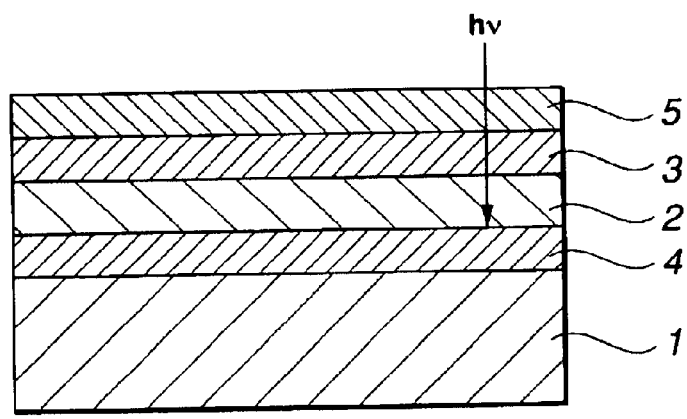
Figure 1C:
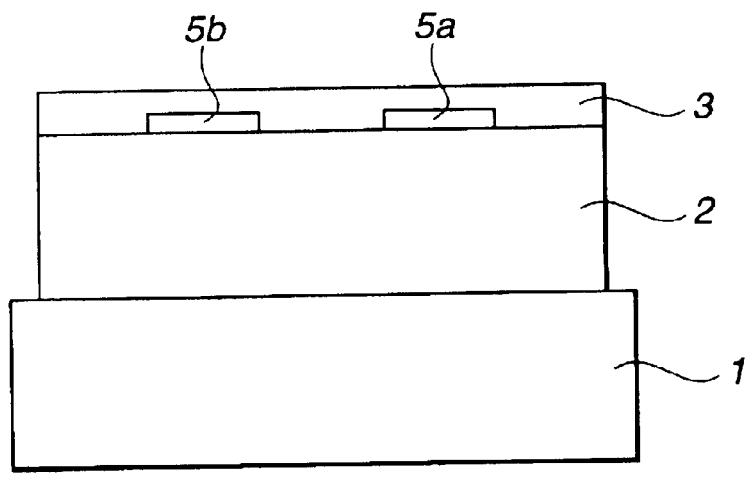
Figure 2:
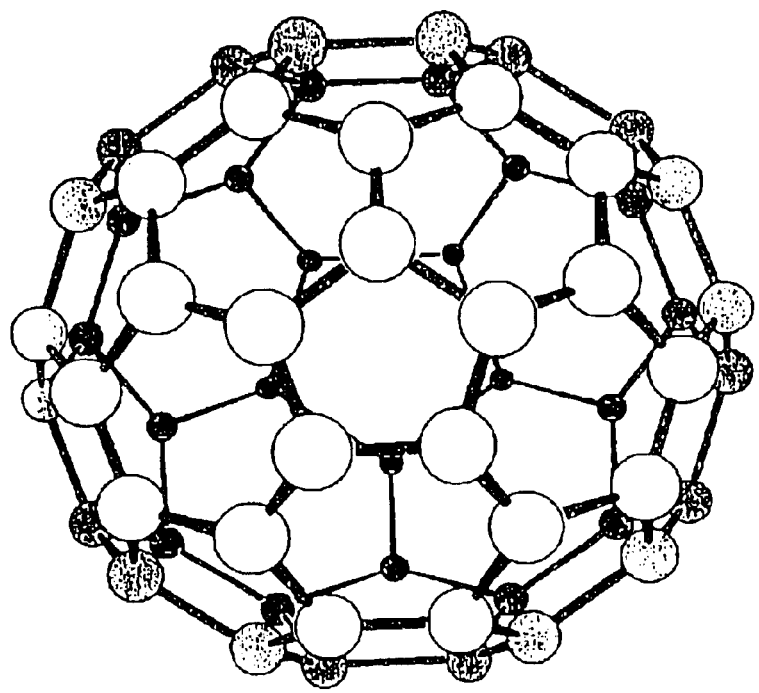
FIG. 2 schematically shows the molecular structure of $C_{60}$.

The Raman spectra of the processed films are shown in FIG. 1. The Ag(2) pentagonal pinch mode shifts in comparison to C60 by 4 to 5 $cm^{-1}$, respectively.

Figure 58:
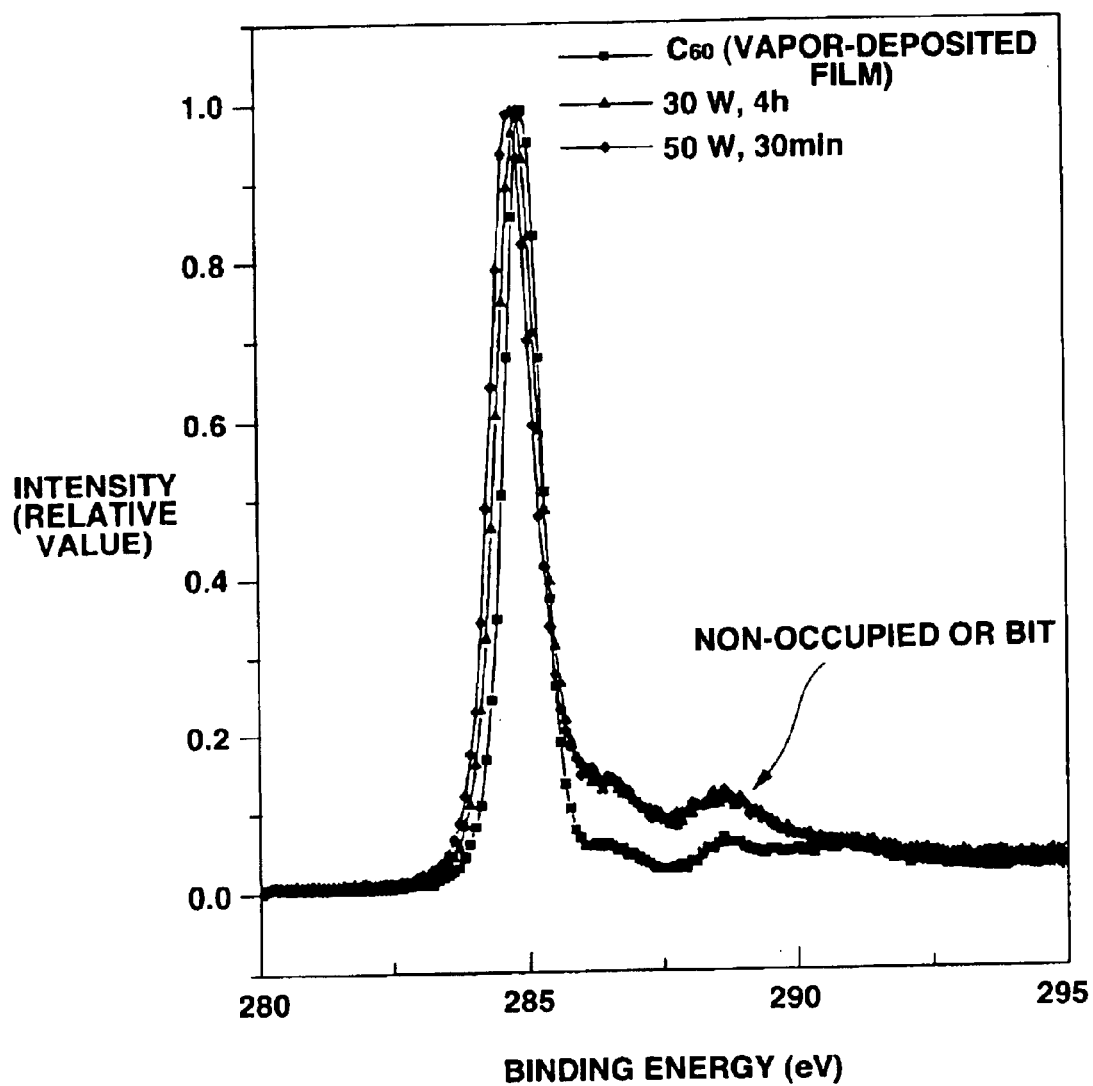
FIG. 58 shows a C 1s XPS spectrum of the fullerene polymer film.

FIG. 58 shows the normalized XPS C 1s spectra. The C 1s binding energies of the evaporated $C_{60}$ film and the plasma processed films were determined to be 284.9, 284.8 (30 W) and 284.7 eV (50 W). The full width of half magnitude (FWHM) of the C 1s peak of the processed thin films increased about 0.2 eV to 1.0 eV compared to 0.8 eV of the evaporated film. Moreover, the shape of the C 1s becomes asymmetric to higher binding energies. The calculated chemical shifts of the C 1s binding energy of +3 eV per four-membered ring in $C_{60}$ polymers with respect to the isolated $C_{60}$ molecule explains only partially the differences in the spectra. On the other hand, 13 (30 W) and 15 at % (50 W) oxygen were found by XS. The rather high overall FWHM's (2.7 and 2.5 eV) measured for the O 1s peaks indicates that different molecular and atomic oxygen species are superimposed.

Figure 59:
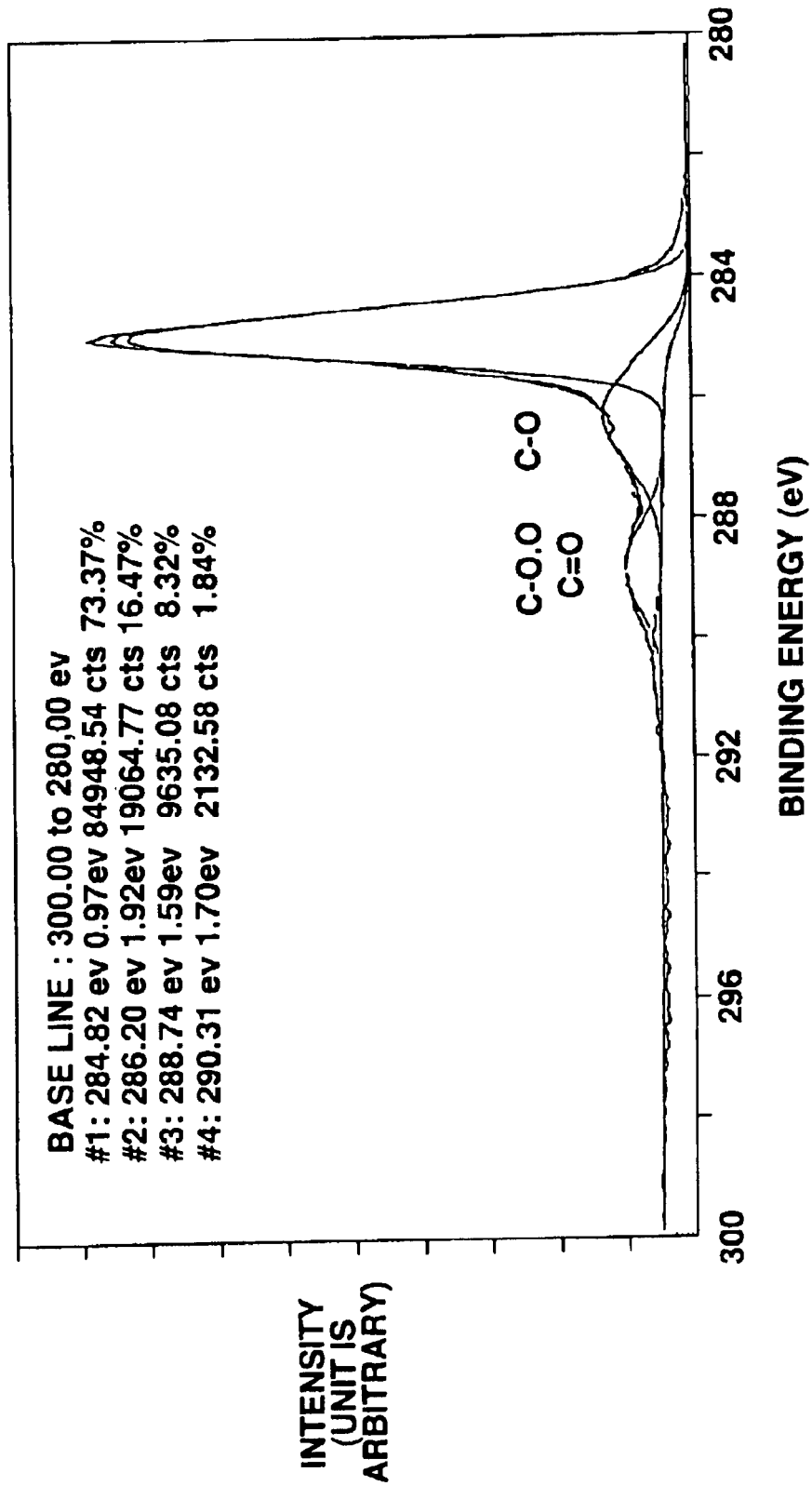
FIG. 59 is a peak analysis diagram of the C 1s XPS spectrum of the fullerene polymer film.
Figure 60:
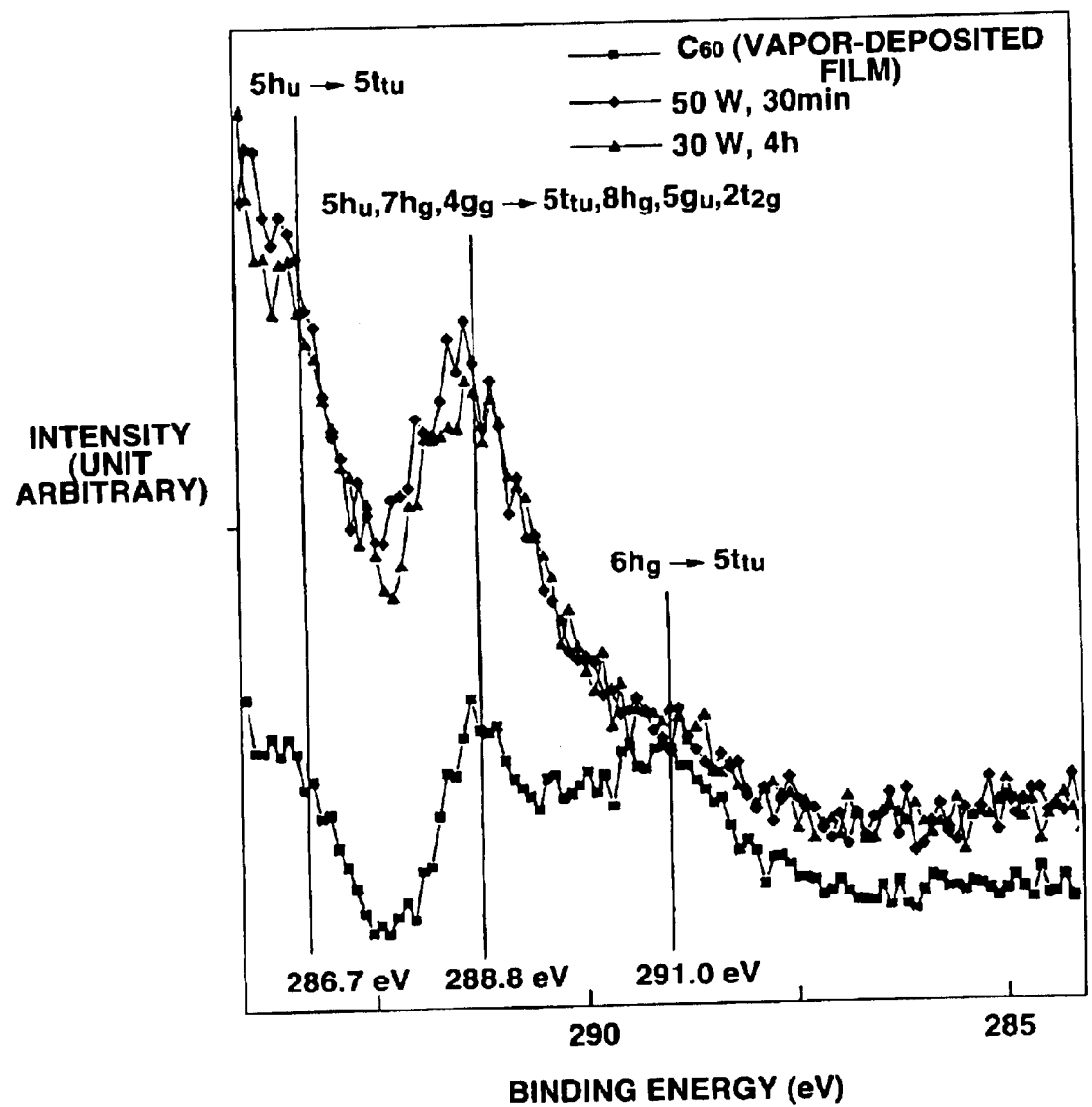
FIG. 60 shows a XPS spectrum showing a shakeup satellite area of the fullerene polymer film.

FIG. 59 shows the peak analyses of C 1s of the plasma processed films. Peaks were found at 284.8 (284.7), 286.2 (286.1) and 288.7 (288.6) eV. The subpeaks correlate to C—O, C—O—O and C=O superimposed by shake-up features.

FIG. 46 illustrates the expanded region covering the C 1s shake-up satellites. Five bands were separated from C60 by high-resolution photoelectron spectroscopy at 1.8, 2.9, 3.7, 4.8 and 5.9 eV relative to the C 1s binding energy. Three of these peaks were resolved for the evaporated $C_{60}$ thin film, but not the peaks at 2.9 and 4.8 eV. The observation of the shake-up satellites of the plasma processed films is somewhat problematic because they are strongly superimposed by the emission from oxidized carbon species.

Figure 61:
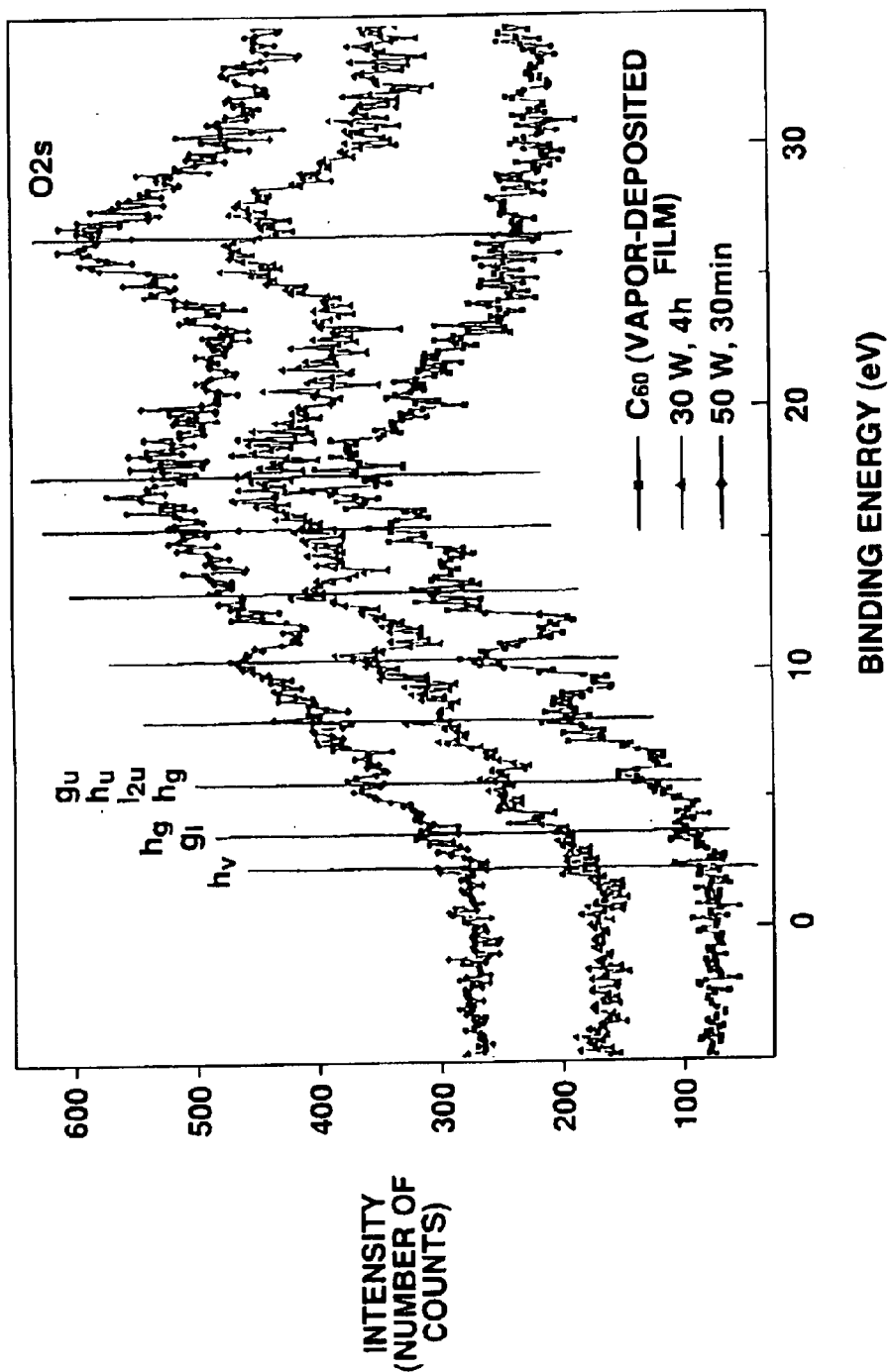
FIG. 61 shows a XPS valence band XPS of the fullerene polymer film.

FIG. 61 shows the XS valence band spectra of the evaporated C60 film and the plasma processed films. It is apparent that the peaks of the plasma processed becomes broader and reduced in intensity. In addition to the carbon states, the O2s peak appears at about 27 eV.

TOF-MS

Figure 62:
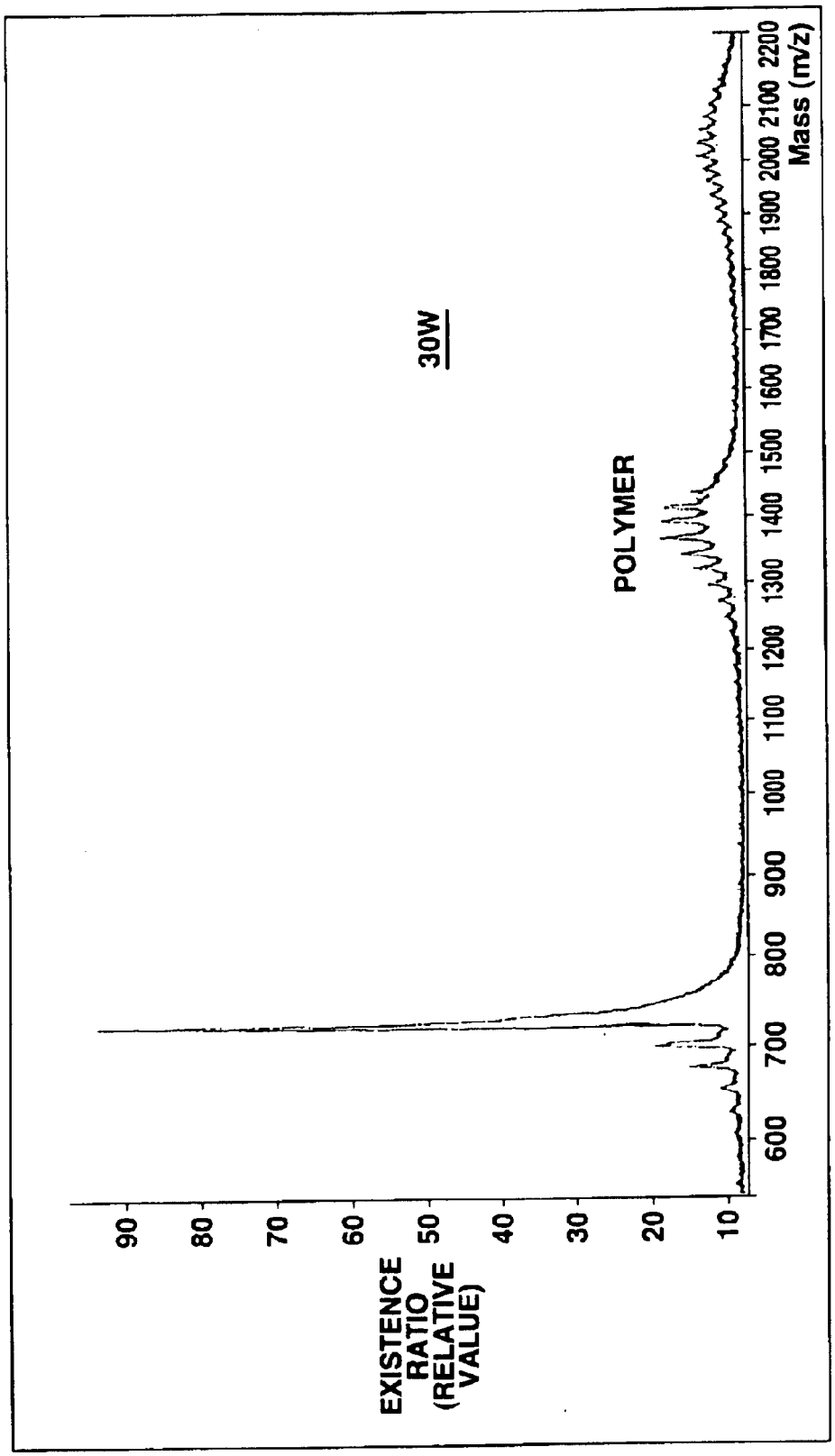
FIG. 62 shows a TOF-MS spectrum of a fullerene polymer film obtained on plasma processing.
Figure 63:
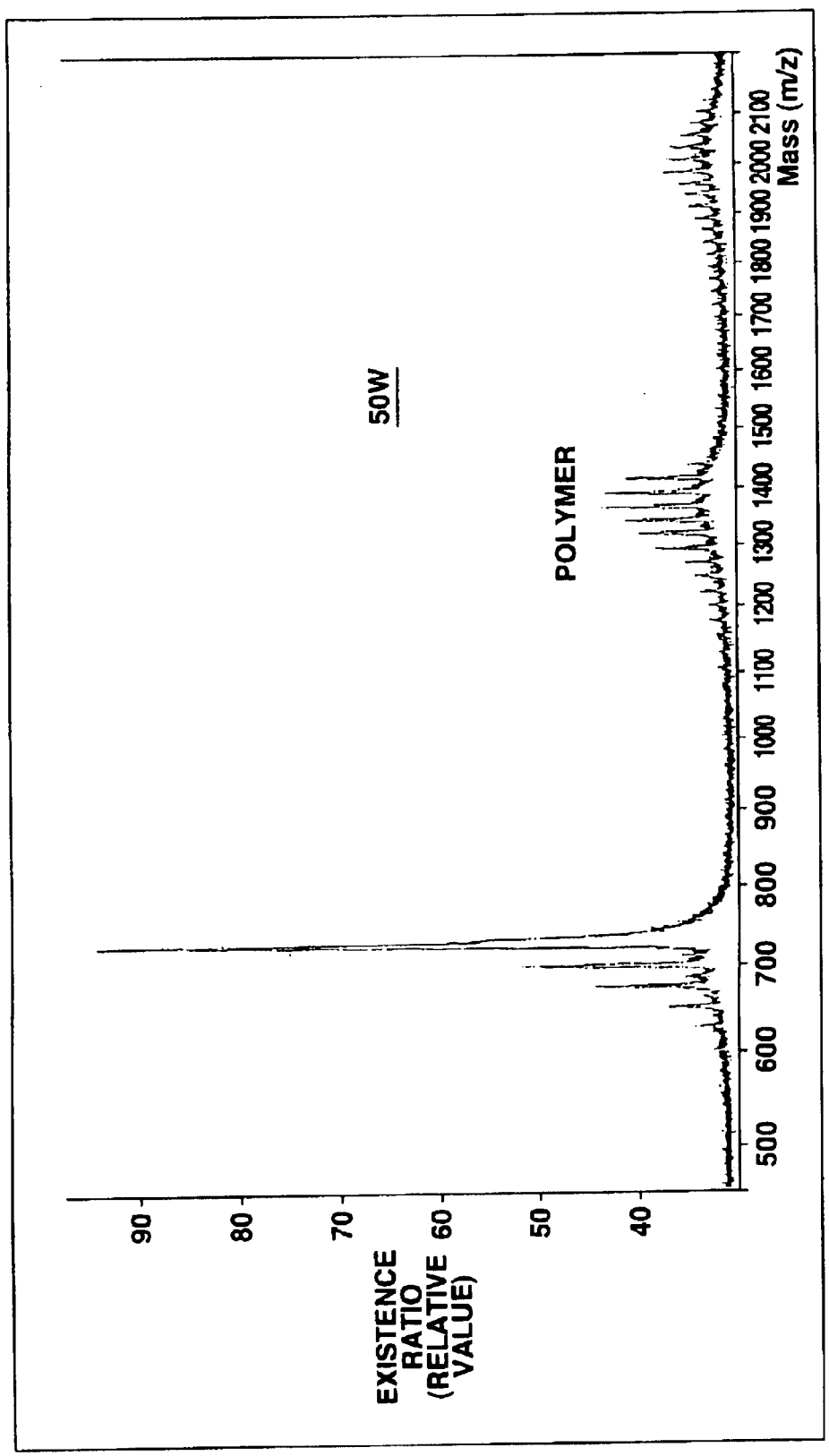
FIG. 63 shows a TOF-MS spectrum of a fullerene polymer film obtained on plasma processing.

FIGS. 62 and 63 show the TOF-MS spectra of the plasma processed films. In the spectra occur peaks in the mass range of about 1440, which are attributable to fullerene polymer. Also, the $C_{60}$ structure is retained.

The results of Raman, XPS and TOF-MS confirm that the plasma processing of evaporated $C_{60}$ films resulted in polymerized $C_{60}$. The described method opens a new route to polymerize $C_{60}$ by plasma.

EXAMPLE 18

Preparation of Solar Cell and its Physical Properties

For preparing a structure shown in FIG. 1, a carbonaceous thin film was formed by a film-forming device shown in FIG. 56. This film forming device is made up of a simple type organic solvent gas bubbler 50, a gas bomb 51 for supplying a carrier gas thereto, and a simple type electrical furnace 52 for pyrolysis of the organic solvent gas. A needle valve 53 for flow duct adjustment is provided in each of the flow duct between the gas bomb 51 and the organic solvent gas bubbler 50 and the flow duct between the gas bomb 51 and the electrical furnace 52.

The electrical furnace 52 has a furnace core 30 mm in diameter and a heater 52b within which a thermocouple 52d for connection to an external beater temperature controller 52, and a quartz substrate (glass substrate) 52, corresponding to the substrate 1, directly above the controller 52c, are set for assuring correct film-forming temperature of the quartz substrate 50e. Meanwhile, a relay circuit for PID control was operated in unison for temperature control of the quartz substrate 50e. With the film-forming device, constructed as described above, is able to deposit a carbonaceous thin film with a temperature error less than 1° C.

The temperature of the electrical furnace 52 was set to 800° C. After introducing the quartz substrate 52e into the quartz tube 52b, an argon gas, with a purity of 99.999%, was introduced from a gas bomb 51 into the quartz tube 52b to fill the inside of the tube with the argon gas.

When the inside of the quartz tube 52b is completely the argon gas atmosphere, and the temperature has reached 800° C., the toluene gas was started to flow into the inside of the quartz tube 52b through the organic solvent gas bubbler 50. The flow velocity of the toluene gas, introduced into the organic solvent gas bubbler 50, was maintained at 50 ml/min.

After continuing gas bubbling for 30 minutes, only the argon gas was allowed to flow into the quartz tube 52b, and the electrical furnace 52 was cooled gradually. After confirming that the electrical furnace 52 was cooled substantially to room temperature, the quartz substrate 52e was taken out of the quartz tube 52b. On the surface of the quartz substrate 50e was formed a thin carbon film presenting a mirror surface.

Figure 26:
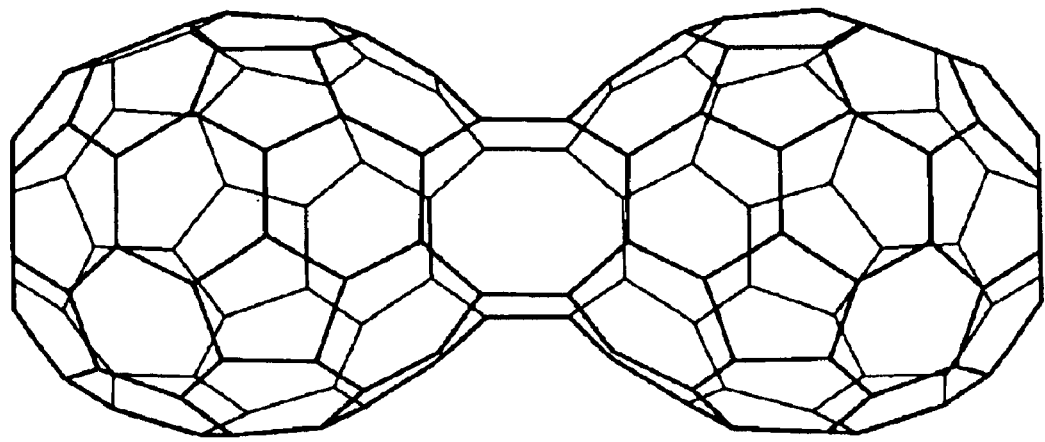
FIG. 26 shows another dimeric structure of a $C_{70}$ molecule [$C_{136}$(b)].
Figure 26:
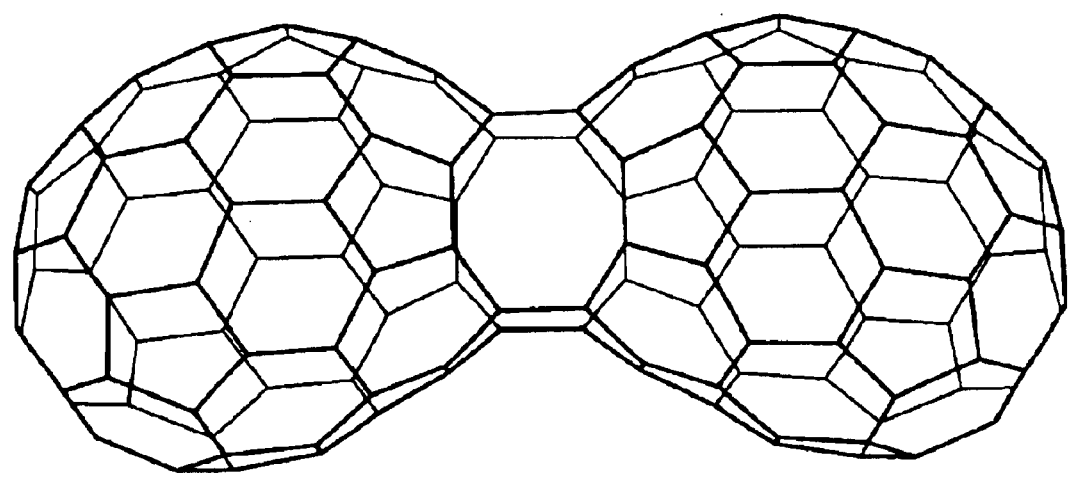
Figure 27:
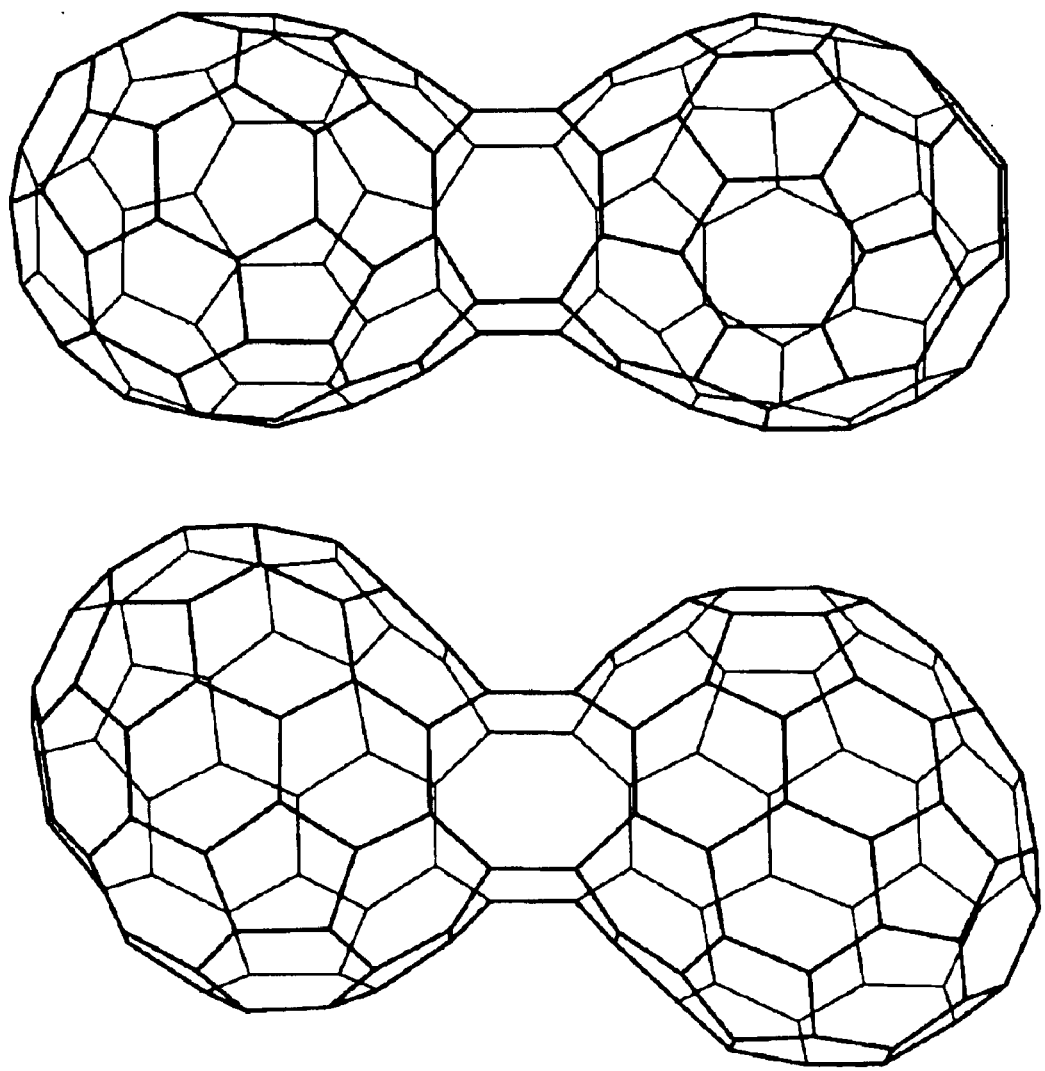
FIG. 27 shows still another dimeric structure of a $C_{70}$ molecule [$C_{136}$(c)].
Figure 28:
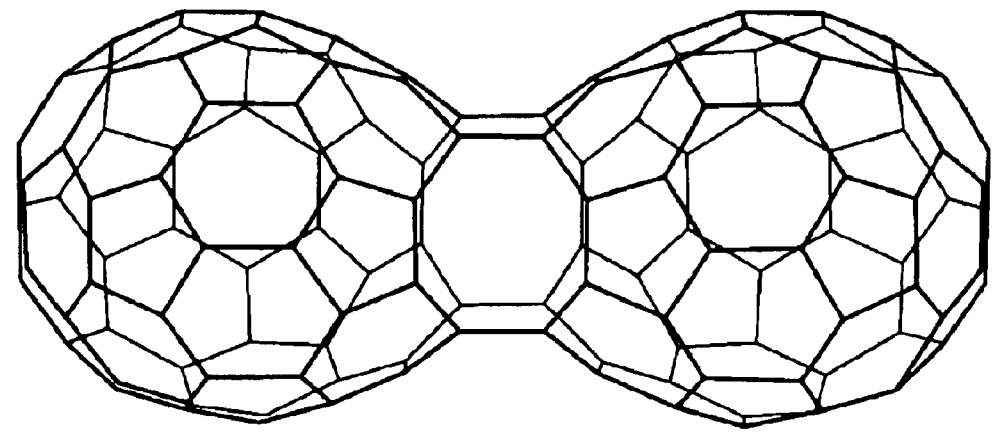
FIG. 28 shows still another dimeric structure of a $C_{70}$ molecule [$C_{136}$(d)].
Figure 28:
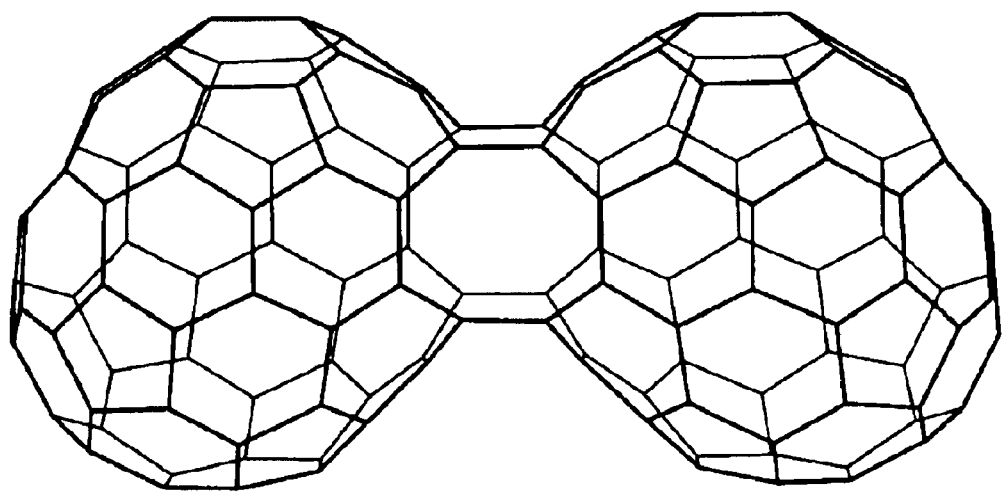
Figure 29:
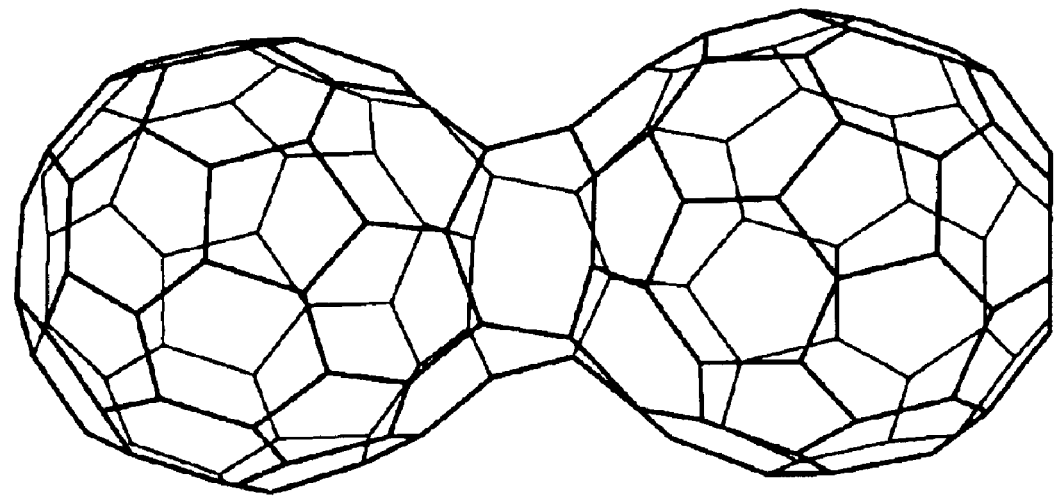
FIG. 29 shows still another dimeric structure of a $C_{70}$ molecule [$C_{136}$(e)].
Figure 29:
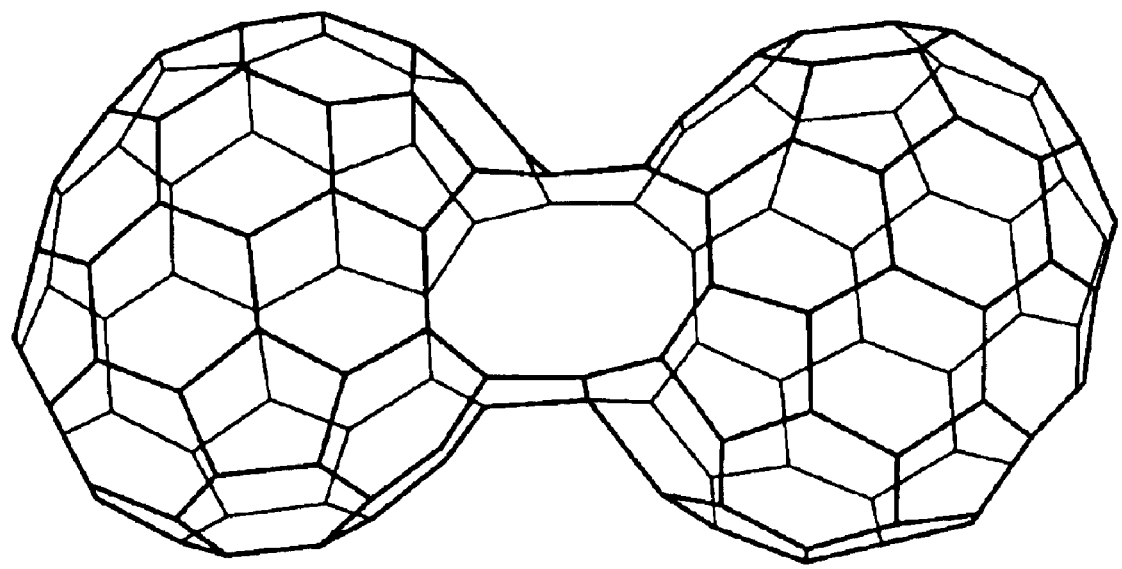
Figure 30:
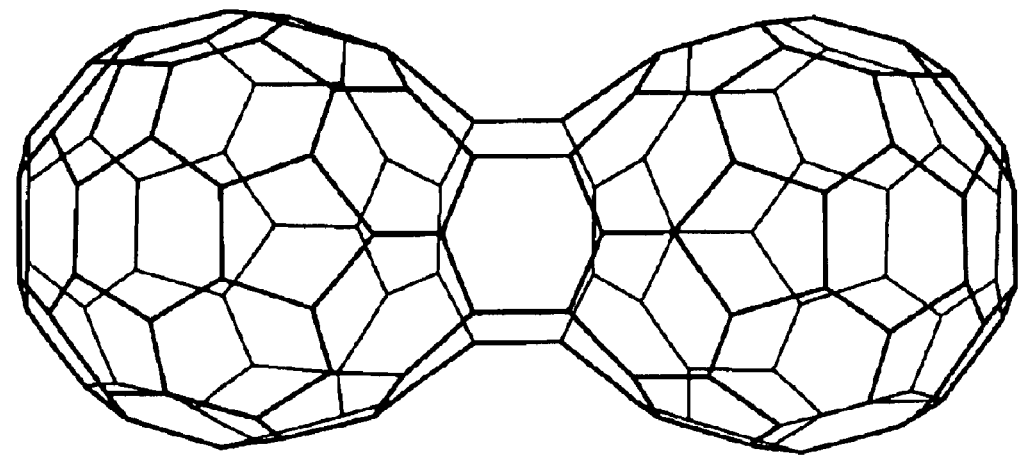
FIG. 30 shows still another dimeric structure of a $C_{70}$ molecule [$C_{136}$(f)].
Figure 30:
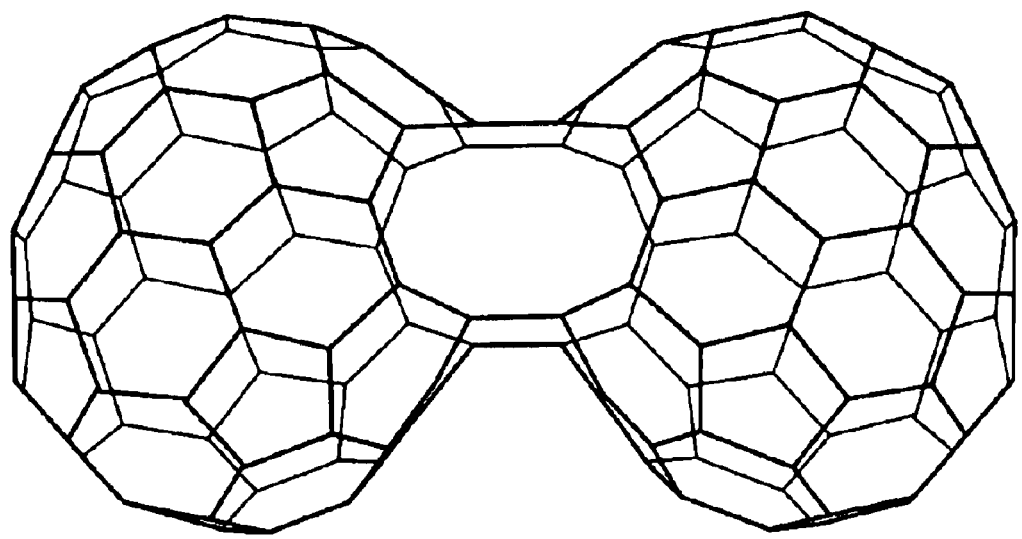
Figure 31:
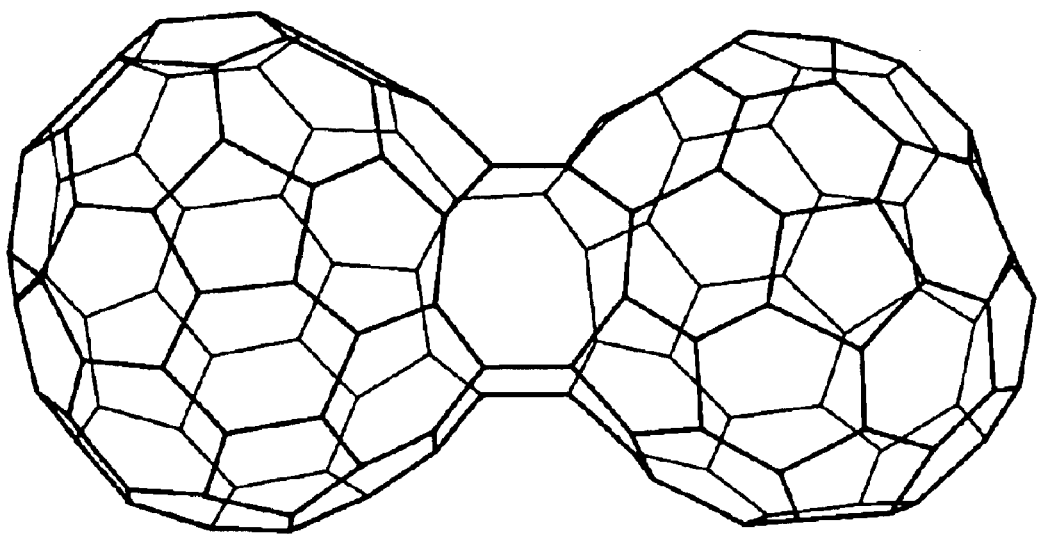
FIG. 31 shows still another dimeric structure of a $C_{70}$ molecule [$C_{136}$(g)].
Figure 31:
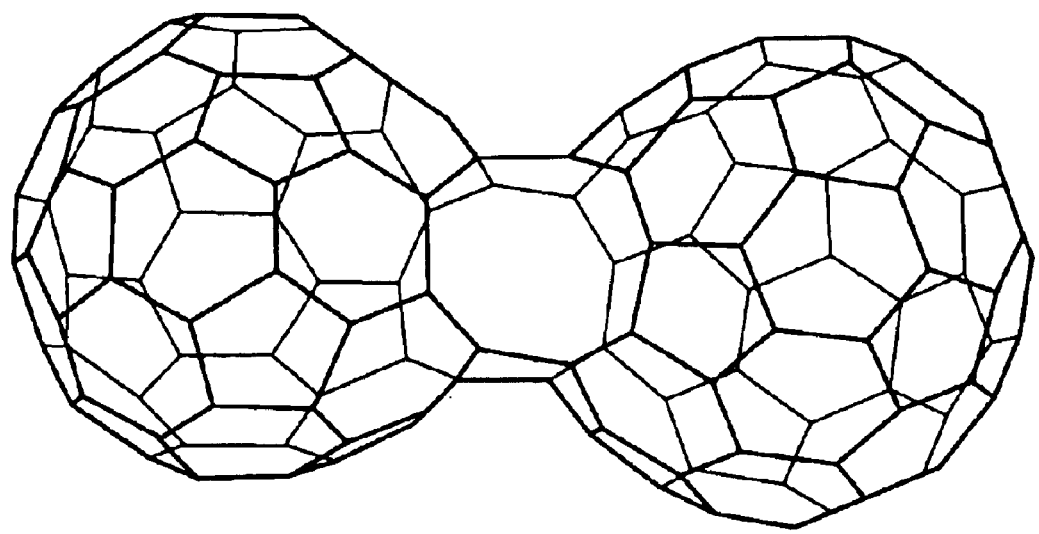
Figure 32:
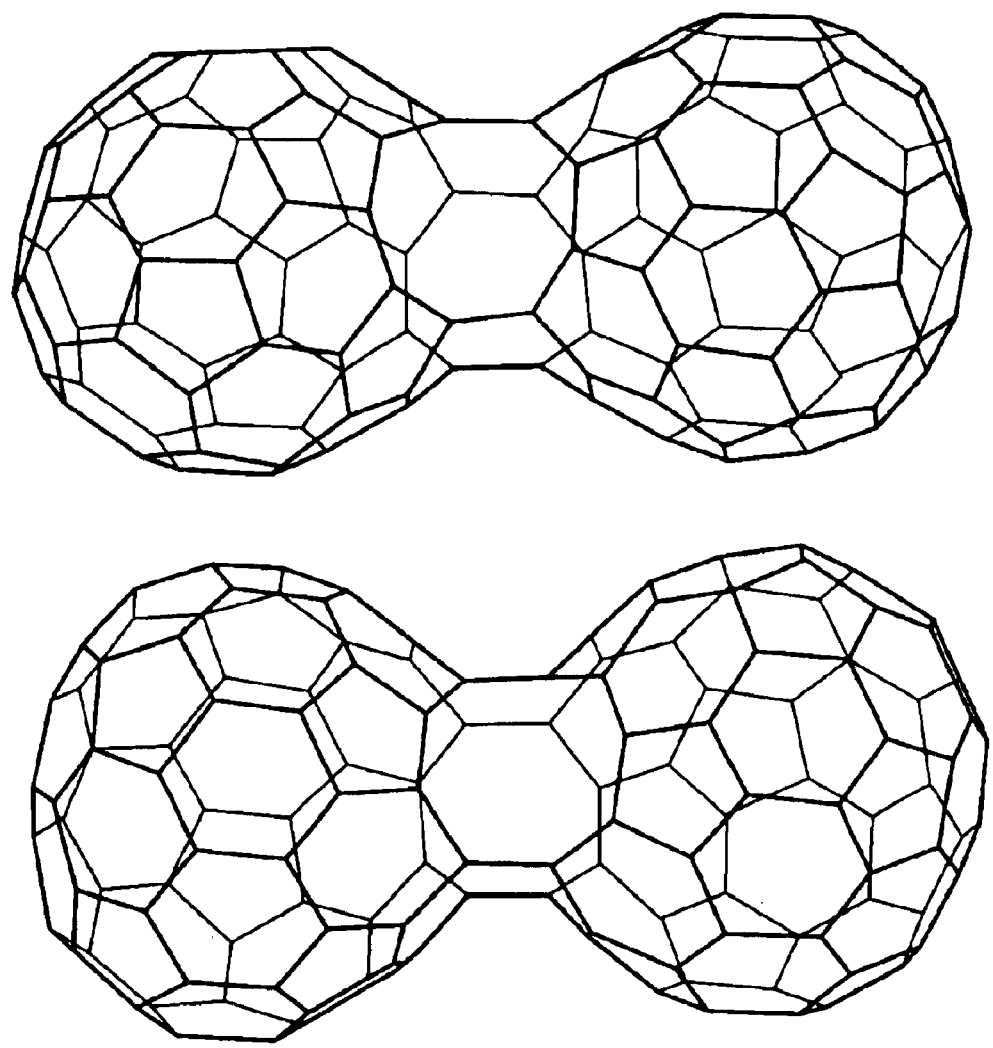
FIG. 32 shows still another dimeric structure of a $C_{70}$ molecule [$C_{136}$(h)].
Figure 33:
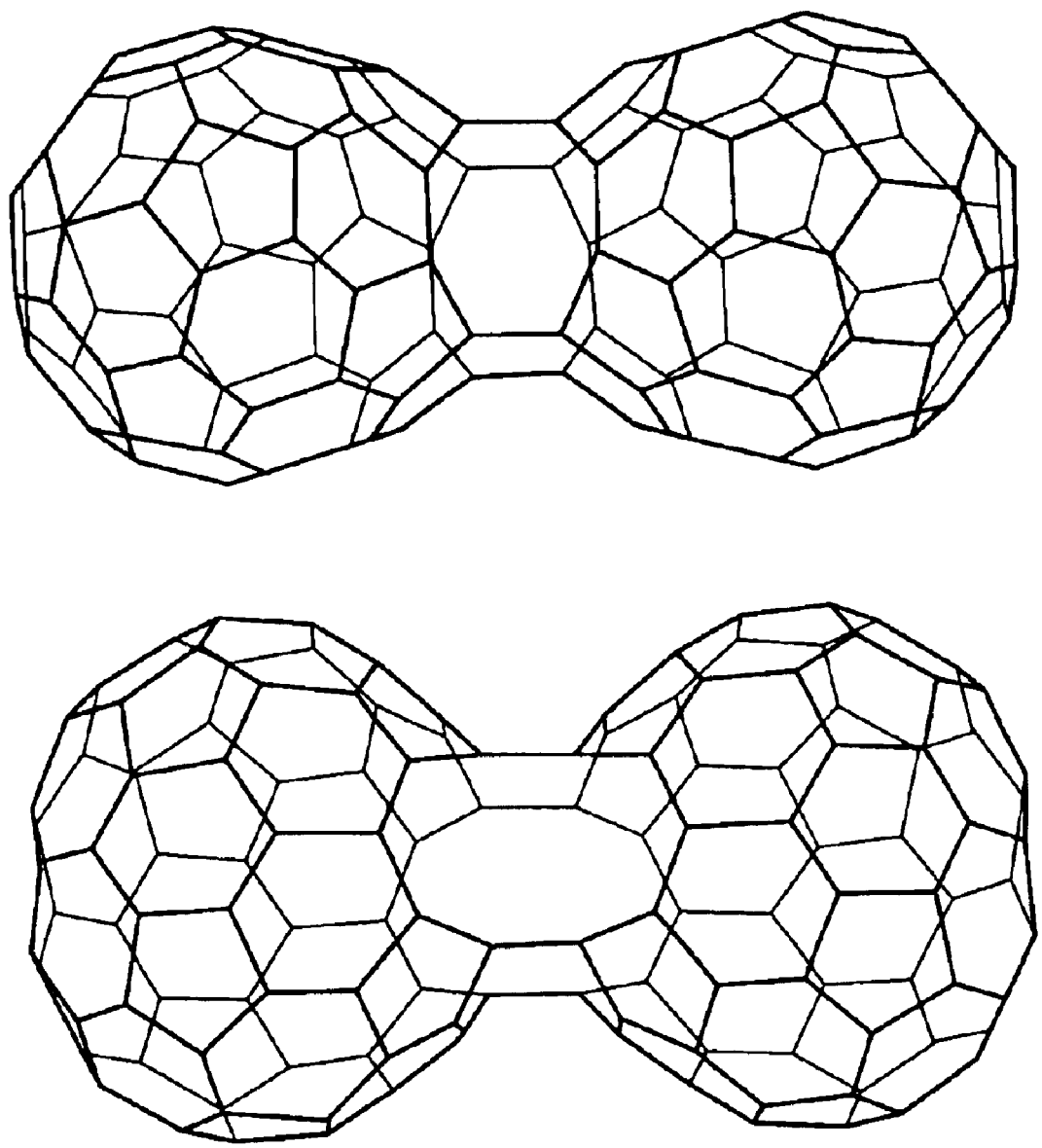
FIG. 33 shows still another dimeric structure of a $C_{70}$ molecule [$C_{136}$(i)].

On the carbon thin film, a $C_{60}$ polymer film was formed, as explained in connection with Example 1. The junction structure of the carbon thin film and the fullerene polymer film, thus fabricated, is a structure useful for isolating the carrier generated on light illumination, such that, if the structure is used in a compound structure of, for example, a glass substrate—ITO electrode-carbon thin film-fullerene thin film-aluminum electrode, it is particularly useful for a solar cell. This structure has desirable properties, as may be seen from FIG. 26 showing I–V characteristics on light illumination thereon.

What is detrimental in this case is that the electrically conductivity of the light-transmitting electrode is impaired when forming a carbon thin film on a light-transmitting electrode formed e.g., of ITO.

For avoiding this problem, a compound structure such as a glass substrate-thin gold electrode-thin carbon film-fullerene polymer film-aluminum electrode is preferably used. This compound structure operates as a solar cell, as may be seen from the I–V characteristics before and after light illumination. In order to provide a compound structure optimum for this application, it is necessary to scrutinize into variable factors, such as band gap of the carbon thin film, thickness of the fullerene thin film or the Fermi surface level of the electrode material.

EXAMPLE 19

Preparation of Gas Sensor and its Performance

On a complex structure comprising a substrate-carbonaceous thin film-fullerene polymer film, prepared as in Example 18, a comb-shaped gold electrode was further formed thereon to check into the function as a gas sensor.

As result, electrical conductivity was noticed to be clearly changed, e.g., increased, against water, acetaldehyde, formaldehyde, ammonia or formic acid. This phenomenon was similarly noticed when the comb electrode was directly mounted on the carbonaceous thin film presenting a smooth surface, such that a clear distinction was observed from a case when a structure comprising only an electrode without provision of the carbonaceous thin film was used as a reference.

Meanwhile, the carbonaceous complex structure according to the present invention, having the above-described basic structure, may be modified as to the material or the forming method or layering sequence of the respective layers, insofar as the meritorious effect of the invention is maintained. In addition, the layered structure may be varied, such that, for example, each constituent layer may be subdivided into plural layers, or the thickness of each layer may be designed optionally.

What is claimed is:

1. A method for manufacturing a carbonaceous complex structure comprising the steps of:

forming a carbonaceous thin film on a smooth surface of a substrate; and forming a fullerene polymer film on said carbonaceous thin film.

2. The method for manufacturing a carbonaceous complex structure according to claim 1 wherein the roughness Ra of said smooth surface of said substrate is not larger than 1 μm.

3. The method for manufacturing a carbonaceous complex structure according to claim 1 comprising the step of:

layering a pair of spaced apart electrodes on said carbonaceous thin film wherein said fullerene polymer film is at least partially formed between said electrodes.

4. The method for manufacturing a carbonaceous complex structure according to claim 1 wherein said fullerene polymer film is formed by a method selected from the group consisting of a plasma polymerization method, a microwave polymerization method, an electrolytic polymerization method, an electron beam polymerization method, an X-ray polymerization method a photopolymerization method, and combinations thereof.

5. The method for manufacturing a carbonaceous complex structure according to claim 1 wherein:

said fullerene polymer film is formed by vapor deposition of at least one fullerene molecules thereby forming a vapor-deposited film and then illuminating said film with electromagnetic waves thereby polymerizing said fullerene molecule.

6. The method for manufacturing a carbonaceous complex structure according to claim 5 wherein said fullerene molecule is selected from the group consisting of $C_{60}$ $C_{70}$, and mixtures thereof and wherein said electromagnetic waves are selected from the group consisting of RF plasma, UV rays, an electron beam, and mixtures thereof.

7. A method for manufacturing a carbonaceous complex structure comprising:

a step of forming a first electrode having a surface with a roughness Ra set to not larger than 1 μm on a substrate;

a step of forming a carbonaceous thin film on the surface of the first electrode;

a step of forming a fullerene polymer film on said thus formed carbonaceous thin film; and a step of forming a second electrode on said thus formed fullerene polymer film.

8. The method for manufacturing a carbonaceous complex structure according to claim 7 wherein said substrate and the first electrode are transparent.

9. The method for manufacturing a carbonaceous complex structure according to claim 7 wherein said carbonaceous thin film is formed by thermal decomposition of an organic compound.

* * * * *